(12) United States Patent
Jeon et al.

(10) Patent No.: US 10,032,960 B2
(45) Date of Patent: Jul. 24, 2018

(54) SEMICONDUCTOR LIGHT EMITTING DEVICE OF A FLIP CHIP AND METHOD FOR MANUFACTURING SAME

(71) Applicant: SEMICON LIGHT CO., LTD., Gyeonggi-do (KR)

(72) Inventors: Soo Kun Jeon, Gyeonggi-do (KR); Tae Hyun Kim, Gyeonggi-do (KR); Tea Jin Kim, Gyeonggi-do (KR); Jun Chun Park, Gyeonggi-do (KR); Byeong Seob Kim, Gyeonggi-do (KR); Jong Won Kim, Gyeonggi-do (KR); Ki Man Park, Gyeonggi-do (KR)

(73) Assignee: SEMICON LIGHT CO., LTD., Gyeonggi-do (KR)

(*) Notice: Subject to any disclaimer, the term of this patent is extended or adjusted under 35 U.S.C. 154(b) by 0 days.

(21) Appl. No.: 15/316,125

(22) PCT Filed: Jun. 3, 2015

(86) PCT No.: PCT/KR2015/005582
§ 371 (c)(1),
(2) Date: Dec. 2, 2016

(87) PCT Pub. No.: WO2015/186972
PCT Pub. Date: Dec. 10, 2015

(65) Prior Publication Data
US 2017/0125641 A1    May 4, 2017

(30) Foreign Application Priority Data

Jun. 3, 2014 (KR) .................. 10-2014-0067575
Oct. 17, 2014 (KR) .................. 10-2014-0140891
(Continued)

(51) Int. Cl.
*H01L 33/46* (2010.01)
*H01L 33/06* (2010.01)
(Continued)

(52) U.S. Cl.
CPC .............. *H01L 33/46* (2013.01); *H01L 33/06* (2013.01); *H01L 33/145* (2013.01); *H01L 33/32* (2013.01);
(Continued)

(58) Field of Classification Search
None
See application file for complete search history.

(56) References Cited

U.S. PATENT DOCUMENTS 9,312,453 B2 *  4/2016  Park ................... H01L 33/387
2008/0217640 A1 *  9/2008  Suzuki ................ H01L 33/405
257/98

(Continued)

FOREIGN PATENT DOCUMENTS

KR   10-2011-0107665   10/2011   ............. H01L 33/46
KR   10-1182189        9/2012    ............. H01L 33/36
(Continued)

OTHER PUBLICATIONS

ISR dated Jul. 20, 2015 in PCT/KR2015/005582 published as WO 2015/186972.

*Primary Examiner* — Bilkis Jahan
(74) *Attorney, Agent, or Firm* — Harness, Dickey & Pierce, P.L.C.

(57) ABSTRACT

Disclosed is a semiconductor light emitting device including: multiple semiconductor layers including a first semiconductor layer, a second semiconductor layer, and an active layer; an electrode electrically connected with the multiple semiconductor layers; a light absorption barrier disposed about at least the electrode; and a non-conductive reflective
(Continued)

film adapted to cover the multiple semiconductor layers, the light absorption barrier and the electrode and to reflect light from the active layer, wherein the non-conductive reflective film has an abnormal region of a lower reflectivity around the electrode due to a height difference between the light absorption barrier and the electrode, wherein a portion of the non-conductive reflective film exposed from the electrode is made longer than the abnormal region as seen in a cross-sectional view of the electrode.

14 Claims, 44 Drawing Sheets

(30) Foreign Application Priority Data

| Oct. 17, 2014 | (KR) | 10-2014-0140892 |
|---|---|---|
| Jan. 16, 2015 | (KR) | 10-2015-0008036 |
| Mar. 10, 2015 | (KR) | 10-2015-0032927 |

(51) Int. Cl.
*H01L 33/32* (2010.01)
*H01L 33/38* (2010.01)
*H01L 33/14* (2010.01)

(52) U.S. Cl.
CPC .... *H01L 33/382* (2013.01); *H01L 2933/0025* (2013.01)

(56) References Cited

U.S. PATENT DOCUMENTS

| 2011/0233589 A1* | 9/2011 | Kim | H01L 33/405 |
|---|---|---|---|
| | | | 257/98 |
| 2012/0267672 A1* | 10/2012 | Jeon | H01L 33/14 |
| | | | 257/99 |
| 2014/0217439 A1 | 8/2014 | Jeon et al. | 257/98 |
| 2015/0155426 A1 | 6/2015 | Jeon et al. | H01L 33/005 |
| 2015/0236215 A1* | 8/2015 | Park | H01L 33/46 |
| | | | 257/98 |

FOREIGN PATENT DOCUMENTS

| KR | 10-1226706 | 1/2013 | H01L 33/36 |
|---|---|---|---|
| KR | 10-2014-0031664 | 3/2014 | H01L 33/46 |

* cited by examiner (a)

(b)

US 10,032,960 B2

SEMICONDUCTOR LIGHT EMITTING DEVICE OF A FLIP CHIP AND METHOD FOR MANUFACTURING SAME

CROSS-REFERENCE TO RELATED APPLICATIONS

This application is a national phase application of PCT Application No. PCT/KR2015/005582, filed on Jun. 3, 2015, which claims benefit of Korean Patent Application No. 10-2014-0067575, filed on Jun. 3, 2014, Korean Patent Application No. 10-2014-0140892, filed on Oct. 17, 2014, Korean Patent Application No. 10-2014-0140891, filed on Oct. 17, 2014, Korean Patent Application No. 10-2015-0008036, filed on Jan. 16, 2015 and Korean Patent Application No. 10-2015-0032927, filed on Mar. 10, 2015. The entire disclosure of the applications identified in this paragraph are incorporated herein by reference.

FIELD

The present disclosure relates generally to a semiconductor light emitting device and a method of manufacturing the same, and more particularly, to a semiconductor light emitting device having improved brightness as a result of a reduced light loss. Further, the present disclosure relates to a semiconductor light emitting device which is less vulnerable to damage, and a method of manufacturing the same.

In the context herein, the term "semiconductor light emitting device" is intended to indicate a semiconductor optoelectronic device which generates light by electron-hole recombination. One example thereof is a Group III-nitride semiconductor light emitting device, in which the Group III-nitride semiconductor is made from a compound containing $Al(x)Ga(y)In(1-x-y)N$ ($0 \leq x \leq 1$, $0 \leq y \leq 1$, $0 \leq x+y \leq 1$). Another example thereof is a GaAs-based semiconductor light emitting device used for emitting red light.

BACKGROUND

This section provides background information related to the present disclosure which is not necessarily prior art.

FIG. 1 shows an exemplary embodiment of a conventional Group III-nitride semiconductor light emitting device, in which the Group III-nitride semiconductor light emitting device includes a substrate 10 (e.g., a sapphire substrate), a buffer layer 20 grown on the substrate 10, an n-type Group III-nitride semiconductor layer 30 grown on the buffer layer 20, an active layer 40 grown on the n-type Group III-nitride semiconductor layer 30, a p-type Group III-nitride semiconductor layer 50 grown on the active layer 40, a current spreading conductive film 60 formed on the p-type Group III-nitride semiconductor layer 50, a p-side bonding pad 70 formed on the current spreading conductive film 60, an n-side bonding pad 80 formed on an exposed region of the n-type Group III-nitride semiconductor layer 30 created by mesa etching the p-type Group III-nitride semiconductor layer 50 and the active layer 40, and a protective film 90.

FIG. 2 shows an exemplary embodiment of the semiconductor light emitting device disclosed in U.S. Pat. No. 7,262,436, in which the semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, with the electrodes serving as reflective films, and an n-side bonding pad 800 formed on the n-type semiconductor layer 300 which had been etched and exposed.

A chip having the above structure, i.e. a chip where all of the electrodes 901, 902 and 903, and the electrode 800 are formed on one side of the substrate 100, with the electrodes 901, 902 and 903 serving as reflective films, is called a flip chip. The electrodes 901, 902 and 903 are made up of an electrode 901 (e.g., Ag) having a high reflectance, an electrode 903 (e.g., Au) for bonding, and an electrode 902 (e.g., Ni) for preventing diffusion between materials of the electrode 901 and materials of the electrode 903. While this metal reflective film structure has a high reflectance and is advantageous for current spreading, it has the drawback that the metal absorbs light.

FIG. 3 shows an exemplary embodiment of the semiconductor light emitting device disclosed in JP Laid-Open Pub. No. 2006-20913, in which the semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, a p-side bonding pad 700 formed on the light transmitting conductive film 600, and an n-side bonding pad 800 formed on the n-type semiconductor layer 300 which had been etched and exposed. Further, a DBR (Distributed Bragg Reflector) 900 and a metal reflective film 904 are provided on the light transmitting conductive film 600. While this structure shows reduced light absorption by the metal reflective film 904, it has the drawback that current spreading is not facilitated, as compared with the structure using the electrodes 901, 902 and 903.

FIG. 4 shows an exemplary embodiment of serially connected LEDs (A, B) disclosed in U.S. Pat. No. 6,547,249. Because of several advantages that can be offered, multiple LEDs (A, B) connected in series as shown in FIG. 4 have been used. For instance, series connection of multiple LEDs (A, B) decreases the number of external circuits and wire connections, and reduces the loss of light absorbed by wires. In addition, these serially connected LEDs (A, B) increase an overall operating voltage such that a power supply circuit may have a simpler configuration.

In order to connect multiple LEDs (A, B) in series, interconnects 34 are then deposited to connect a p-side electrode 32 and an n-side electrode 32 of adjacent LEDs (A, B). However, in an isolation process of electrically insulating the multiple LEDs (A, B), multiple semiconductor layers are etched to a rather considerable depth, so as to expose a sapphire substrate 20. This process is time-consuming and creates a big gap, thereby making it difficult to form the interconnects 34. Although a dielectric material 30 was used to obtain such a gently sloped interconnect 34 as shown in FIG. 4, this increased a spacing between LEDs (A, B) and is detrimental to higher integration.

FIG. 5 shows an exemplary embodiment of a semiconductor light emitting device disclosed in U.S. Pat. No. 7,098,543, in which a structure having a SMD-type flip chip 100 and a Zener diode 200 as an ESD protection device being connected is illustrated.

DISCLOSURE

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a semiconductor light emitting device including: multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination; an electrode electrically connected with the multiple semiconductor layers; a light absorption barrier disposed about at least the electrode; and a non-conductive reflective film adapted to cover the multiple semiconductor layers, the light absorption barrier and the electrode and to reflect light from the active layer, wherein the non-conductive reflective film has an abnormal region of a lower reflectivity around the electrode due to a height difference between the electrode and the vicinity of the electrode, wherein a portion of the light absorption barrier exposed from the electrode is made longer than the abnormal region as seen in a cross-sectional view of the electrode in order to block the light from the active layer entering the abnormal region.

Advantageous Effects

The advantageous effects of the present disclosure will be described in the latter part of the best mode for carrying out the invention.

MODE FOR CARRYING OUT INVENTION

Hereinafter, the present disclosure will now be described in detail with reference to the accompanying drawing(s).

Figure 1:
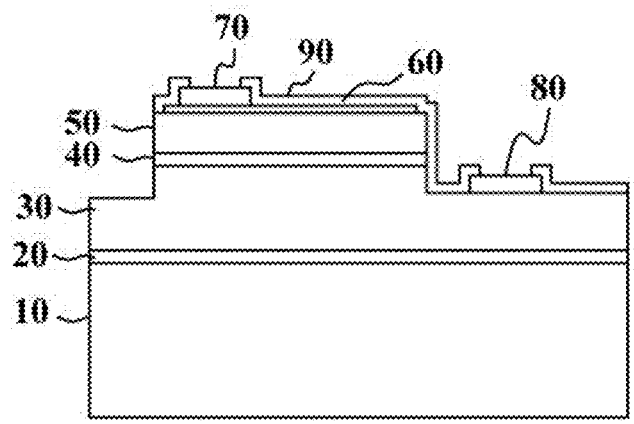
FIG. 1 shows an exemplary embodiment of a conventional Group III-nitride semiconductor light emitting device.
Figure 2:
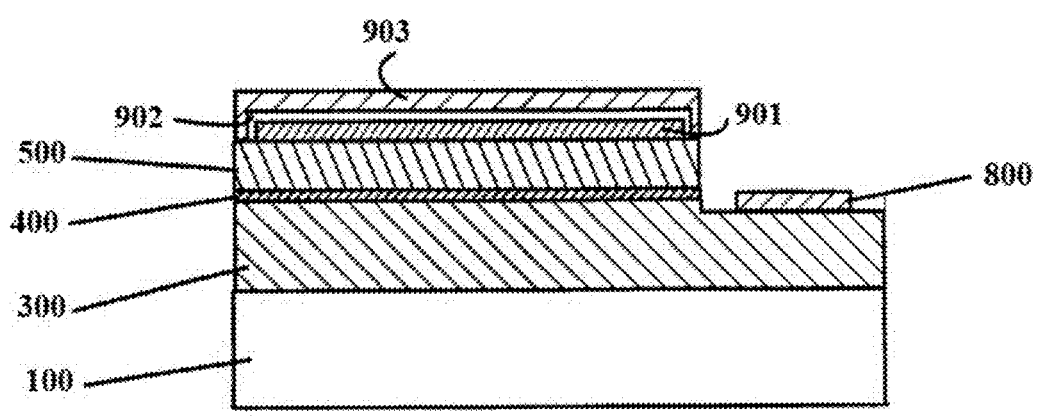
FIG. 2 shows an exemplary embodiment of the semiconductor light emitting device disclosed in U.S. Pat. No. 7,262,436.
Figure 3:
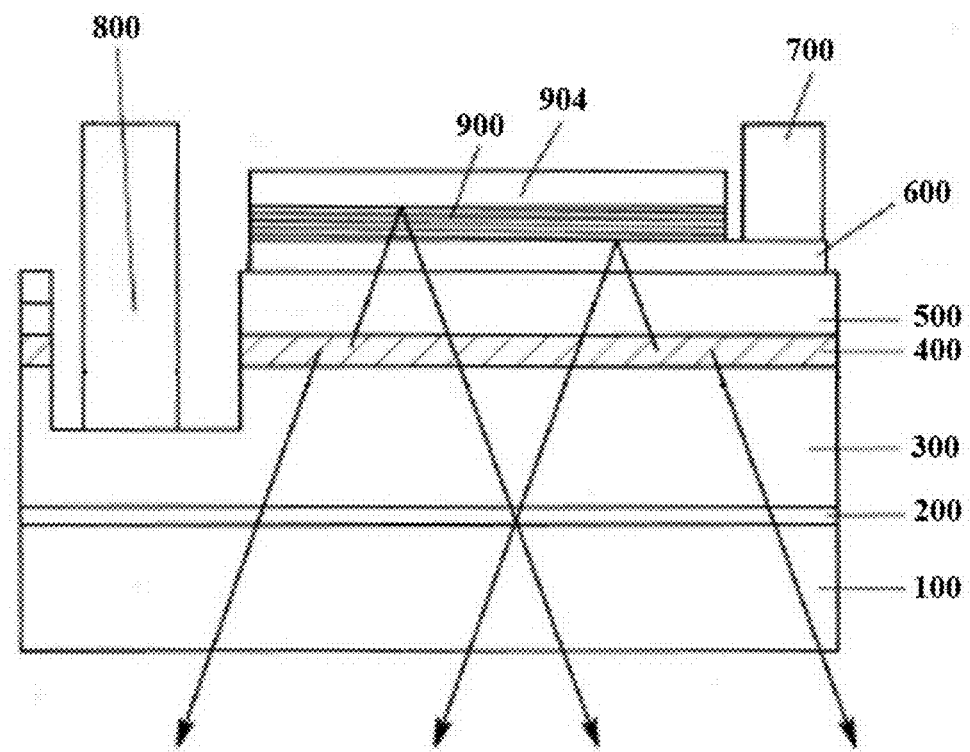
FIG. 3 shows an exemplary embodiment of the semiconductor light emitting device disclosed in JP Laid-Open Pub. No. 2006-20913.
Figure 4:
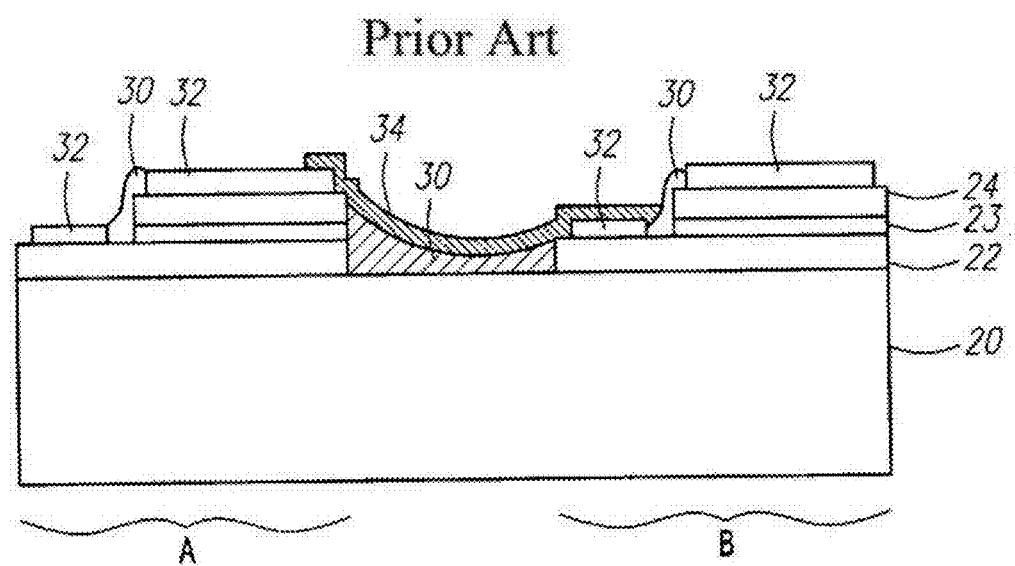
FIG. 4 shows an exemplary embodiment of the serially connected LEDs (A, B) disclosed in U.S. Pat. No. 6,547,249.
Figure 5:
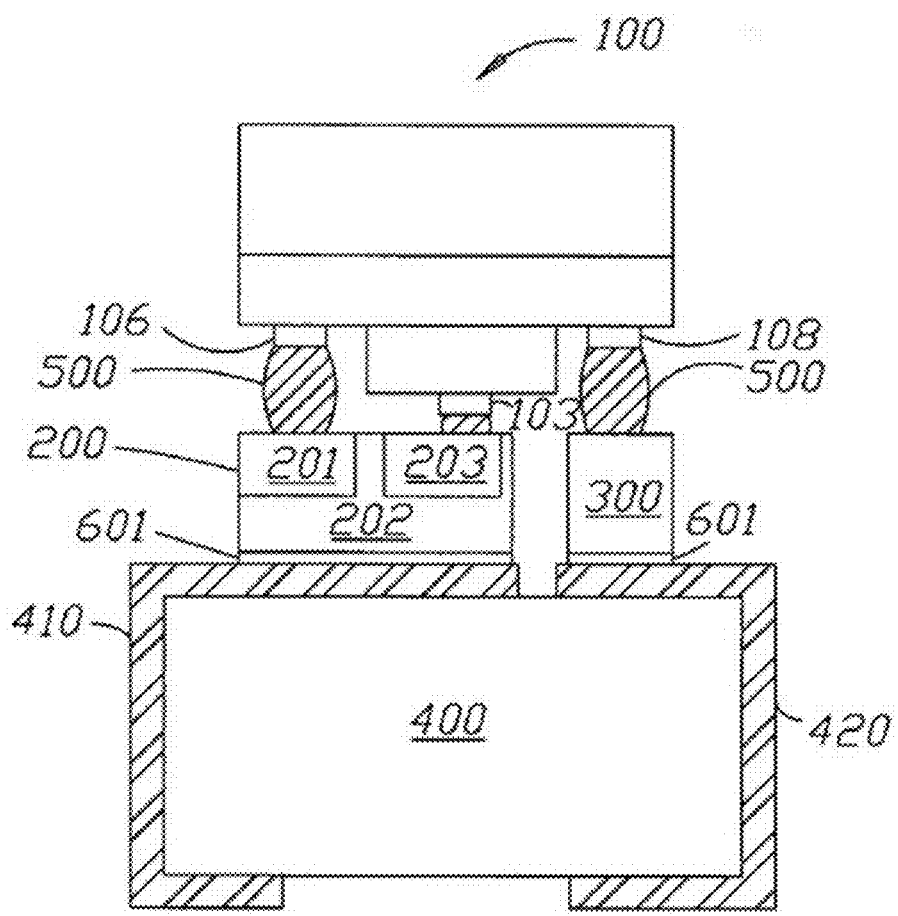
FIG. 5 shows an exemplary embodiment of the semiconductor light emitting device disclosed in U.S. Pat. No. 7,098,543.
Figure 6:
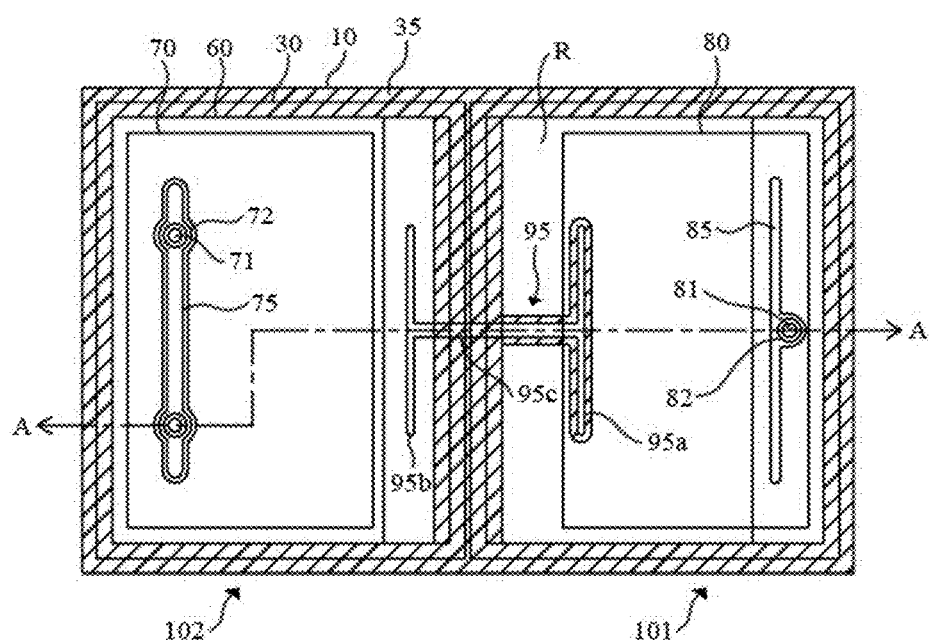
FIG. 6 shows an exemplary embodiment of a semiconductor light emitting device according to the present disclosure.
Figure 7:
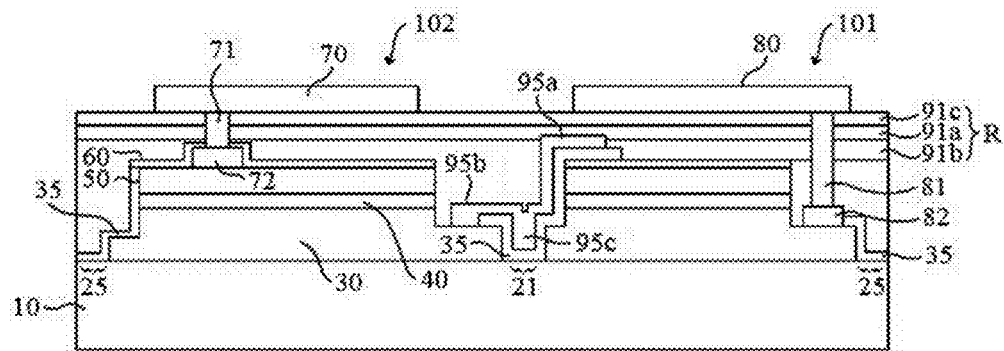
FIG. 7 shows an exemplary cutaway view taken along line A-A in FIG. 6.

FIG. 6 shows an exemplary embodiment of a semiconductor light emitting device according to the present disclosure, and FIG. 7 shows an exemplary cutaway view taken along line A-A in FIG. 6, in which the semiconductor light emitting device includes a first light emitting part 101, a second light emitting part 102, an insulating layer 35, a connecting electrode 95, an insulating reflective layer R, a first electrode part 80, 81, 82, 85, and a second electrode part 70, 71, 72, 75. The following describes a Group III-nitride semiconductor light emitting device as an example.

The first light emitting part 101 and the second light emitting part 102 each have multiple semiconductor layers 30, 40, 50 formed on a substrate 10. The substrate 10, which may eventually be removed, is typically made of sapphire, SiC, Si, GaN or the like. The first semiconductor layer 30 and the second semiconductor layer 50 can exchange their positions, and these semiconductor layers are typically made of GaN in the case of Group III-nitride semiconductor light emitting devices.

The multiple semiconductor layers 30, 40, 50 include a buffer layer (not shown) a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interposed between the first semiconductor layer 30 and the second semiconductor layer 50 and generates light by electron-hole recombination. Each of the multiple semiconductor layers 30, 40, 50 may have a multilayer structure, and the buffer layer may be omitted.

The first light emitting part 101 and the second light emitting part 102 has a trench or an etched portion 21, 25 formed by removing (e.g., mesa-etching) those adjacent multiple semiconductor layers 30, 40, 50. In the etched portion 21, 25, although the multiple semiconductor layers 30, 40, 50 can be removed to expose the substrate 10, it is also possible that an additional layer is formed between the multiple semiconductor layers 30, 40, 50 and the substrate 10. Multiple semiconductor light emitting devices formed on a wafer are separated at the etched portion 25 on the outer edge (boundary) of the first light emitting part 101 and the second light emitting part 102, thereby producing individual semiconductor light emitting devices. In this embodiment, the first light emitting part 101 and the second light emitting device 102 have a generally quadrangular shape when seen from the top, and are arranged such that their edges face each other. With the multiple semiconductor layers 30, 40, 50 being removed, a region between the first light emitting part 101 and the second light emitting part 102 and the boundary of the first light emitting part 101 and the second light emitting part 102 turn into etched portions 21, 25, and the substrate 10 can therefore be exposed. Because of these etched portions 21, 25, the first light emitting part 101 and the second light emitting part 102 themselves are electrically isolated or insulated. On one hand, as the multiple semiconductor layers 30, 40, 50 become light emission regions, it is desirable to restrain downsizing of the multiple semiconductor layers 30, 40, 50 due to the etched portion 21, 25. On the other hand, the etched portion 25 on the boundary should have a certain width to obtain individual semiconductor light emitting devices through separation. In this embodiment, the etched portion 21 between the first light emitting part 101 and the second light emitting part 102 has a width narrower than the etched portions 25 on the boundary of the first light emitting part 101 and of the second light emitting part 102, such that a suitable margin is ensured on the boundary to restrain downsizing of the multiple semiconductor layers 30, 40, 50. In this context, the width of the etched portion on the boundary can imply the width of the etched portion between the multiple semiconductor light emitting devices on a wafer, or the width of the etched portion 25 on the boundary of a separated individual semiconductor light emitting device.

The insulating layer 35 is a passivation layer having light transmission properties. It contains a material such as $SiO_2$, $TiO_2$, $Al_2O_3$ or the like, and can be deposited on the etched portions 21, 25. In FIG. 6, the formation of the insulating layer 35 is indicated by dashed lines. Deposition thickness may be several thousand Å, for example, but needless to say, this thickness may vary. In this embodiment, with the etched portions 21, 25 being formed along the edges facing each other of the first light emitting part 101 and the second light emitting part 102 across a boundary between the first light emitting part 101 and the second light emitting part 102, electrical insulation can be more stably ensured. Further, as described above, since the light emitting part 101 and the second light emitting part 102 have a narrow gap between them, it may be advantageous to form the insulating layer 35 as in this embodiment in terms of electrical insulation perspectives especially for a semiconductor light emitting device that operates at a high voltage with serially connected multiple light emitting parts. In addition, the insulating layer 35 thus formed is preferably extended to the etched portion 25 on the boundary of the first light emitting part 101 and of the second light emitting part 102, so as to improve the reliability of electrical insulation even more. With another insulating reflective layer R formed (to be described), the step or height difference can be reduced or made equal throughout.

A second finger electrode 75, a second ohmic electrode 72, and a first extension 95a of the connecting electrode 95 (to be described) are formed over the second semiconductor layer 50, and a light absorption barrier is preferably formed beneath them. For example, the light absorption barrier may be made of $SiO_2$, $TiO_2$ or the like, and it may only serve to reflect part or all of the light generated by the active layer 40, or to block the current flowing immediate downstream from the second finger electrode 75, the second ohmic electrode 72, and the first extension 95a of the connecting electrode 95, or both. In this embodiment, the insulating layer 35 is formed on the side of the first semiconductor layer 30 of the second light emitting part 102, the side of the exposed substrate 10, and the sides of the multiple semiconductor layers 30, 40, 50 of the first light emitting part 101. Moreover, as illustrated in FIG. 6 and FIG. 7, the insulating layer 35 is formed on the second semiconductor layer 50 of the second light emitting part 102, in correspondence with the second finger electrode 75 and the second ohmic electrode 72, as well as over the second semiconductor layer 50 of the first light emitting part 101, in correspondence with the first extension 95a of the connecting electrode 95. In this manner, the insulating layer 35 can also serve as a light absorption barrier. Optionally, one may also consider forming such a light absorption barrier in a separate process from the insulating layer 35, and if this is the case, the insulating layer 35 may be formed into a greater thickness.

Once the insulating layer 35 is formed, a current spreading conductive film 60 is preferably formed on the second semiconductor layer 50. P-type GaN is known to have a poor ability in current spreading, and thus a P-type semiconductor layer 50 made of GaN is usually in need of help from the current spreading conductive film 60. For example, a material such as ITO, Ni/Au or the like can be used for the current spreading conductive film 60.

The connecting electrode 95 crosses over the insulating layer 35 between the first light emitting part 101 and the second light emitting part 102, and electrically connects the first light emitting part 101 and the second light emitting part 102. In this embodiment, the connecting electrode 95 includes a first extension 95a, a second extension 95b, and a connection part 95c, and the insulating reflective layer R covers the first light emitting part 101, the second light emitting part 102, the connecting electrode 95 and the insulating layer 35. The first extension 95a extends along the edge of the first light emitting part 101 between the current spreading conductive film 60 of the first light emitting part 101 and the insulating reflective layer R. The second extension 95b are stretched out along the edge of the second light emitting part 102 on the first semiconductor layer 30 on an exposed portion of the first semiconductor layer 30 in the second light emitting part 102. The connection part 95c is stretched out on the insulating layer 35 between the first light emitting part 101 and the second light emitting part 102, and extends over the insulating layer 35 formed on the side of the first light emitting part 101 and the second light emitting part 102 to be connected with the second extension 95b.

The first extension 95a and the second extension 95b are stretched out at the edges facing each other in the first light emitting part 101 and the second light emitting part 102, respectively. Therefore, the first extension 95a and the second extension 95b are formed such that they are kept from extending near the middle of the first light emitting part 101 and the second light emitting part 102. Moreover, in order to facilitate current supply or current spreading, the first extension 95a and the second extension 95b are stretched out in the form of branches, running roughly parallel to each other. In this manner, as the first extension 95a and the second extension 95b, each being a sort of an electrode, are elongated, while keeping a narrow gap between them and facing each other, the insulating layer 35 is formed not only beneath the connection part 95c as described above, but also throughout the etched portion 21 between the first light emitting part 101 and the second light emitting part 102 as in this embodiment such that a further improvement in the electrical reliability may be achieved. Even if the connection part 95c may deviate from its intended position due to an error in the connection part 95c forming process, the presence of the insulating layer 35 all the way between the first light emitting part 101 and the second light emitting part 102 ensures the same effect.

The insulating reflective layer R is formed such that it covers the first light emitting part 101, the second light emitting part 102, the connecting electrode 95 and the insulating layer 35, and reflects the light from the active layer 40 towards the substrate 10. While the insulating reflective layer R in this embodiment may be formed of a single layer and made of an insulating material to reduce light absorption, it is preferably a multilayer structure including a DBR (Distributed Bragg Reflector) or ODR (Omni-Directional Reflector). As illustrated in FIG. 7, the insulating reflective layer R can include a dielectric film 91b, a DBR 91a and a clad film, which are stacked in order.

The first electrode part 80, 81, 82, 85 provides the first semiconductor layer 30 with either electrons or holes, and the second electrode part 70, 71, 72, 75 provides the second semiconductor layer 50 with either electrons if holes are provided to the first semiconductor layer, or holes if electrons are provided to the first semiconductor layer. At least one of the first electrode part 80, 81, 82, 85 and the second electrode part 70, 71, 72, 75 has an electrical connection with an upper electrode formed on the insulating reflective layer R. The electrical connection runs through the insulating reflective layer R and establishes electrical communication between the upper electrode and the multiple semiconductor layers 30, 40, 50. In the context of the present disclosure, the principle of forming the insulating layer 35 all over the etched portions 21, 25 to improve the reliability of the electrical connection can equally be applied to a flip chip, a lateral chip and the like.

In this embodiment, the semiconductor light emitting device is a flip chip having an upper electrode 80, 70 and the multiple semiconductor layers 30, 40, 50 arranged at opposite sides with respect to the insulating reflective layer R. The first electrode part 80, 81, 82, 85 includes a first upper electrode 80, a first electrical connection 81, and a first ohmic electrode 82. The second electrode part 70, 71, 72, 75 includes a second upper electrode 70, a second electrical connection 71, and a second ohmic electrode 72. Although the ohmic electrodes 82, 72 may be omitted, it is desirable to include them in order to reduce a contact resistance and to ensure stable electrical connection. The first ohmic electrode 82 is formed an exposed portion of the first semiconductor layer 30 by etching the first light emitting part 101, and the second ohmic electrode 72 is arranged on the current spreading conductive film 60 of the second light emitting part 102. The first upper electrode 80 is formed on the insulating reflective layer R of the first light emitting part 101, and the second upper electrode 70 is formed on the insulating reflective layer R of the second light emitting part 102. The first electrical connection 81 runs through the insulating reflective layer R and connects the first upper electrode 80 and the first ohmic electrode 82. The second electrical connection 71 runs through the insulating reflective layer R and connects the second upper electrode 70 and the second ohmic electrode 72.

In the case that the first semiconductor layer 30 is made of n-GaN, and the second semiconductor layer 50 is made of p-GaN, current spreading is better in the first semiconductor layer 30 than in the second semiconductor layer 50, and because of this, the number of the first electrical connections 81 available can be smaller than the number of the second electrical connections 71 available, as in this embodiment. In addition, according to this embodiment, the semiconductor light emitting device includes a first finger electrode 85 and a second finger electrode 75. The first finger electrode 85 is stretched out along the edge that faces the first extension 95a of the connecting electrode 95 on an exposed portion of the first semiconductor layer 30 by etching the first light emitting part 101, and connected with the first electrical connection 81. The second finger electrode 75 is stretched out along the edge that faces the second extension 95b of the connecting electrode 95 between the insulating reflective layer R and the current spreading conductive film 60 of the second light emitting part 102, and connected with the second electrical connection 71. Accordingly, in this embodiment, the extensions 95a, 95b of the connecting electrode 95 and the finger electrodes 85, 75 are stretched out, facing each other at the edges of the first light emitting part 101 and the second light emitting part 102. Therefore, in a semiconductor light emitting device driven at a high voltage with serially-connected, multiple light emitting parts, if each of the light emitting parts has a small area, the resulting structure of the device can be advantageous for uniform current supply and/or uniform light emission.

As described above, the insulating reflective layer R is arranged such that it covers the first light emitting part 101, the second light emitting part 102, the connecting electrode 95 and the insulating layer 35. In that regard, the formation of the insulating reflective layer R requires extra caution because of the step or height difference present between the structures below the insulating reflective layer R, such as, the light emitting part 101, 102 and the etched portion 21, 25, or an uneven structure resulting from the connecting electrode 95, the finger electrodes 85, 75, the ohmic electrodes 82, 72, etc. For example, if the insulating reflective layer R has a multilayer structure having a DBR, each material layer in the structure should have a specific thickness to help the insulating reflective layer R to function properly. By way of example, the DBR may have a stack of alternating $SiO_2/TiO_2$, $SiO_2/Ta_2O_2$, or $SiO_2/HfO$, as $SiO_2/TiO_2$ demonstrates a high blue-light reflection efficiency, and $SiO_2/Ta_2O_2$ or $SiO_2/HfO$ demonstrates a high UV-ray reflection efficiency. The DBR 91a is preferably formed by PVD (Physical Vapor Deposition), and more particularly, E-Beam evaporation, sputtering or thermal evaporation. As the deposition of the DBR 91a needs to be done with high precision, the dielectric film 91b having a uniform thickness may be formed before the deposition such that the DBR 91a can be prepared in a stable manner, and light reflection can also benefit therefrom. As the deposition of the DBR 91a needs to be done with high precision, the dielectric film 91b of a certain thickness may be formed before the deposition such that the DBR 91a can be prepared in a stable manner, and light reflection can also benefit therefrom. The dielectric film 91b can be made of a suitable material like $SiO_2$, and have a thickness of 0.2 μm-1.0 μm for instance. The clad film 91c may be made of $Al_2O_3$, $SiO_2$, SiON, MgF, CaF or the like. The insulating reflective layer R may have a thickness of 1-8 μm for instance.

Meanwhile, incident light is not always reflected totally by the insulating reflective layer R, and a portion thereof may be transmitted. In particular, as illustrated in FIG. 7, there can be a region where it is hard to form each material layer of the insulating reflective layer R structure in an intended thickness because of the step or height difference present between the light emitting part 101, 102 and the etched portion 21, 25, and the reflection efficiency in this region is lower, allowing the light to be transmitted. As described above, in this embodiment, the insulating layer 35 is formed not only over the etched portion 21 between the first light emitting part 101 and the second light emitting part 102, but also over the etched portions 25 at the edges, and the thickness of the insulating layer 35 may be modified, if necessary. Therefore, the insulating layer 35 reduces the height difference and once the insulating reflective layer R is formed on the etched portions 21, 25, it gives generally equal height in different positions such that each material layer in the structure of the insulating reflective layer R may have its intended thickness. As a result, the presence of the insulating layer is advantageous for the formation process of the insulating reflective layer R itself as well as for keeping the reflection efficiency from being lowered due to the height difference.

Figure 8:
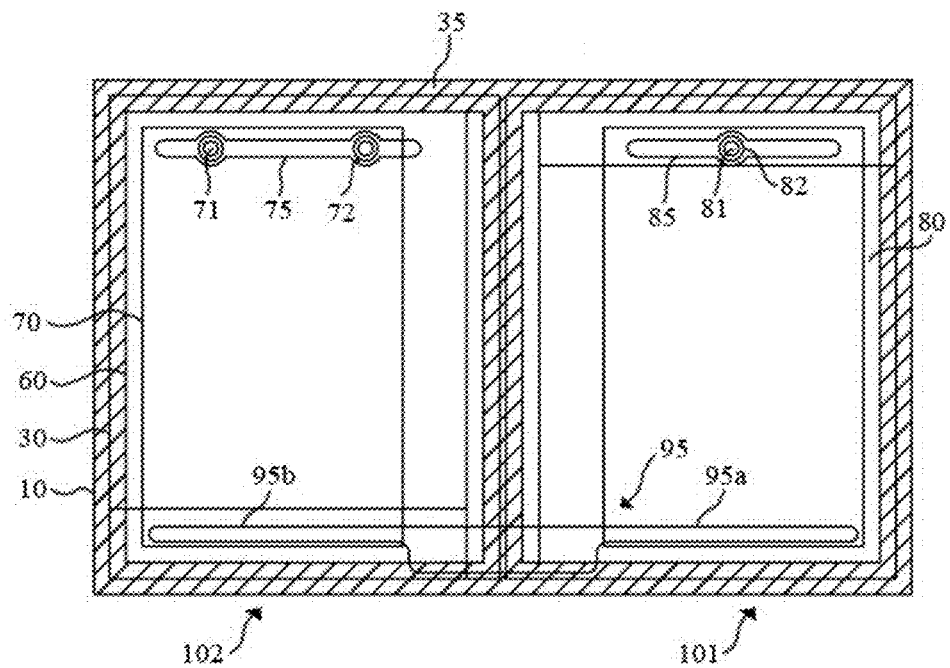
FIG. 8 shows another exemplary embodiment of a semiconductor light emitting device according to the present disclosure.
Figure 9:
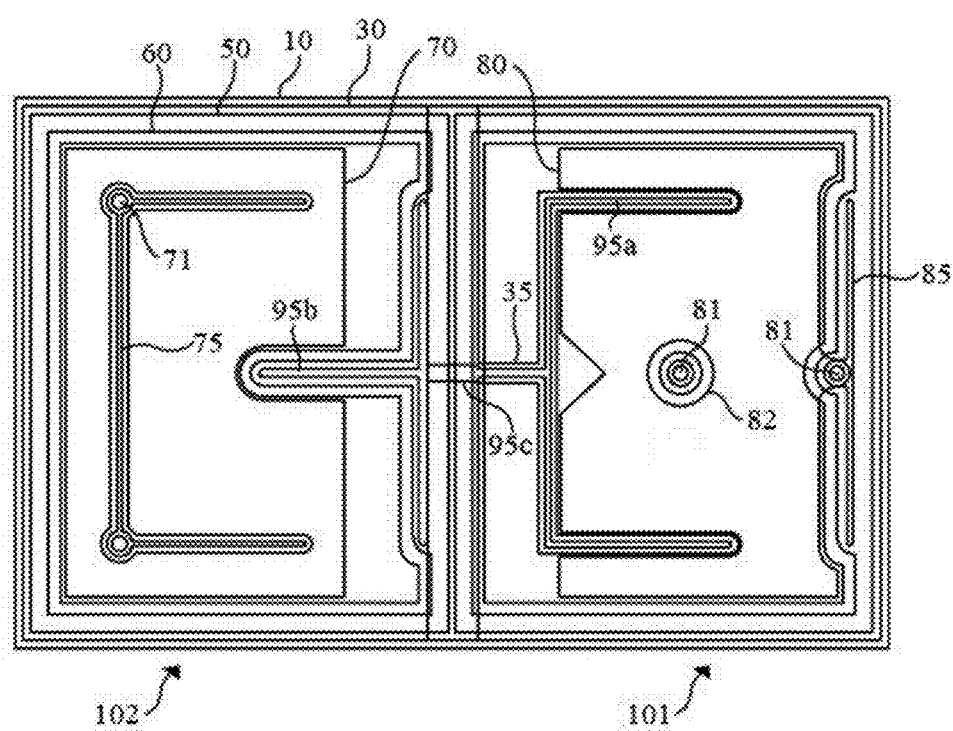
FIG. 9 shows yet another exemplary embodiment of a semiconductor light emitting device according to the present disclosure.

FIG. 8 shows another exemplary embodiment of a semiconductor light emitting device according to the present disclosure, in which the insulating layer 35 is formed between the first light emitting part 101 and the second light emitting part 102, and on the etched portions at the edges. The connecting electrode 95 is formed along the edges connected to their opposite edges, which is different from the exemplary embodiment in FIG. 6 where the connecting electrode 95 is formed along the edges facing each other in the first light emitting part 101 and the second light emitting part 102. In addition, the first finger electrode 85 is formed along the edges of the first light emitting part 101 facing the first extension 95a of the connecting electrode 95, and the second finger electrode 75 is formed along the edges of the second light emitting part 102 facing the second extension 95b of the connecting electrode 95. Therefore, with the extensions 95a, 95b and the finger electrodes 85, 75 facing each other and maintaining a uniform gap therebetween, a resulting semiconductor light emitting device, which includes multiple light emitting parts and each of the light emitting parts has a relatively small area, can have a suitable structure for accomplishing uniform current supply as well as uniform light emission. Further, the absence of the extensions at the edges facing each other in the first light emitting part 101 and the second light emitting part 102 helps such a semiconductor light emitting device to be free from electrical insulation problems, FIG. 9 shows another exemplary embodiment of a semiconductor light emitting device according to the present disclosure, in which the first extension 95a is extended along another edge of the first light emitting part 101, and additionally, the second extension 95b is further extended inside the second light emitting part 102. Also, the semiconductor light emitting device further includes a first electrical connection 81 which is not connected with the first finger electrode 85 but independently in communication with the first semiconductor layer 30.

Figure 10:
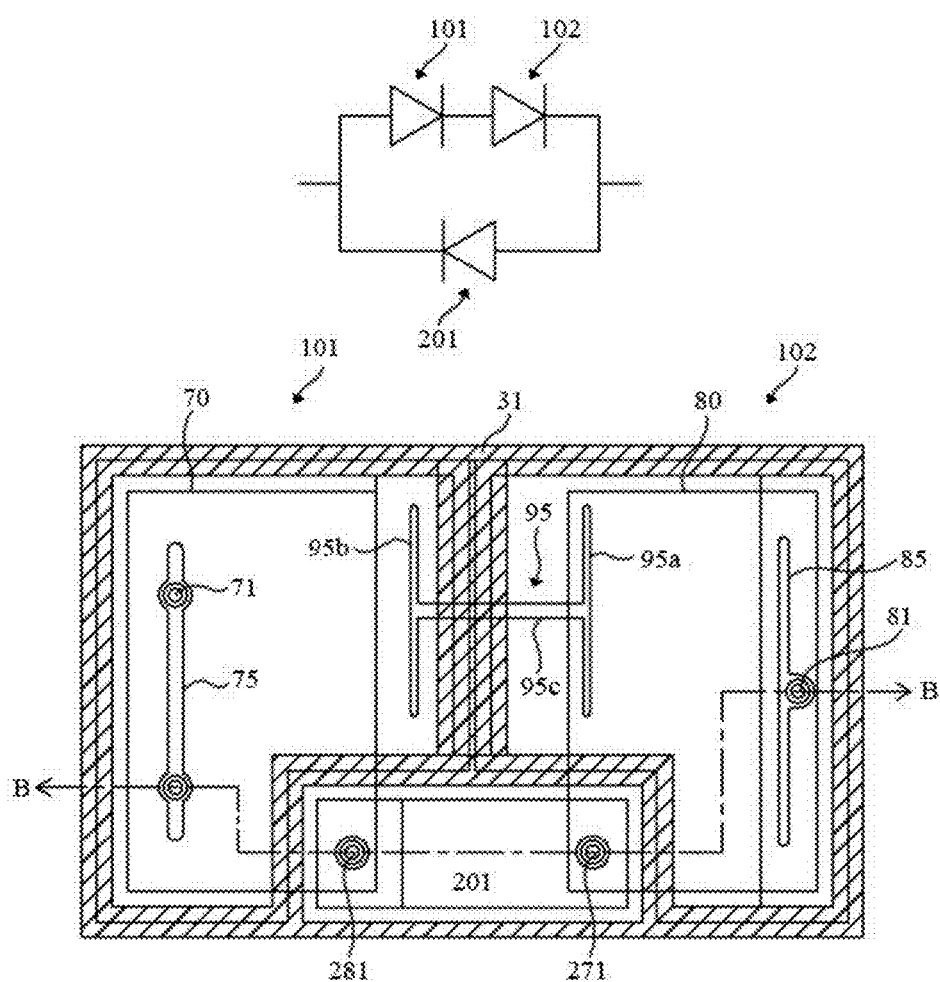
FIG. 10 shows yet another exemplary embodiment of a semiconductor light emitting device according to the present disclosure.
Figure 11:
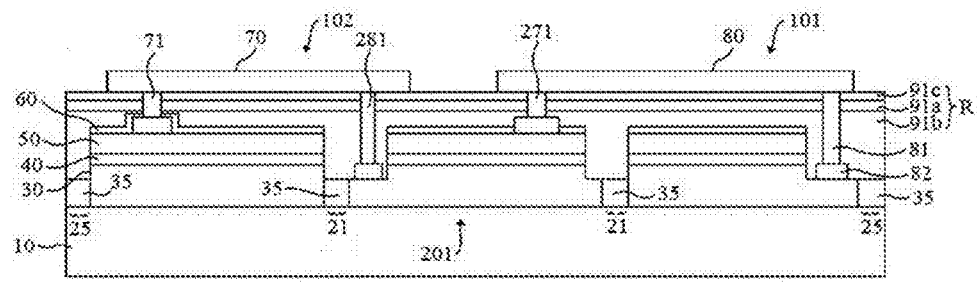
FIG. 11 shows an exemplary cutaway view taken along line B-B in FIG. 10.

FIG. 10 shows yet another exemplary embodiment of a semiconductor light emitting device according to the present disclosure, and FIG. 11 shows an exemplary cutaway view taken along line B-B in FIG. 10, in which the semiconductor light emitting device includes a first light emitting part 101, a second light emitting part 102, a protection part 201, an insulating reflective layer R, a first electrode part 80, 81, 82, 85, and a second electrode part 70, 71, 72, 75. The protection part 201 includes multiple semiconductor layers 30, 40, 50, and the first light emitting part 101, the second light emitting part 102 and the protection part 201 themselves are electrically isolated by the etched portions 21, 25. The insulating layer 35 can be formed on the etched portions 21, 25 and made thicker in this embodiment, as described above. When seen from the top, a part of the etched portion 21, 25 around the protection part 201 is connected to the etched portion 25 on the outer edge of the first light emitting part 101 and the second light emitting part 102.

The connecting electrode 95 serves to electrically connect the first light emitting part 101 and the second light emitting part 102, and the insulating reflective layer R covers the first light emitting part 101, the second light emitting part 102, the protection part 201, the connecting electrode 95 and the insulating layer 35. The protection part 201 is formed such that it extends downwardly below the first upper electrode 80 and below the second upper electrode 70, starting between the first light emitting part 101 and the second light emitting part 102.

In this embodiment, the semiconductor light emitting device is a flip chip. Here, the first electrode part 80, 81, 82, 85 allows electrical communication between the first semiconductor layer 30 of the first light emitting part 101 and the second semiconductor layer 50 of the protection part 201. The second electrode part 70, 71, 72, 75 allows electrical communication between the second semiconductor layer 50 of the second light emitting part 102 and the first semiconductor layer 30 of the protection part 201. For example, an additional, first electrical connection 281 runs through the insulating reflective layer R and serves to electrically connect the second upper electrode 70 and the first semiconductor layer 30 of the protection part 201. An additional, second electrical connection 271 runs through the insulating reflective layer R and serves to electrically connect the upper electrode 80 and the second semiconductor layer 50 of the protection part 201. Hence, the first light emitting part 101 and the second light emitting part 102 are connected in the forward direction by the connecting electrode 95, and the protection part 201 is connected to the first light emitting part 101 and the second light emitting part 102 in the backward direction. In this way, the protection part 201 functions as an ESD protective device (e.g., Zener diode).

As described above, the flip chip as the semiconductor light emitting device according to this embodiment further includes the protection part 201 on the substrate 10, where the protection part 201 is formed in a very compact arrangement between the first light emitting part 101 and the second light emitting part 102 as illustrated in FIG. 10. Moreover, unlike the embodiment illustrated in FIG. 6, no additional process is required to form the etched portions 21, 25, the upper electrode, the connecting electrode 95 and so on. This type of the semiconductor light emitting device also has a relatively higher degree of freedom in design since there is no need to form an elongate finger electrode for electrically connecting the protection part 201 and each light emitting part, such that it does not suffer from increased light absorption caused by such an elongate metallic finger electrode.

Figure 12:
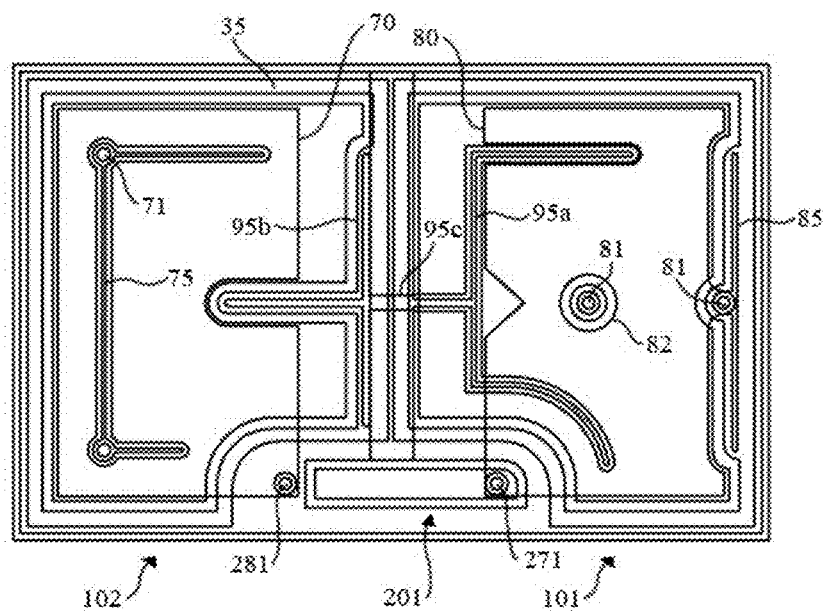
FIG. 12 shows yet another exemplary embodiment of a semiconductor light emitting device according to the present disclosure.

FIG. 12 shows yet another exemplary embodiment of a semiconductor light emitting device according to the present disclosure, in which the first extension 95a and the second extension 95b of the connecting electrode are extended to a greater degree. Particularly, with the protection part 201 being present, the first extension 95a is curved, bending around the protection part 201.

Figure 13:
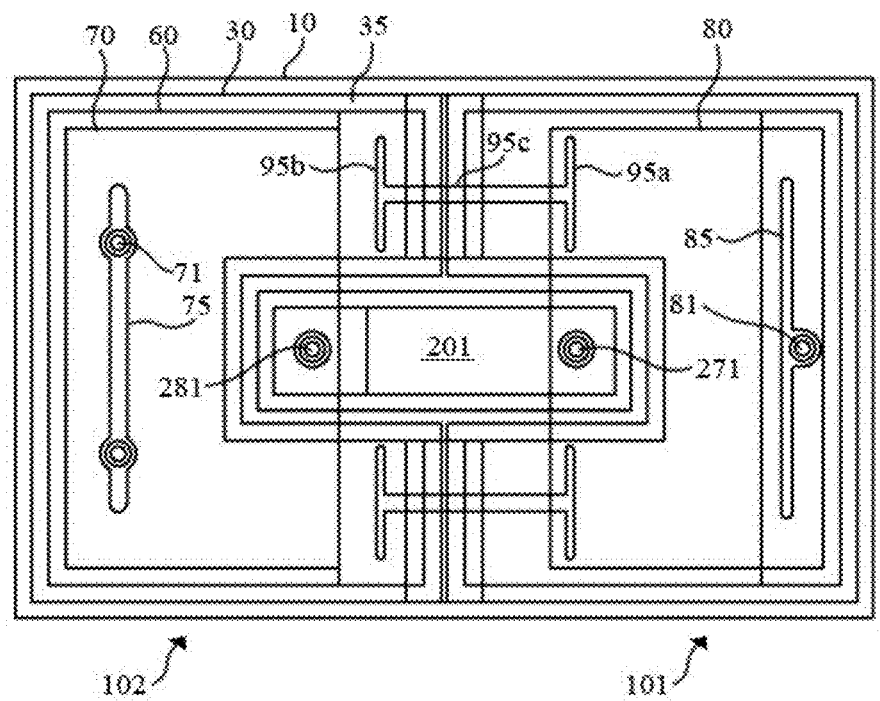
FIG. 13 shows yet another exemplary embodiment of a semiconductor light emitting device according to the present disclosure.

FIG. 13 shows yet another exemplary embodiment of a semiconductor light emitting device according to the present disclosure, in which the protection part 201 is formed between, i.e. in the middle of the first light emitting part 101 and the second light emitting part 102, and the connecting electrodes 95a, 95b, 95c are arranged on either side of the protection part 201. This embodiment provides better symmetry than the embodiment illustrated in FIG. 10.

Figure 14:
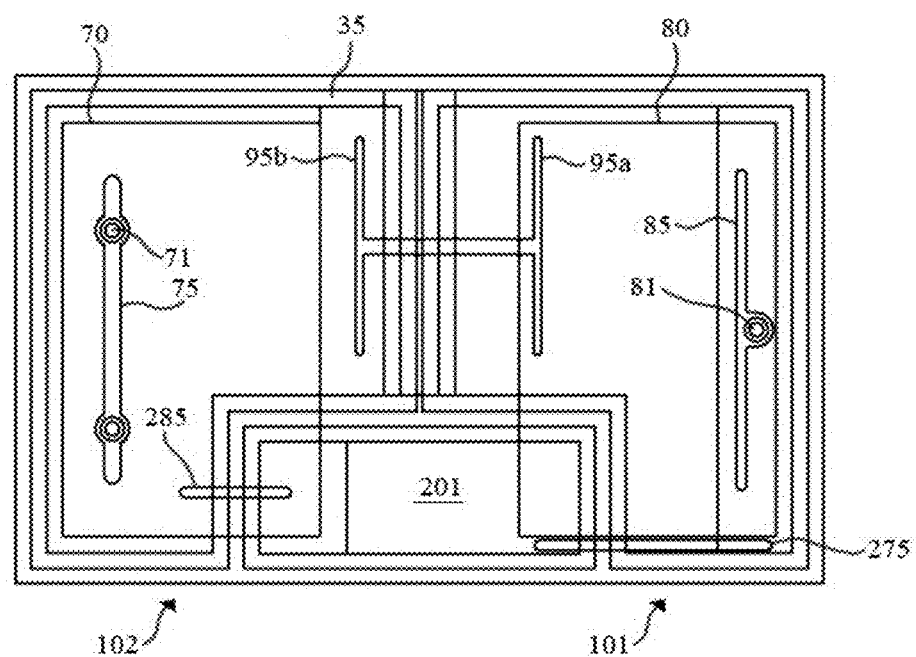
FIG. 14 shows yet another exemplary embodiment of a semiconductor light emitting device according to the present disclosure.

FIG. 14 shows yet another exemplary embodiment of a semiconductor light emitting device according to the present disclosure, in which the protection part 201, the first light emitting part 101 and the second light emitting part 102 are not connected by an electrical connection that runs through the insulating layer, but by additional connecting electrodes 285, 275 covered by the insulating layer 35. One of the additional connecting electrode 275 connects the first semiconductor layer 30 of the first light emitting part 101 and the second semiconductor layer 50 of the protection part 201, and the other additional connecting electrode 285 connects the second semiconductor layer 50 of the second light emitting part 102 and the first semiconductor layer 30 of the protection part 201.

Figure 15:
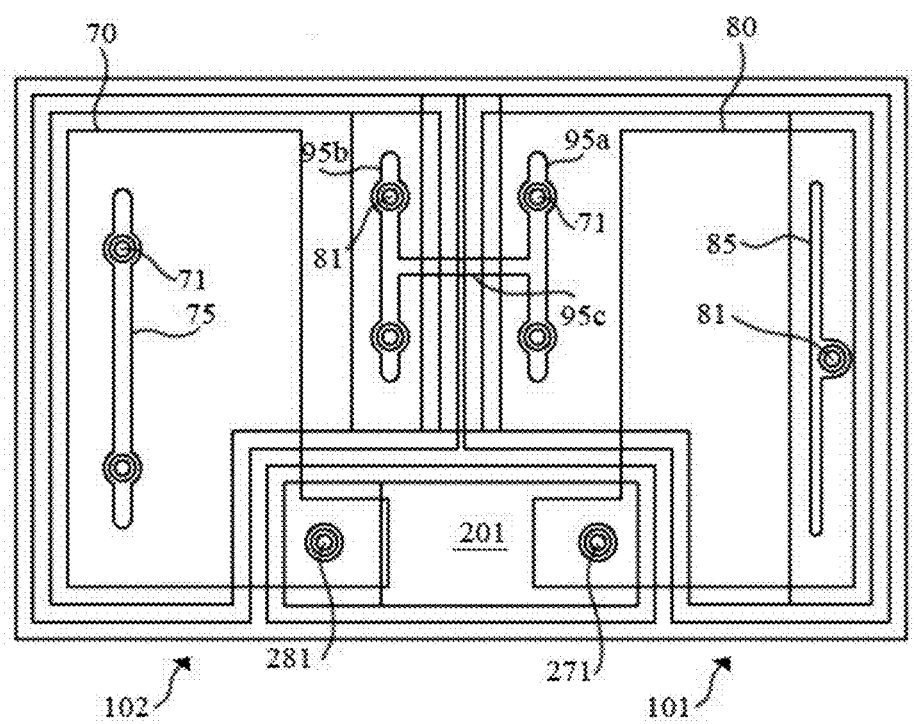
FIG. 15 shows yet another exemplary embodiment of a semiconductor light emitting device according to the present disclosure.

FIG. 15 shows yet another exemplary embodiment of a semiconductor light emitting device according to the present disclosure, in which the connecting electrodes 95a, 95b, 95c are formed on the insulating reflective layer R, starting from the first light emitting part 101 to the second light emitting part 102, and electrical communication is established between the second semiconductor layer 50 of the first light emitting part 101 and the first semiconductor layer 30 of the second light emitting part 102 by additional electrical connections 81, 71, respectively, which run through the insulating reflective layer R.

Figure 16:
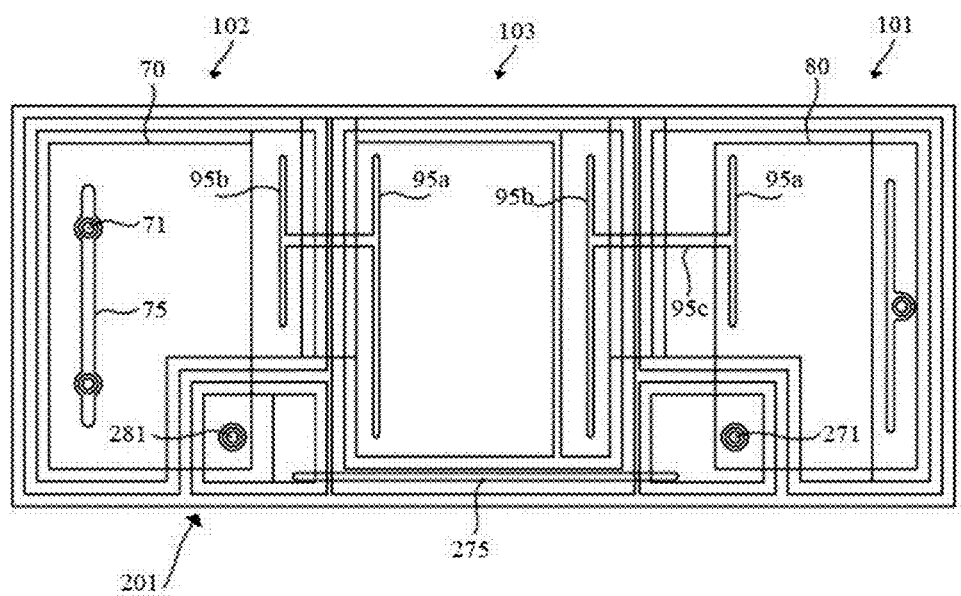
FIG. 16 shows yet another exemplary embodiment of a semiconductor light emitting device according to the present disclosure.

FIG. 16 shows yet another exemplary embodiment of a semiconductor light emitting device according to the present disclosure, in which a third light emitting part 103 is added between the first light emitting part 101 and the second light emitting part 102. The third light emitting part 103 is connected with the first light emitting part 101 and the second light emitting part 102, respectively, by the connecting electrodes 95a, 95b, 95c. The protection part 201 is split into two parts, one between the first light emitting part 101 and the third light emitting part 103, and the other between the second light emitting part 102 and the third light emitting part 103. Those two part of the protection part 201 are electrically connected with the respective second semiconductor layers 50 by the additional connecting electrode 275. As a result, the first, second and third light emitting parts 101, 102, 103 are connected in the forward direction, and the protection part 201 is connected to them in the backward direction.

Figure 17:
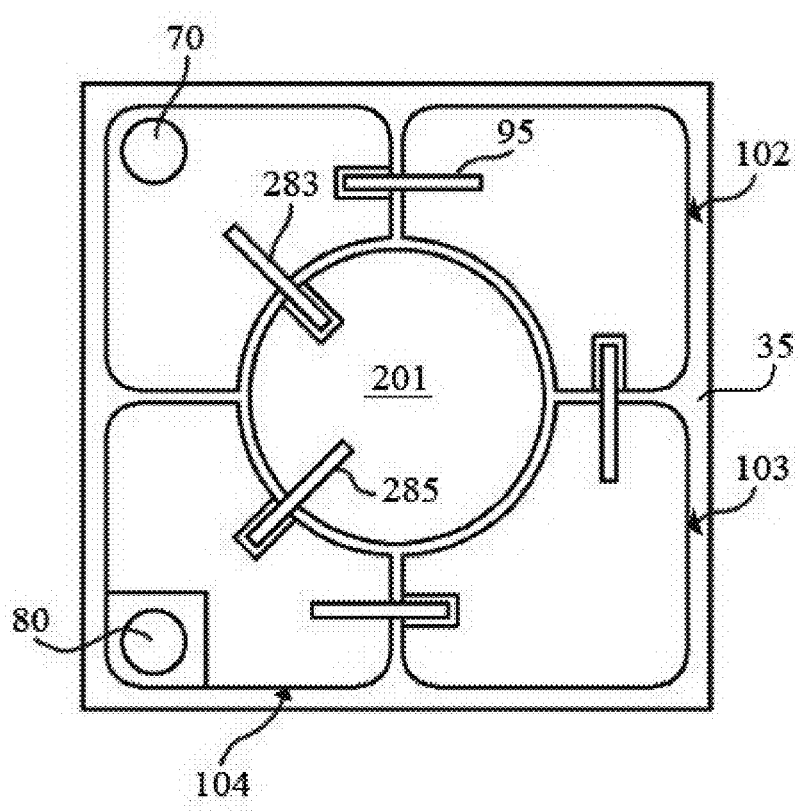
FIG. 17 shows yet another exemplary embodiment of a semiconductor light emitting device according to the present disclosure.

FIG. 17 shows yet another exemplary embodiment of a semiconductor light emitting device according to the present disclosure, illustrating that the disclosure can be applicable not only to flip chips, but also to lateral chips. In FIG. 17, there are four light emitting parts 101, 102, 103, 104 around the protection part 201 at the center, which are connected in series by connecting electrodes 95. An etched portion is formed between the protection part 201 and the four light emitting parts 101, 102, 103, 104, and the insulating layer 35 is formed across the etched portion. An additional connecting electrode 283 connects the second semiconductor layer 50 of the first light emitting part 101 and the first semiconductor layer 30 of the protection part 201, and another additional connecting electrode 285 connects the first semiconductor layer 30 of the fourth light emitting part 104 and the second semiconductor layer 50 of the protection part 201. In this manner, the protection part 201 and the light emitting parts 101, 102, 103, 104 are connected in the backward direction.

Figure 18:
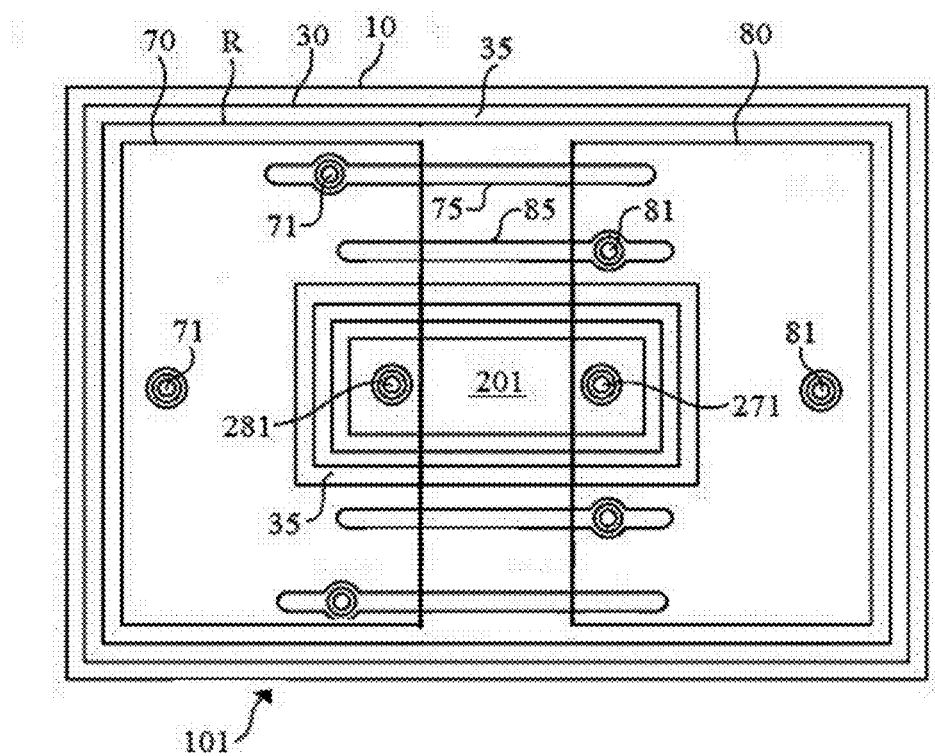
FIG. 18 shows yet another exemplary embodiment of a semiconductor light emitting device according to the present disclosure.

FIG. 18 shows yet another exemplary embodiment of a semiconductor light emitting device according to the present disclosure, in which both the protection part 201 and a flip chip 101 are formed on the substrate 10. The protection part 201 and the flip chip 101 can be insulated by the etched portion, and the insulating layer 35 can be formed over the etched portion. The first upper electrode 80 and the second upper electrode 70 are arranged at a distance from each other on the insulating reflective layer R, in which the first upper electrode 80 is connected to the first semiconductor layer by a first electrical connection 81, and the second upper electrode 70 is connected to the second semiconductor layer 50 by a second electrical connection 71. A first finger electrode 85 and a second finger electrode 75 are formed, respectively, on both sides of the protection part 201 at the center. An additional, first electrical connection 281 connects the first semiconductor layer 30 of the protection part 201 and the second upper electrode 70, and another additional, second electrical connection 271 connects the second semiconductor layer 50 of the protection part 201 and the first upper electrode 80. Therefore, with one flip chip 101 and the protection part 201 being connected in the backward direction, a resulting semiconductor light emitting device thus formed has an ESD protecting function.

Figure 19:
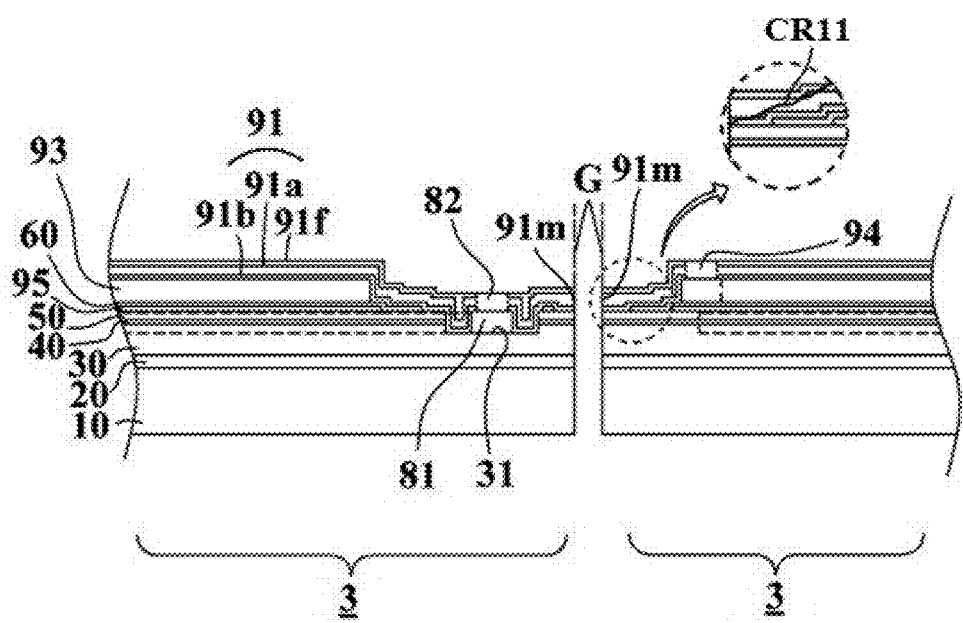
FIG. 19 shows the formation of a crack upon removal of a flip chip having a non-conductive reflective film.
Figure 20:
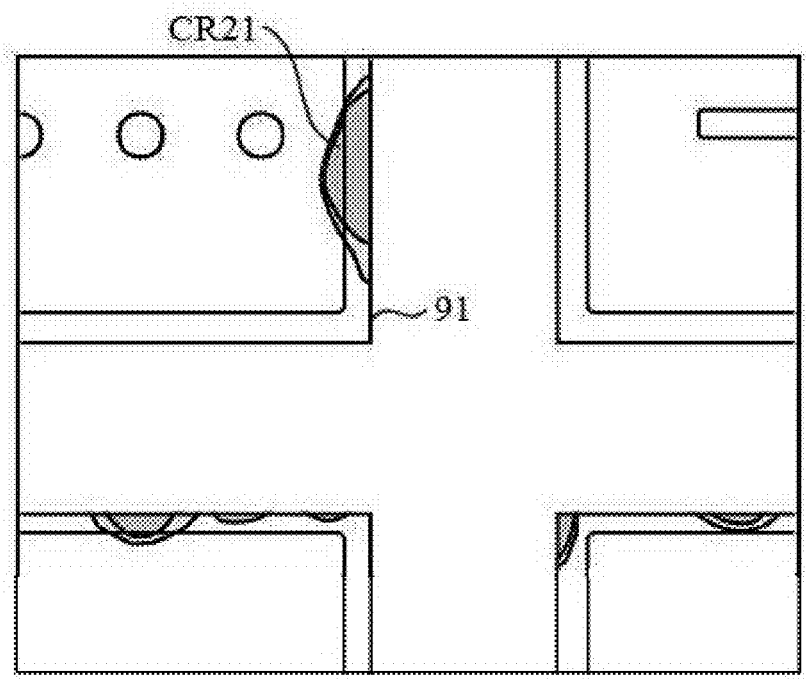
FIG. 20 shows an example of the inward propagation of a crack formed at the edge.

FIG. 19 shows the formation of a crack upon removal of a flip chip having a non-conductive reflective film, in which the non-conductive reflective film selected as a reflective film demonstrates improved reduction of light absorption as compared with a flip chip having the aforementioned metal reflective film. However, unlike a crystalline growth substrate or crystalline multiple semiconductor layers that are easily cut off by a scribing-and-breaking process, as shown in FIG. 20, the non-conductive reflective film usually containing a dielectric is sensitive to cracking at the edges during a chip separation process. In addition, such a crack is often propagated inwardly, i.e. towards a light emitting side, of a semiconductor light emitting device, thereby creating defects in the semiconductor light emitting device.

Figure 21:
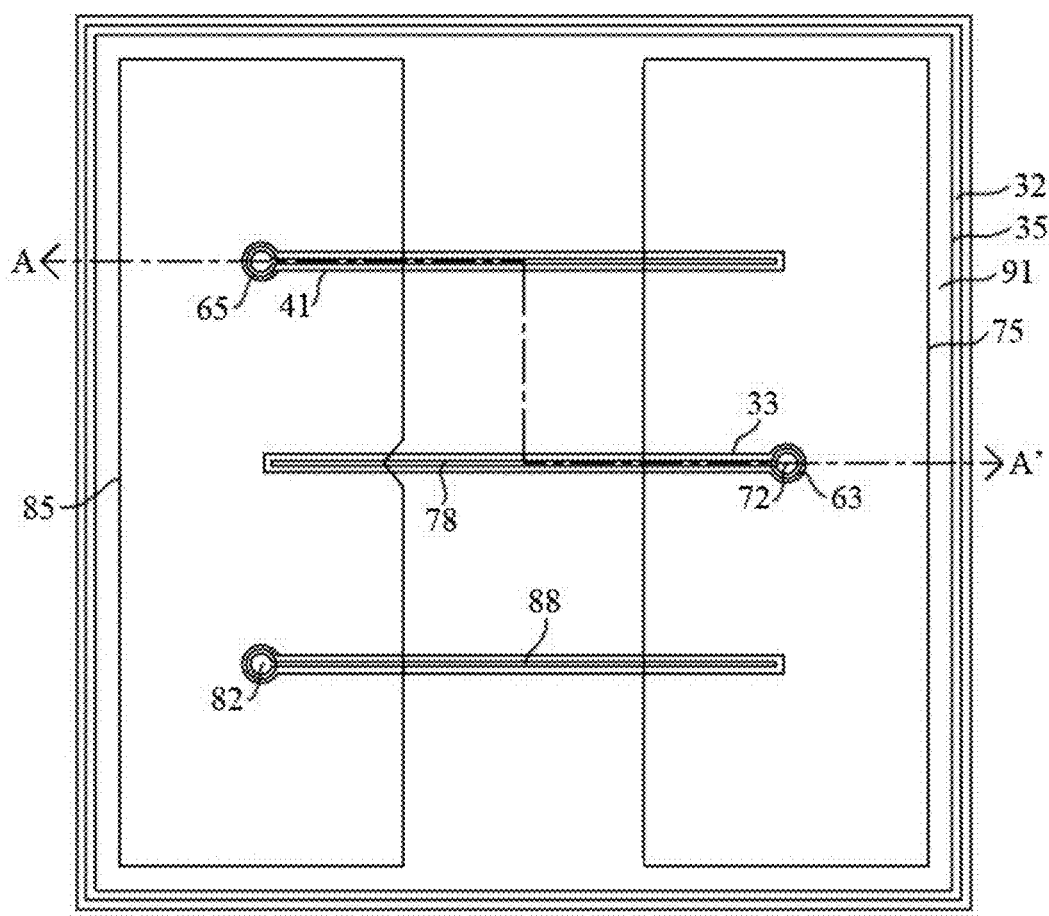
FIG. 21 shows yet another exemplary embodiment of a semiconductor light emitting device according to the present disclosure.
Figure 22:
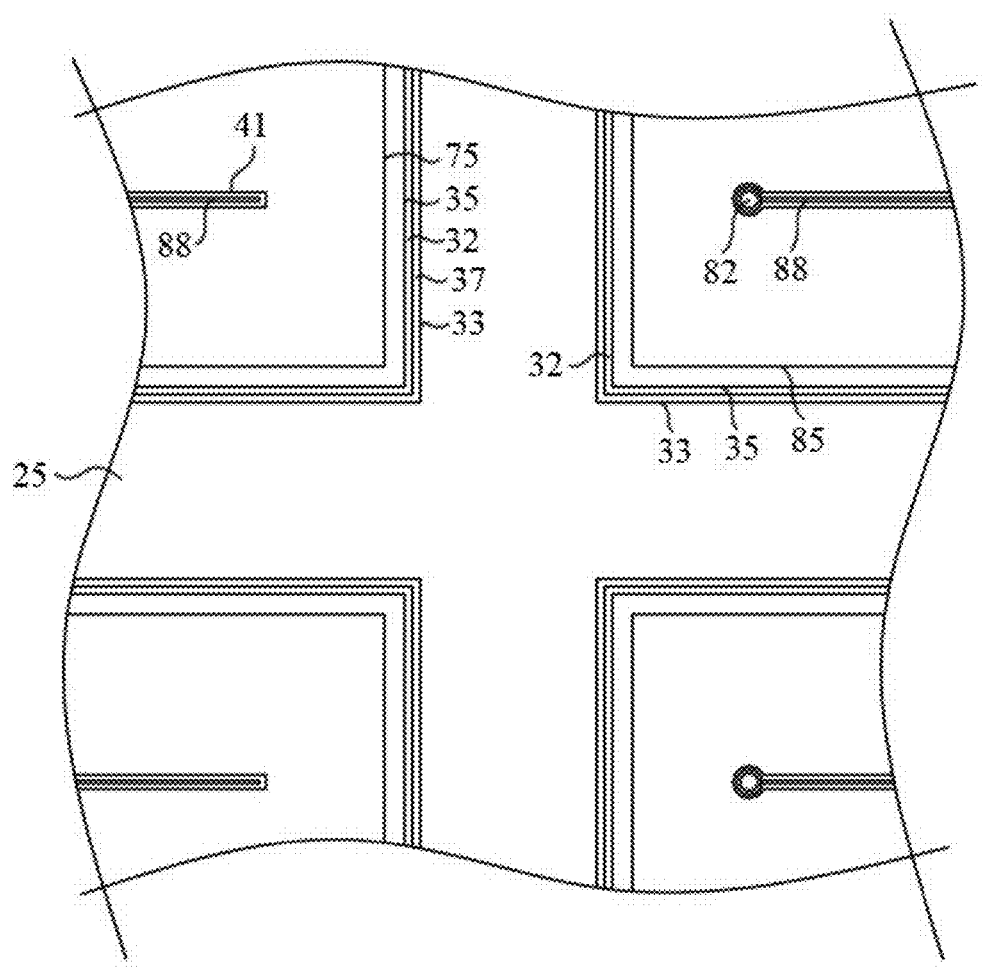
FIG. 22 shows an exemplary embodiment of a wafer on which multiple semiconductor light emitting devices are formed.
Figure 23:
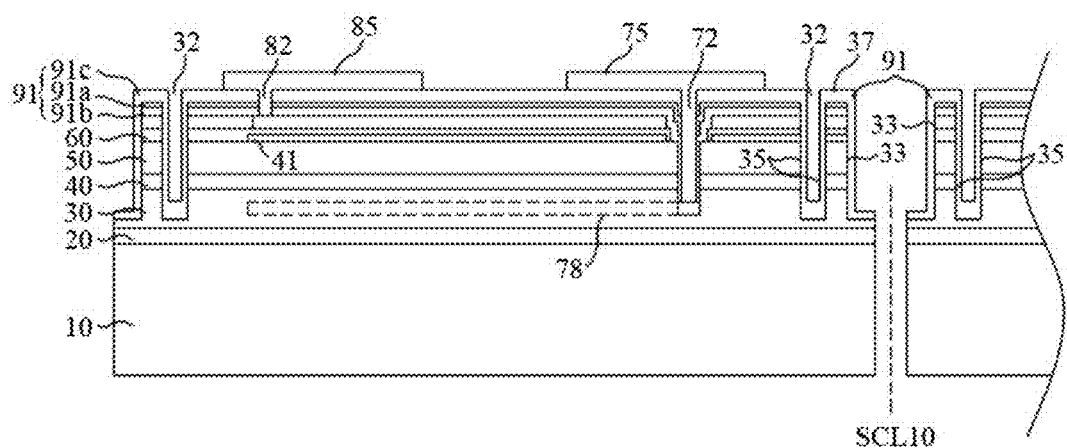
FIG. 23 shows a cutaway view taken along line A-A in FIG. 21.

FIG. 21 shows yet another exemplary embodiment of a semiconductor light emitting device according to the present disclosure, FIG. 22 shows an exemplary embodiment of a wafer on which multiple semiconductor light emitting devices are formed, and FIG. 23 shows a cutaway view taken along line A-A in FIG. 21.

The semiconductor light emitting device in this embodiment includes multiple semiconductor layers 30, 40, 50, a light absorption barrier 41, a current spreading conductive film 60, a non-conductive reflective film 91, a first electrode part, a second electrode part, and a blocking plane 35. In the following description, a Group III-nitride semiconductor light emitting device is taken by way of example.

On a substrate 10 (e.g., $Al_2O_3$, Si, SiC), a buffer layer (e.g., AlN or GaN buffer layer), an un-doped semiconductor layer (e.g., un-doped GaN), a first semiconductor layer 30 having a first conductivity type (e.g., Si-doped GaN), an active layer 40 for generating light by recombination of electrons and holes (e.g., InGaN/(In)GaN multiple quantum well structure), and a second semiconductor layer 50 having a second conductivity type different from the first conductivity type (e.g., Mg-doped GaN) are grown. The buffer layer 20 may be omitted, and each of the multiple semiconductor layers 30, 40, 50 may be formed in a multilayer structure. Although the conductivity types of the first semiconductor layer 30 and the second semiconductor layer 50 may be switched, it is not desirable especially in the case of Group III-nitride semiconductor light emitting devices.

In this embodiment, the first electrode part has a first electrode 75 as the upper electrode, a first finger electrode 78 as the electrical connection part, and an electrical connection 72 for connecting the first electrode 75 and the first finger electrode 78. Further, the second electrode part has a second electrode 85 as the upper electrode, and an electrical connection 82 as the electrical connection part for connecting the second electrode 85 and the second finger electrode 88.

While FIG. 23 illustrated an exemplary embodiment where the first electrode part and the second electrode part are arranged at opposite sides of the multiple semiconductor layers on the substrate, the present disclosure is also applicable to other semiconductor light emitting devices having such electrode parts positioned differently from this embodiment. For example, this embodiment can also be found in a vertical semiconductor light emitting device, in which an n-side or p-side bonding electrode is arranged on a conductive substrate, or below an exposed portion of the first semiconductor layer by etching the substrate.

As a portion of the light generated from the active layer 40 may also be absorbed by the second finger electrode 88, the light absorption barrier 41 is preferably disposed below the second finger electrode 88 to prevent it. The light absorption barrier 41 may only serve to reflect a portion or all of the light generated from the active layer 40, or to block the current flowing directly below the second finger electrode 88, or both.

It is preferable that the current spreading conductive film 60 is present. The current spreading conductive film 60 is a light transmitting film and can be formed between the light absorption barrier 41 and the second finger electrode 88 in such a manner that it covers almost the entire second semiconductor layer 50. Particularly, considering that a p-type GaN has a poor current spreading capability, a p-type semiconductor layer 50 made of GaN usually needs a help from the current spreading conductive film 60. For instance, a material such as ITO, Ni/Au or the like can be used for the current spreading conductive film 60.

The non-conductive reflective film 91 reflects the light from the active layer 40 towards the multiple semiconductor layers 30, 40, 50. In this embodiment, the non-conductive reflective film 91 is made of a non-conductive material to reduce light absorption by a metal reflective film. The non-conductive reflective film 91 may be composed of a single dielectric layer, or have a multilayer structure. As one example of the multilayer structure, the non-conductive reflective film 91 may include a dielectric film, a DBR (Distributed Bragg Reflector) and a clad film, which are stacked in order.

Preferably, the dielectric film 91b is made of a suitable material like SiO$_2$, and has a thickness of 0.2 to 1.0 μm. If the dielectric film 91b is too thin, it may not be able to sufficiently cover the lower electrode 78, 88 which has a height of 2 to 3 μm; while if the dielectric film 91b is too thick, it may make it difficult to form an opening in the non-conductive reflective film 91. The dielectric film 91b may have a thickness greater than the DBR 91a that follows. In addition, the dielectric film 91b needs to be formed with a suitable method for ensuring the reliability of the device. For example, the dielectric film 91 made of SiO$_2$ is preferably formed by CVD (Chemical Vapor Deposition), and more particularly by PECVD (Plasma Enhanced CVD). This is because CVD is more advantageous than PVD (Physical Vapor Deposition) such as E-Beam evaporation, in terms of achieving improved step coverage. More specifically, if the dielectric layer 91b is formed by E-Beam evaporation, it is difficult to form the dielectric film 91b in the intended thickness in a region having the height difference. As such, the dielectric film 91b is preferably formed by CVD for reducing the height difference and ensuring the insulation effect. In this way, it is possible to ensure the reliability of the resulting semiconductor light emitting device and to ensure the functions of the dielectric film as a reflective film.

The DBR 91a is formed on the dielectric film 91b. For example, the DBR may be composed of a stack of alternating SiO$_2$/TiO$_2$, SiO$_2$/Ta$_2$O$_2$, or SiO$_2$/HfO, as SiO$_2$/TiO$_2$ demonstrates a high blue-light reflection efficiency, and SiO$_2$/Ta$_2$O$_2$ or SiO$_2$/HfO demonstrates a high UV-ray reflection efficiency. In one example, if the DBR 91a is composed of a stack of alternating TiO$_2$/SiO$_2$, the DBR 91a is preferably formed by PVD (Physical Vapor Deposition), and more particularly, E-Beam evaporation, sputtering or thermal evaporation.

The clad film 91c may be made of a metal oxide such as Al$_2$O$_3$, a dielectric film such as SiO$_2$ or SiON, or other material such as MaF or CaF.

At least one of the dielectric film 91b and the clad film 91c may be omitted.

The DBR 91a is preferably made of a light transmitting material (e.g., SiO$_2$/TiO$_2$) to be able to prevent light absorption. The dielectric film 91b may be made of a dielectric material (e.g., SiO$_2$) having a lower effective refractive index than the DBR (91a). Here, the effective refractive index means an equivalent refractive index of light that can travel in a waveguide made of materials having different refractive indices. The clad film 91c may also be made of a material having a lower effective refractive index than the DBR (91a) (e.g., Al$_2$O$_3$, SiO$_2$, SiON, MgF, CaF). With these refractive indices thus selected, the dielectric film 91b-DBR 91a-clad film 91c can be explained in view of an optical waveguide. The optical waveguide is a structure that encloses a propagation part of light by a material having a lower refractive index than the propagation part of light and directs the light by total reflection. In this regard, if the DBR 91a can be taken as the propagation part, the dielectric film 91b and the clad film 91c can be taken as part of the structure that enclose the propagation part.

In one example, the DBR 91a is composed of a stack of multiple alternating SiO$_2$ and TiO$_2$ layers. In addition, the DBR 91a can be composed of a combination of a higher refractive index material such as Ta$_2$O$_5$, HfO, ZrO, SiN or the like and a lower refractive index material such as SiO$_2$. If the DBR 91a is composed of TiO$_2$/SiO$_2$, it should preferably undergo an optimization process in consideration of an angle of incidence as well as wavelength-dependent reflectivity, using a ¼ optical thickness of the wavelength of the light emitted from the active layer 40 as a reference, yet it is not absolutely required that each layer should have a ¼ optical thickness of the wavelength. The number of combinations in the stack is suitably between 4 and 40 pairs. If the DBR 91a is composed of SiO$_2$/TiO$_2$, with SiO$_2$ having a refractive index of 1.46 and TiO$_2$ having a refractive index of 2.4, an effective refractive index of the DBR 91a has a value between 1.46 and 2.4. Accordingly, the dielectric film 91b can be composed of SiO$_2$, and a suitable thickness for it would be between 0.2 and 1.0 μm. Depositing the DBR 91a requires high precision, yet the first DBR 91a can be prepared in a stable manner by forming a dielectric film of a certain thickness before depositing the DBR 91a, which in turn plays in favor of light reflection. The clad film 91c may also be composed of SiO$_2$ having a refractive index of 1.46 that is lower than the effective refractive index of the first DBR 91a. Preferably, the clad film 91c has a thickness ranging from λ/4n to 3.0 μm, in which λ denotes a wavelength of the light generated from the active layer 40, and n denotes a refractive index of a material composing the clad film 91c. If λ is 450 nm (4500 Å), the clad film 91c can be formed in a thickness of 771 Å (4500/4×1.46=771 Å) or more.

The first electrode 75 is arranged on the non-conductive reflective film 91 and provides the first semiconductor layer 30 with either electrons or holes. The second electrode 85 is arranged on the non-conductive reflective film 91, facing the first electrode 75 at a distance therefrom for insulation, and provides the second semiconductor layer 50 with either holes if electrons are provided to the first semiconductor layer, or electrons if holes are provided to the first semiconductor layer.

The blocking plane 35 is formed at the edges of the multiple semiconductor layers 30, 40, 50, and blocks the crack created in the non-conductive reflective film 91 to propagate inwardly, e.g., running along the gap between the first electrode 75 and the second electrode 85. In this embodiment, when the multiple semiconductor layers 30, 40, 50 are seen on the top view, they have a quadrangular shape. The first electrode 75 and the second electrode 85 have a generally quadrangular shape and are arranged such that their edges facing each other. Before a wafer having multiple semiconductor light emitting devices formed thereon is split into individual semiconductor light emitting devices by a separation process including a laser-scribing process or the like, the second semiconductor layer 50 and the active layer 40 may be mesa-etched in order to expose the first semiconductor layer 30 (25; see FIG. 22), which is carried out for distinguishing one device from another device. Further, a groove 32 is formed around the edges of the multiple semiconductor layers 30, 40, 50 by mesa-etching the second semiconductor layer 50 and the active layer 40. Because of this groove 32, an outer wall 37 is formed, and then a lateral face 33 of the outer wall 37 becomes a blocking face due to the height difference of the outer wall 37. It is also possible that the groove 32 should be formed in a peripheral portion of the semiconductor light emitting device, e.g., in a region into which the crack having created in the non-conductive reflective film 91 is easily propagated. As the lateral face 35 of the groove 32 makes it hard to form the non-conductive reflective film 91 in an intended thickness thereon, one thinner than the non-conductive reflective film 91 formed on the second semiconductor layer 50 can be formed on the lateral face 35. Accordingly, the crack cannot easily propagate along the lateral face 35 of the groove 32. Therefore, the lateral face 35 of the groove 32 may also be a blocking plane.

Figure 24:
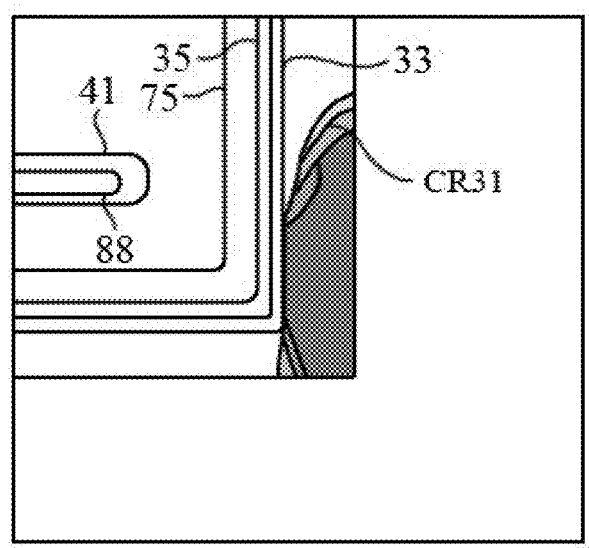
FIG. 24 shows an example of blocking crack propagation by a blocking face.

FIG. 24 shows an example of blocking crack propagation by a blocking face, in which the non-conductive reflective film 91 is formed over the multiple semiconductor layers 30, 40, 50, the groove 32 and the exposed portion 25 (see FIG. 22). When this exposed portion 25 is subjected to scribing (SCL10) to obtain separate, individual devices, a crack is created in the non-conductive reflective film 91 in the exposed portion 25, possibly propagating up to the non-conductive reflective film 91 on the multiple semiconductor layers 30, 40, 50, which is likely to adversely affect the outer appearance and light extraction efficiency of a light emitting device. In this embodiment, crack propagation is primarily blocked because of the height difference by the lateral face 33 (blocking face) of the outer wall 37. Although most of the crack would be blocked by the blocking face 33, a part of the crack can still run over the outer wall 37. The crack is then arrested again by the blocking face 35, thereby ensuring no inward crack propagation. In short, the height difference by the blocking faces 33, 35, together with the presence of the relatively thinner non-conductive reflective film 91 on the blocking faces 33, 35, can make it difficult for the crack to propagate over the multiple semiconductor layers 30, 40, 50. In this manner, any defect due to the propagation of a crack can be prevented.

The first finger electrode 78 is arranged on an exposed portion of the first semiconductor layer 30 by mesa-etching the second semiconductor layer 50 and the active layer 40, and connected with the first electrode 75 by an electrical connection 72 which is extended and passes through the non-conductive reflective film 91. The second finger electrode 88 is arranged on the current spreading conductive film 60, and connected with the second electrode 88 by an electrical connection 82 which is extended and passes through the non-conductive reflective film 91. The first finger electrode 78 is stretched below the second electrode 85 from below the first electrode 75, and the second finger electrode is stretched below the first electrode 75 from below the second electrode 85. The finger electrodes may have a different configuration. For example, according to an exemplary embodiment, island-type pads may be provided instead of band type finger electrodes.

The first electrode 75 and the second electrode 85 can be deposited on the non-conductive reflective film 91 by using sputtering equipment, E-beam equipment or the like. The first electrode 75 and the second electrode 85 are arranged to face each other. The first electrode 75 and the second electrode 85 may be electrically connected to an electrode available outside (package, COB, sub-mount etc.) by techniques including stud bump bonding, conductive paste application, eutectic bonding, soldering or the like. In case of eutectic bonding, it is essential that the first electrode 75 and the second electrode 85 do not have a considerable height difference. In the semiconductor light emitting device according to this embodiment, the first electrode 75 and the second electrode 85 may be formed on the non-conductive reflective film 91 by one, identical process, such that there is hardly any height difference between the electrodes. Hence, this embodiment is also advantageous in case of eutectic bonding. When the semiconductor light emitting device is electrically connected to the outside by eutectic bonding, the top of the first electrode 75 and of the second electrode 85 can be made of a eutectic bonding material including an Au/Sn alloy, an Au/Sn/Cu alloy or the like, for example.

In another exemplary embodiment, the first electrode 75 and the second electrode 85 may be electrically connected to the outside by soldering. In this case, the first electrode 75 and the second electrode 85 may include a stack of the reflective layer/the anti-diffusion layer/the soldering layer in order. For example, the reflective layer is made of Ag, Al or the like, and a contact layer (e.g., Ti, Cr) can be added beneath the reflective layer. The anti-diffusion layer can be made of at least one selected from Ni, Ti, Cr, W and TiW. The soldering layer can be made of Au, or Sn (soldering layer)/Au (anti-oxidation layer), or Sn only without Au, or thermally treated Sn. A lead-free solder can be used as the solder.

Although the propagation of a crack or other damage inwardly from the edge of the non-conductive reflective film may occur due to thermal shock, friction or the like in a subsequent process such as a process for bonding the first and second electrodes to the outside as described above, it can be arrested by the blocking plane available in the semiconductor light emitting device according to this embodiment.

Meanwhile, a light emitting device according to another exemplary embodiment different from the present embodiment does not include the finger electrodes, but it includes an island-type first lower electrode formed on an exposed portion of the first semiconductor layer by mesa-etching; an island-type second lower electrode formed on the second semiconductor layer; multiple openings formed in the non-conductive reflective film, in correspondence with the lower electrodes; a p-side connecting electrode and an n-side connecting electrode adapted to connect the multiple openings over the non-conductive reflective film; a passivation film adapted to cover the connecting electrodes; a first electrode arranged on the passivation film, being connected with the n-side connecting electrode; and a second electrode connected with the p-side connecting electrode.

Figure 25:
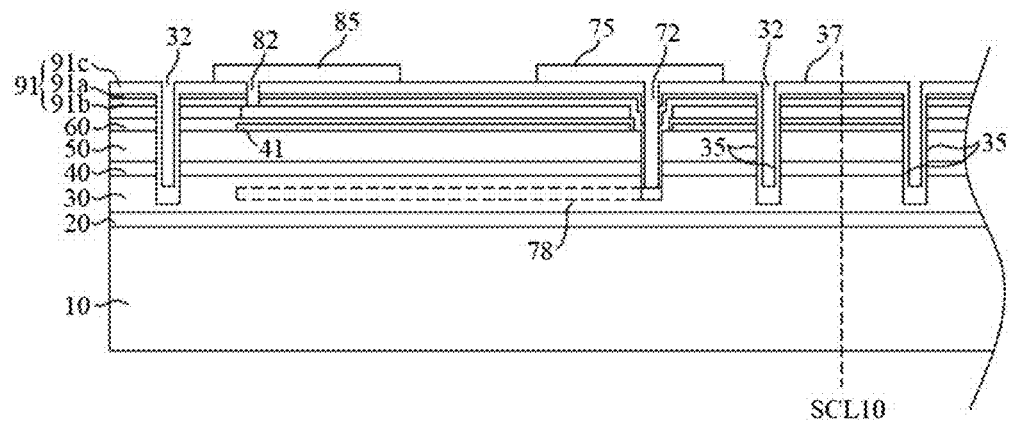
FIG. 25 shows yet another exemplary embodiment of a semiconductor light emitting device according to the present disclosure.

FIG. 25 shows yet another exemplary embodiment of a semiconductor light emitting device according to the present disclosure, in which a groove 32 is formed at at least a part of the edges of the multiple semiconductor layers, and lateral faces 32 of the groove becomes the blocking faces 35. An outer wall 37 is then formed due to this groove, and lateral faces 35 of the groove 32 are also lateral faces of the outer wall 37. For this embodiment, there is no mesa-etching process performed on the second semiconductor layer 50 and the active layer 40 among the multiple semiconductor light emitting devices for exposing the first semiconductor layer 30 (25; see FIG. 22), where the process is usually carried out prior to a separation process including a laser-scribing process or the like for obtaining separate individual semiconductor light emitting devices. Instead, a cutting process may be carried out on the multiples semiconductor layers and the substrate. This has an advantage that a light emission region in the corresponding semiconductor light emitting device increases. In order to obtain separate individual semiconductor light emitting devices, a lateral face of the growth substrate 10 and an outer lateral face of the outer wall 37 become cutting sides. When the cutting process is carried out along a cutting line SCL10, a crack may be created in the non-conductive reflective film 91 formed on the outer wall 37, but the propagation of the crack is blocked by the inner face of the outer wall 37 and/or the lateral face 35 of the groove.

Figure 26:
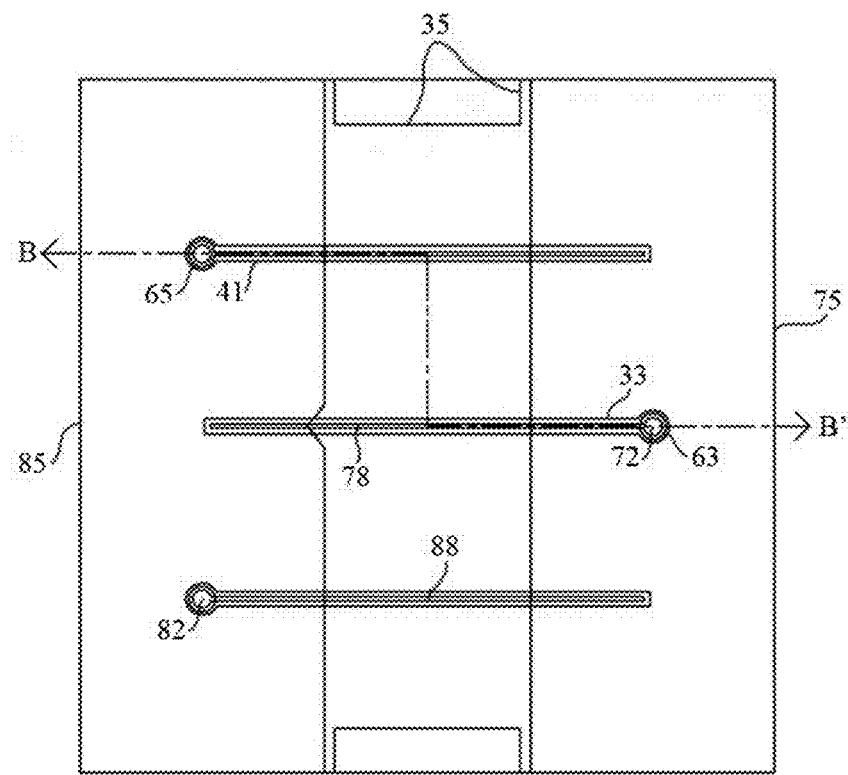
FIG. 26 shows yet another exemplary embodiment of a semiconductor light emitting device according to the present disclosure.
Figure 27:
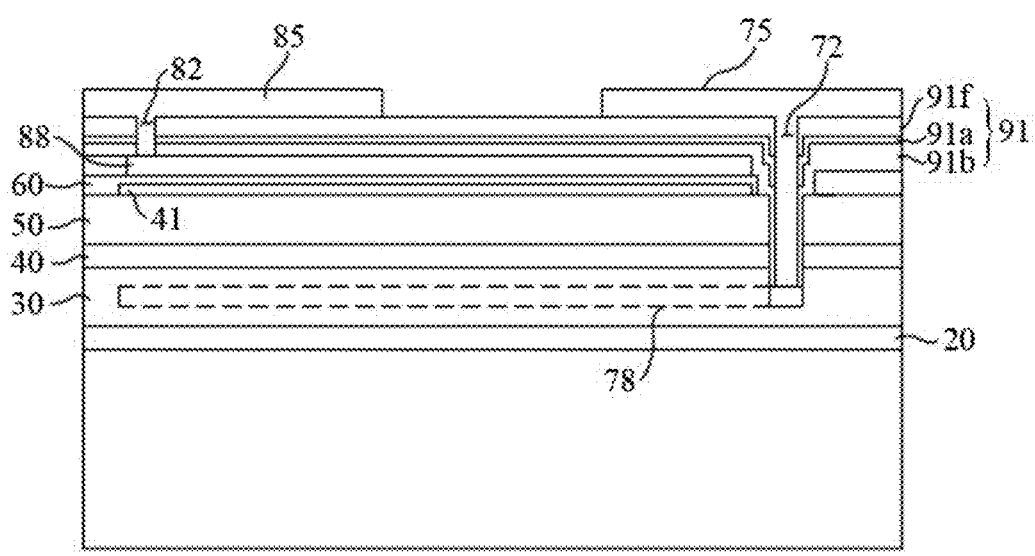
FIG. 27 shows an exemplary cutaway view taken along line B-B in FIG. 26.

FIG. 26 shows yet another exemplary embodiment of a semiconductor light emitting device according to the present disclosure, and FIG. 27 shows an exemplary cutaway view taken along line B-B in FIG. 26.

In this embodiment, the first electrode 75 and the second electrode 85 are arranged to face each other on the non-conductive reflective film 91 for insulation, while keeping a distance or gap between them. The blocking faces 35 are formed at the edges of the multiple semiconductor layers 30, 40, 50, in correspondence with the gap, such that they arrest the propagation of a crack created in the non-conductive reflective film 91 along the gap. For example, sides of a groove formed in the lateral faces of the multiple semiconductor layers 30, 40, 50 become blocking faces 35.

When a wafer having multiple semiconductor light emitting devices formed thereon is split into individual semiconductor light emitting devices, a crack can be created in the non-conductive reflective film 91, and the crack is more likely to propagate to the non-conductive reflective film 91 particularly in a region (gap) between the first electrode 75 and the second electrode 85, rather than in a region covered by the first electrode 75 and the second electrode 85. In this embodiment, the blocking face 35 is formed at the edge of the gap between the first electrode 75 and the second electrode 85, so as to block the propagation of the crack. The blocking face 35 may be formed by partially etching the multiple semiconductor layers 30, 40, 50. For example, it can be formed by mesa-etching the second semiconductor layer 50 and the active layer 40. In this way, the barrier face 35 is open in the lateral direction of the semiconductor light emitting device. The blocking face 35 is formed in a certain width and length at the edge of the gap between the first electrode 75 and the second electrode 85. In this embodiment, it is formed near the second finger electrode 88.

Although the non-conductive reflective film 91 is non-conductive and reflective, when the first electrode 75 and the second electrode 85 come into contact with the non-conductive reflective film 91, a portion of the light can be reflected from their contact surface, and another portion of the light can be absorbed and lost in the first electrode 75 and the second electrode 85. Therefore, in terms of improving brightness, it is desirable hat the first electrode 75 and the second electrode 85 each have a smaller area. Meanwhile, in terms of thermal conductivity for heat emission, it is desirable that the first electrode 75 and the second electrode 85 each have a larger area. As such, in view of heat emission, the gap between the edge 77 of the first electrode 75 and the edge 87 of the second electrode 85 can be increased within a certain limit.

The first electrode 75 and the second electrode 85 in this embodiment are formed in a manner that they reach the edge of the top surface of the non-conductive reflective film 91 as well as the blocking face 35 side, thereby providing an advantageous structure for ensuring a heat emission area. Hence, in view of improving brightness, the gap between the first electrode 75 and the second electrode 85 may increase without necessarily reducing the heat emission region, and a sufficient gap area can be ensured for electrical insulation when the first and second electrodes 75, 85 of the semiconductor light emitting device are bonded to an external electrode.

Moreover, an area at the edge of the semiconductor light emitting device targeted for mesa-etching is limited to a portion (e.g., a portion in correspondence with the first finger electrode 78) including the blocking face 35 side. As a result, a light emission area is increased, as compared with a light emitting device having a reduced light emitting face by mesa-etching the entire edges of the semiconductor light emitting device for obtaining separate individual devices. Once the light emission region is made larger, and the first and second electrodes 75, 85 reach the edge of the non-conductive reflective film 91, the scribing and/or breaking process can be proceeded to obtain separate individual devices. Since the non-conductive reflective film 91 itself is cut, the blocking face 35 should be provided, especially for preventing the propagation of a crack. In order to form the blocking face 35, the non-conductive reflective film 91 covers an exposed portion of the first semiconductor layer 30 by etching a part of the multiple semiconductor layers 30, 40, 50, in correspondence with the gap. If seen from the blocking face 35 side, there is a height difference between the non-conductive reflective film 91 covering the exposed first semiconductor layer and the non-conductive reflective film 91 covering the current spreading conductive film 60 on the second semiconductor layer 50. A crack created at the edge cannot be propagated to the non-conductive reflective film 91 on the second semiconductor layer 50 unless it overcomes or rides over the blocking face first, but the aforementioned height difference plays a role in arresting the propagation of the crack. As a result, the semiconductor light emitting device can be produced at a higher yield.

Figure 28:
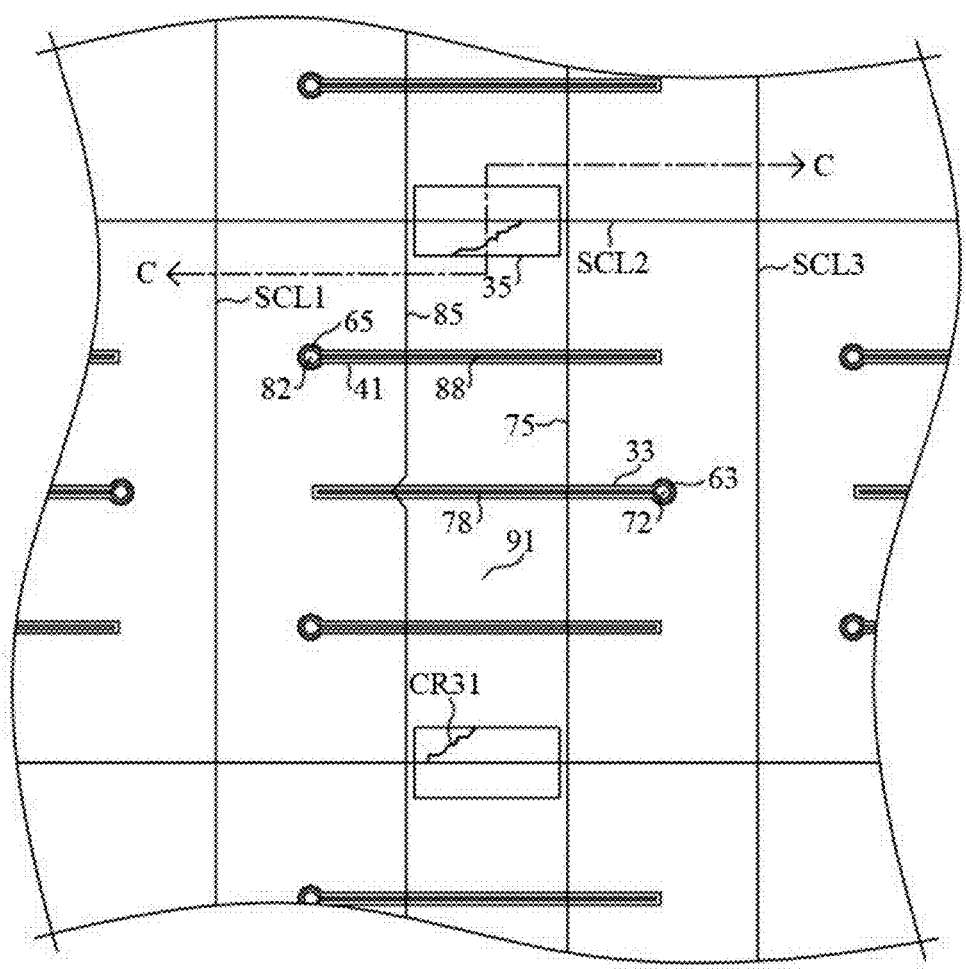
FIG. 28 and FIG. 29 shows exemplary embodiments of a method for manufacturing a semiconductor light emitting device according to the present disclosure.
Figure 29:
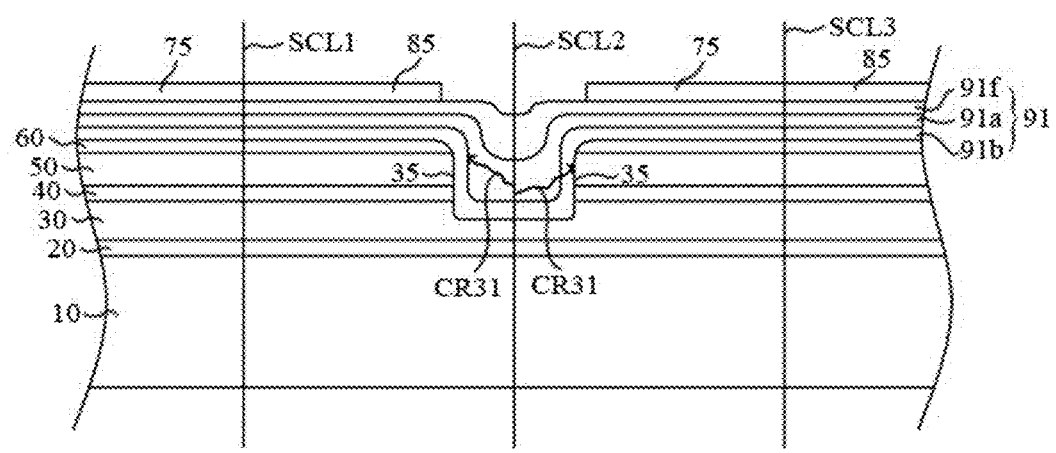

FIG. 28 and FIG. 29 show exemplary embodiments of a method for manufacturing a semiconductor light emitting device according to the present disclosure. In particular, FIG. 29 shows an exemplary cutaway view taken along line C-C in FIG. 28, including scribing lines SCL1, SCL2, SCL3 for splitting a wafer into individual devices.

First of all, multiple semiconductor layers 30, 40, 50 are grown on a substrate 10 (see FIG. 29). The first semiconductor layer 30 portion on which an n-side finger electrode 78 is to be arranged is exposed (a region corresponding to 63 in FIG. 28) by a mesa-etching process. Simultaneously with this process, the second semiconductor layer 50 and the active layer 40 at the edge of the gap between the first electrode 75 and the second electrode 85 (to be described) may be etched together to form a blocking face 35. This etching process for forming the blocking face 35 can be carried out all over the edges, e.g., the boundaries of the multiple semiconductor layers, as shown in FIG. 28. These boundaries will become division lines of the multiple semiconductor light emitting devices. As such, the blocking face 35 with respect to an adjacent semiconductor light emitting device is also formed by the etching process for forming the blocking face 35. The mesa-etching process can be carried out after a light absorption barrier 41 (to be described) is formed, or after a current spreading conductive film 60 (to be described) is formed.

The light absorption barrier 41 is then formed on the second semiconductor layer 50. The light absorption barrier 41 may be arranged in correspondence with the p-side finger electrode 88. Omitting the light absorption barrier 41 might as well be considered. Next, the current spreading conductive film 60 adapted to cover the light absorption barrier 41 is formed on the second semiconductor layer 50. The current spreading conductive film 60 may be made of a light-transmitting conductor (e.g., ITO) for reducing light absorption. Although the current spreading conductive film 60 may optionally be omitted, it is usually included to allow current spreading to the second semiconductor layer 50.

The p-side finger electrode 88 is formed on the current spreading conductive film 60, and simultaneously or in a separate process, the n-side finger electrode 78 is formed on the exposed portion of the first semiconductor layer 30. The p-side finger electrode 88 and the n-side finger electrode 78 may be composed of multiple layers. Next, a non-conductive reflective film 91 is formed. For example, a dielectric film 91b, a DBR 91a and a clad film 91c are arranged in a manner that an etching region for forming the current spreading conductive film 60 and the p-side finger electrode 8, and an etched portion for forming the n-side finger electrode 78 and the blocking face 35 are covered. The dielectric film 91*b* or the clad film 91*c* may be omitted.

The first electrode 75 and the second electrode 85 can be deposited on the non-conductive reflective film 91 using, for example, sputtering equipment, E-beam equipment or the like. While the first electrode 75 and the second electrode 85 are being formed, electrical connections 72, 82 are also formed in openings 63, 65. The electrical connection may be formed such that it comes into contact with the top and side at the end of the finger electrode. In this way, a contact surface is increased, and a stable electrical connection is thus established.

In a wafer state, the first electrodes 75 and the second electrodes 85 of adjacent light emitting devices can be formed together collectively. For example, in the wafer state, a metal layer for forming the first electrode 75 and the second electrode 85 can be deposited in a band shape, multiple rows, or a stripe pattern (see FIG. 28).

A separation process for obtaining individual devices is carried out. FIG. 29 shows division lines SRL1, SRL2, SRL3 along which the wafer is split into respective semiconductor light emitting devices. For example, the wafer is cut along the division lines SRL1, SRL2, SRL3 using a process such as breaking, sawing or scribing-and-breaking. A chemical etching process may optionally be included. In particular, in the scribing-and-breaking process, the scribing process uses a cutter or a laser which can be focused onto the substrate 10, including the surface and inside of the substrate 10, of the semiconductor light emitting device. In this scribing process using a laser, preliminarily cut semiconductor light emitting devices may be obtained by cutting adjacent semiconductor light emitting devices along the division lines SRL1, SRL1, SRL3. In the breaking process following the scribing process, those preliminarily cut semiconductor light emitting devices can then become completely separated individual semiconductor light emitting devices.

In the wafer state, the blocking faces 35 of adjacent semiconductor light emitting devices are connected to each other, and then the blocking faces 35 of adjacent semiconductor light emitting devices are spaced apart when the separation process for obtaining individual semiconductor light emitting devices is carried out. At the edge where the blocking face 35 is provided after the separation is done, the lateral face of the growth substrate 10, the lateral face of the first semiconductor layer 30 and the lateral face of the non-conductive reflective film 91 may become cutting faces. Moreover, in the wafer state, the first electrodes 75 and the second electrodes 85 of adjacent semiconductor light emitting devices are connected, the first electrodes 75 and the second electrodes 85 of adjacent semiconductor light emitting devices are separated when the separation process for obtaining individual semiconductor light emitting devices is carried out. After the separation is done, the lateral face of the growth substrate 10, the lateral faces of the multiple semiconductor layers 30, 40, 50, the lateral face of the non-conductive reflective film 91, and the lateral faces of the first electrode 75 and second electrode 85 may become cutting faces.

Figure 30:
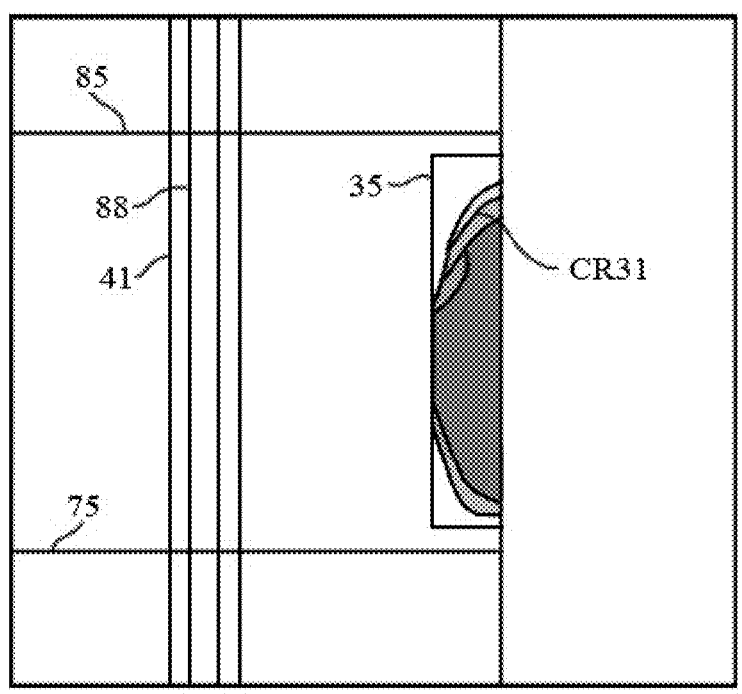
FIG. 30 shows another example of blocking crack propagation by a blocking face.

FIG. 30 shows another example of blocking crack propagation by a blocking face. The breaking process is carried out by applying an external force along the division lines SRL1, SRL2, SRL3, in the direction of the substrate 10 or the opposite direction thereof. Since the substrate 10 and the multiple semiconductor layers 20, 30, 40, 50 are made of crystalline materials, precise cutting along the division lines SRL1, SRL2, SRL3 can be achieved in the breaking process.

However, since the non-conductive reflective film 91 covering up to the edges is made of a non-crystalline material, precise cutting along the division lines SRL1, SRL2, SRL3 is not achieved, and the edge of the non-conductive reflective film 91 is easily damaged, e.g., it is sensitive to cracking CR31. This damage at the edge of the non-conductive reflective film 91 can spread to the light emitting face, namely, inwardly of the semiconductor light emitting device as illustrated in FIG. 19 and FIG. 20, thereby adversely affecting the outer appearance and light extraction efficiency of a light emitting device the outer appearance and yield of the semiconductor light emitting device. In particular, the crack CR31 propagating to the gap between the first electrode 75 and the second electrode 85 can cause a problem. For instance, in this embodiment, there is a height difference at the edge due to the presence of the blocking face 35, as shown in FIG. 29 and FIG. 30. However, considering that it is hard for the crack CR31 to be propagated without overcoming the height difference first, the crack CR31 is usually arrested at the blocking face 35. As a result, the damage at the edge can be substantially reduced. Optionally, it is possible to omit a process for removing a part of the non-conductive reflective film 91 in advance, or an etching process to be carried out among the semiconductor light emitting devices for obtaining separate individual devices, and to obtain separate individual devices by cutting along the division lines SRL1, SRL2, SRL3 through the scribing-and-breaking process. Optionally, it is also possible that the non-conductive reflective film 91 on the side of the blocking face 35 serves as a corner reflector by slanting its cutting face.

Unlike this embodiment, once the multiple semiconductor layers 30, 40, 50 are formed on the substrate 10, they may be subjected to a division process first so as to produce separate individual semiconductor light emitting devices, prior to the conventional semiconductor manufacturing process for forming a light absorption barrier 41, a current spreading conductive film 60 and finger electrodes 78, 88. The division process of a wafer into individual devices may involve etching and removing (25, see FIG. 22) a certain width of the multiple semiconductor layers 30, 40, 50 about the division lines SRL1, SRL2, SRL3.

In this embodiment, however, except the etching region for forming the blocking face 35 about the division lines SRL1, SRL2, SRL3, the multiple semiconductor layers 30, 40, 50 are etched less in order to increase their light emission regions. Further, this embodiment has another advantage in that the division process of a wafer into individual devices can be omitted. As such, an area that is not covered with the first electrode 75 and the second electrode 85 can be increased, and light absorption can be reduced. The crack that is created in the non-conductive reflective film 91 during the division process is kept from propagating onto the gap between the first electrode 75 and the second electrode 85, as shown in FIG. 30, because of the height difference as a result of the formation of the blocking face 35.

Figure 31:
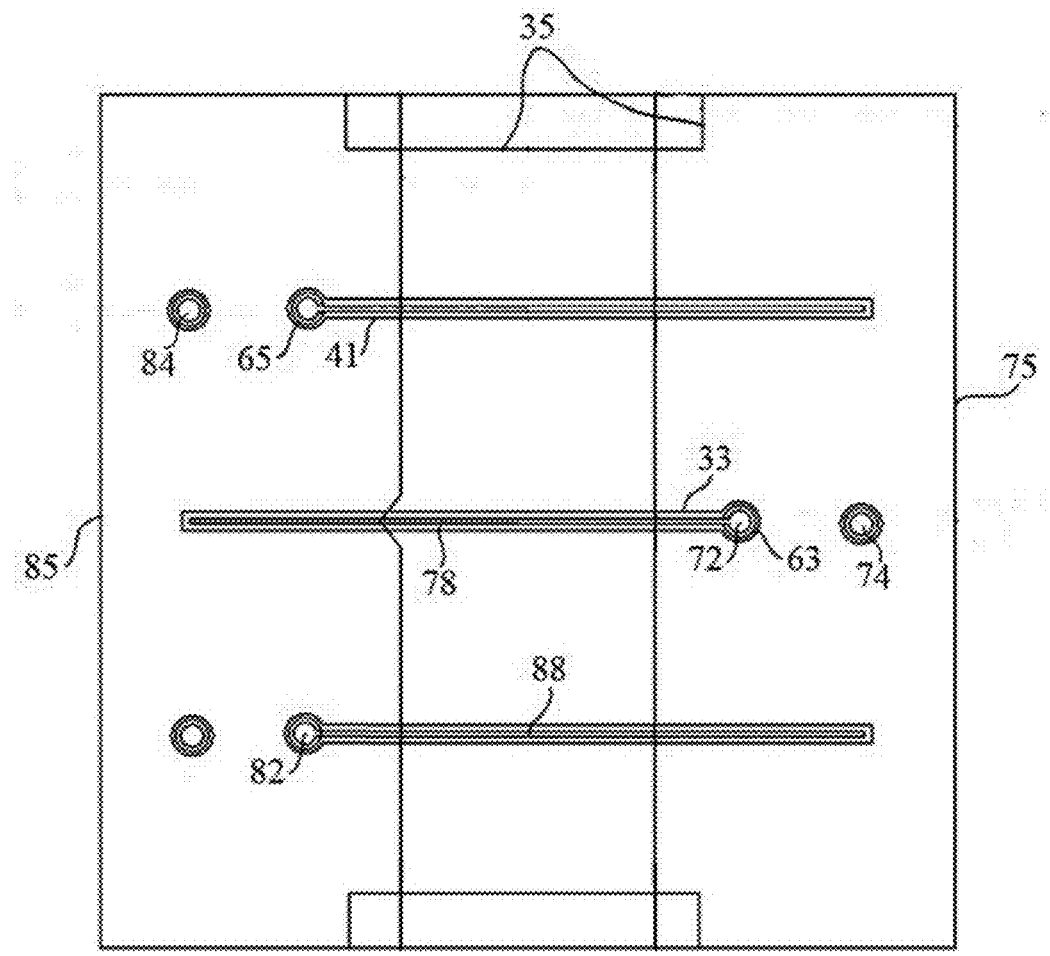
FIG. 31 shows yet another exemplary embodiment of a semiconductor light emitting device according to the present disclosure.

FIG. 31 shows yet another exemplary embodiment of a semiconductor light emitting device according to the present disclosure, in which the blocking face 35 has width and length that can be changed, particularly, based on a gap between the first electrode 75 and the second electrode 85. As illustrated in FIG. 31, a portion of the blocking face 35 can be extended below the first electrode 75 and the second electrode 85. Considering the structure of a semiconductor light emitting device, an additional blocking face may optionally be arranged in a place where cracking occurs frequently.

For a wider light emission face, island-type electrical connects 74, 84 may be formed on the n-side and the p-side, respectively, instead of increasing the length of the finger electrodes.

Figure 32:
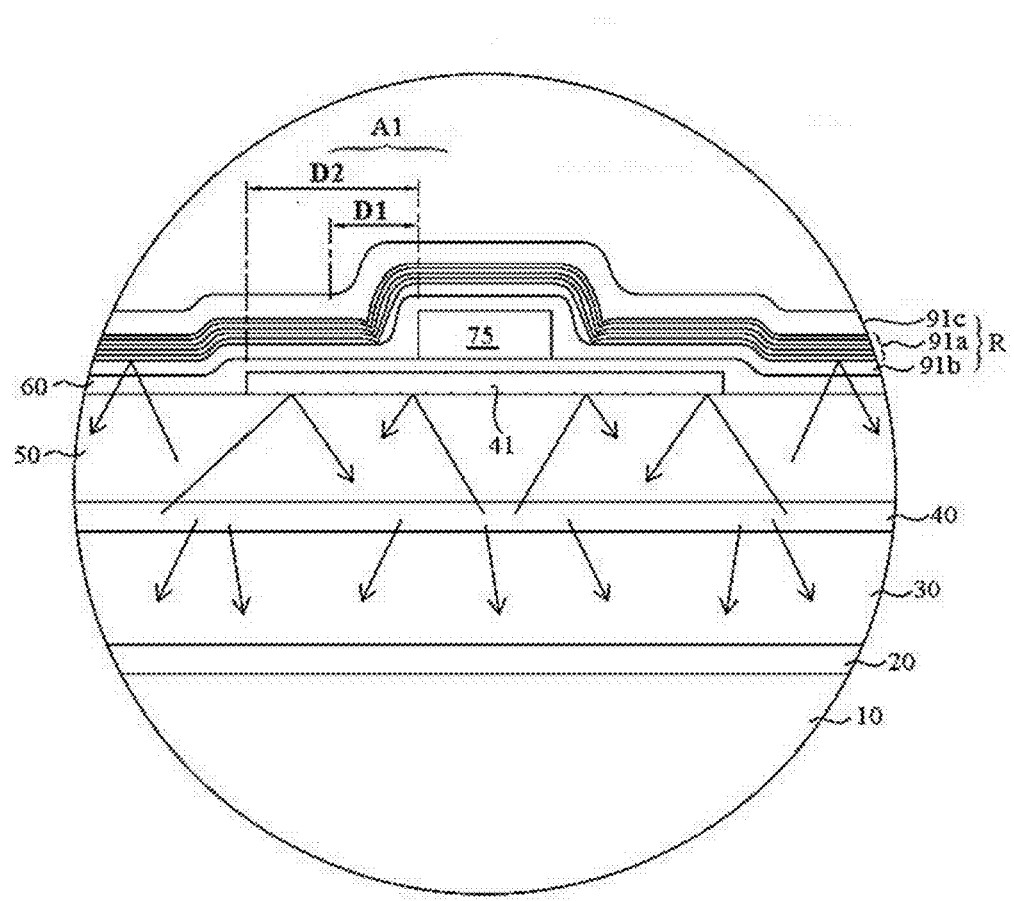
FIG. 32 shows characteristics of a semiconductor light emitting device according to the present disclosure.

FIG. 32 shows characteristics of a semiconductor light emitting device according to the present disclosure, in which the semiconductor light emitting device includes multiple semiconductor layers 30, 40, 50, a light absorption barrier 41, an electrode 75, and a non-conductive reflective film R.

The multiple semiconductor layers 30, 40, 50 include, on a substrate 10, a buffer layer 20, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interposed between the first semiconductor layer 30 and the second semiconductor layer 50 and generates light by electron-hole recombination. Each of the multiple semiconductor layers 30, 40, 50 may have a multilayer structure, and the buffer layer 20 may be omitted.

The electrode 75 is arranged on the multiple semiconductor layers 30, 40, 50, and electrically connected with the multiple semiconductor layers 30, 40, 50. The electrode 75 illustrated in FIG. 32 may have a cross section of an extending-type elongating electrode or a cross section of an island-type electrode. A pad electrode 70, 80 (see FIG. 36, 8) for bonding is arranged on the non-conductive reflective film R, and can be electrically connected with the electrode 75 by an electrical connection that runs through the non-conductive reflective film R.

The semiconductor light emitting device preferably includes a light transmitting conductive film 60 interposed between the second semiconductor layer 50 and the electrode 75 and adapted to cover the second semiconductor layer 50. The light absorption barrier 41 is arranged around at least the electrode 75. The light absorption barrier 41 is formed between the second semiconductor layer 50 and the light transmitting conductive film 60, in correspondence with the electrode 75, and a part of the light absorption barrier 41 is exposed around the electrode 75. The light absorption barrier 41 may only serve to reflect a portion or all of the light generated from the active layer 40, or to block the current flowing directly below the electrode 75 from the electrode 75, or both.

The non-conductive reflective film R is arranged such that it covers the electrode 75 and the light transmitting conductive film 60, and reflects the light from the active layer. Other multiple layers 91a, 91b, 91c will be described later. The non-conductive reflective film R is preferably formed in a multilayer structure, and has at least a light-reflecting side made of a non-conductive material to reduce light absorption by a metal reflective film thereof. In the context herein, the term 'insulating' means that the non-conductive reflective film R is not used as means for electrical conduction, yet it does not mean that the non-conductive reflective film R should be necessarily composed of a non-conductive material only. When the non-conductive reflective film R is formed, a height difference is created because of an uneven structure resulting from the electrode 75 for example, and the layered structure of the non-conductive reflective film R may be distorted, thereby generating an abnormal region A1 having a reduced reflectivity. This will be described in more detail below.

In this embodiment, when seen in the cross-sectional view of the electrode 75, the light absorption barrier 41 is partially exposed from the electrode 75, and can reach around the electrode 75. The length D2 (distance or width) from the lateral face of the electrode 75 to the portion of the light absorption barrier 41 exposed from the electrode 75 is made longer than the length D1 (distance or width) from the lateral face of the electrode 75 in the abnormal region A1 to the portion of the light absorption barrier 41 exposed from the electrode 75 such that less amount of the light entering the abnormal region A1 would leak or be absorbed and lost.

In the semiconductor light emitting device, the light absorption barrier can be applied even when the electrode is provided on an exposed portion of the first semiconductor layer 30 by etching the second semiconductor layer 50 and the active layer 40. In another embodiment, the light absorption barrier can be used for covering the exposed portion of the first semiconductor layer 30 by etching the non-conductive reflective film R. In another embodiment, the light absorption barrier can be formed around the electrode arranged at the first semiconductor layer 30, in correspondence with the abnormal region that is formed at the non-conductive reflective film R because of a height difference created by the aforementioned etching process (see FIG. 39 through FIG. 43).

Figure 33:
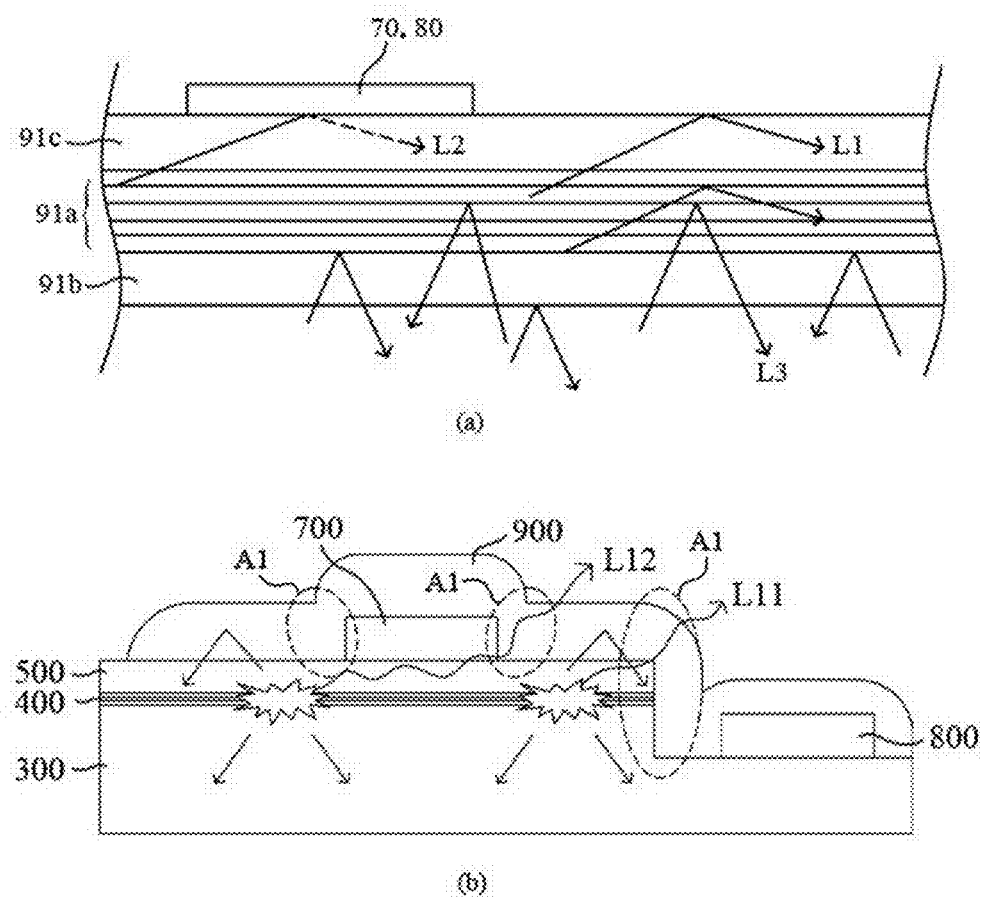
FIG. 33 shows an example of a non-conductive reflective film.

FIG. 33 shows an example of a non-conductive reflective film R, in which the non-conductive reflective film R has a multilayer structure including a DBR (Distributed Bragg Reflector) 91a, an ODR (Omni-Directional Reflector) or the like.

When the non-conductive reflective film R is formed, a height difference is created by an uneven structure resulting from the electrode 75 for example. As the deposition of the DBR 91a needs to be done with high precision, the dielectric film 91b of a certain thickness may be formed before the deposition such that the DBR 91a can be prepared in a stable manner, and light reflection can also benefit therefrom. As illustrated in FIG. 33a, the non-conductive reflective film R can include a clad film 91c on the DBR 91a, for the connection or relation with a pad electrode 70, 80 formed on the non-conductive reflective film R and for an optical waveguide.

Preferably, the dielectric film 91b is made of a suitable material like $SiO_2$, and has a thickness of 0.2 μm-1.0 μm. If the dielectric film 91b is too thin, it may not be able to sufficiently cover the electrode which has a height of 2 to 3 μm; while if the dielectric film 91b is too thick, it may make it difficult to form an opening in the non-conductive reflective film 91. The dielectric film 91b may have a thickness greater than the DBR 91a that follows. In addition, the dielectric film 91b needs to be formed with a suitable method for ensuring the reliability of the device. For example, the dielectric film 91 made of $SiO_2$ is preferably formed by CVD (Chemical Vapor Deposition), and more particularly by PECVD (Plasma Enhanced CVD). This is because CVD is more advantageous than PVD (Physical Vapor Deposition) such as E-Beam evaporation, in terms of achieving improved step coverage. More specifically, if the dielectric layer 91b is formed by E-Beam evaporation, it is difficult to form the dielectric film 91b in the intended thickness in a region having the height difference, the reflectivity of the DBR 91a may be lowered, and the electrical insulation may be deteriorated. As such, the dielectric film 91b is preferably formed by CVD for reducing the height difference and ensuring the insulation effect. In this way, it is possible to ensure the reliability of the resulting semiconductor light emitting device and to ensure the functions of the dielectric film as a reflective film.

The DBR 91a is formed on the dielectric film 91b. For example, the DBR may be composed of a stack of alternating $SiO_2$ and $TiO_2$ pairs. In addition, the DBR 91$a$ can be composed of a combination of a higher refractive index material such as $Ta_2O_5$, HfO, ZrO, SiN or the like and a lower refractive index dielectric thin film (typically, $SiO_2$). For example, the DBR 95$a$ may be composed of a stack of alternating $SiO_2/TiO_2$, $SiO_2/Ta_2O_2$, or $SiO_2/HfO$ pairs, as $SiO_2/TiO_2$ demonstrates a high blue-light reflection efficiency, and $SiO_2/Ta_2O_2$ or $SiO_2/HfO$ demonstrates a high UV-ray reflection efficiency. If the DBR 91$a$ is composed of a stack of alternating $TiO_2/SiO_2$ pairs, it should preferably undergo an optimization process in consideration of an angle of incidence as well as wavelength-dependent reflectivity, using a ¼ optical thickness of the wavelength of the light emitted from the active layer 40 as a reference, yet it is not absolutely required that each layer should have a ¼ optical thickness of the wavelength. The number of pairs in the stack is suitably between 4 and 40 pairs. If the DBR 91$a$ is composed of a stack of alternating $SiO_2/TiO_2$ pairs, the DBR 91$a$ is preferably formed by PVD (Physical Vapor Deposition), and more particularly, E-Beam evaporation, sputtering or thermal evaporation.

The clad film 91$c$ may be made of a metal oxide such as $Al_2O_3$, a dielectric film such as $SiO_2$ or SiON, or other material such as MaF or CaF. Preferably, the clad film 91$c$ has a thickness ranging from $\lambda/4n$ to 3.0 μm, in which $\lambda$ denotes a wavelength of the light generated from the active layer 40, and n denotes a refractive index of a material composing the clad film 91$c$. If $\lambda$ is 450 nm (4500 Å), the clad film 91$c$ can be formed in a thickness of 771 Å (4500/4×1.46=771 Å) or more.

In the DBR 91$a$ composed of multiple pairs of $SiO_2/TiO_2$, while the top layer of the DBR 91$a$ can be $TiO_2$, it may optionally made of a $SiO_2$ layer having a thickness of $\lambda/4n$. In this regard, it is desirable that the clad film 91$c$ is thicker than $\lambda/4n$ to be distinguished from the top layer of the DBR 91$a$ that is placed below the clad film 91$c$. However, it is not desirable that the clad film 91$c$ is too thick, e.g., 3 μm or more, because it imposes a burden on the subsequent perforation process and only increases the material cost without contributing to the improvement of the efficiency. Therefore, a maximum value of the thickness of the clad film 91$c$ falls within the range of 1 to 3 μm, not to impose any burden on the subsequent processes. Nevertheless, it is not impossible, depending on the case, to make the top layer as thick as 3.0 μm or more.

The DBR 91$a$ preferably has a higher effective refractive index than the dielectric film 91$b$ for light reflection and guidance. If the DBR 91$a$ and the pad electrode (e.g., 70, 80; see FIG. 34 and FIG. 6) come in direct contact with each other, a portion of the light travelling through the DBR 91$a$ may be absorbed by the pad electrode 70, 80. This light absorption by the pad electrode 70, 80 (see FIG. 38) can be substantially reduced by incorporating the clad film 91$c$ having a lower refractive index than the DBR 91$a$. With these refractive indices thus selected, the dielectric film 91$b$-DBR 91$a$-clad film 91$c$ can be explained in view of an optical waveguide. The optical waveguide is a structure that encloses a propagation part of light by a material having a lower refractive index than the propagation part of light and directs the light by total reflection. In this regard, if the DBR 91$a$ can be taken as the propagation part, the dielectric film 91$b$ and the clad film 91$c$ can be taken as part of the structure that enclose the propagation part.

For example, if the DBR 91$a$ is made of a light transmitting material (e.g., $SiO_2/TiO_2$) to prevent light absorption, the dielectric film 91$b$ may be made of a dielectric material (e.g., $SiO_2$) having a lower effective refractive index than the DBR (91$a$). Here, the effective refractive index means an equivalent refractive index of light that can travel in a waveguide made of materials having different refractive indices. The clad film 91$c$ may also be made of a material having a lower effective refractive index than the DBR (91$a$) (e.g., $Al_2O_3$, $SiO_2$, SiON, MgF, CaF). If the DBR 91$a$ is composed of $SiO_2/TiO_2$, with $SiO_2$ having a refractive index of 1.46 and $TiO_2$ having a refractive index of 2.4, an effective refractive index of the DBR 91$a$ has a value between 1.46 and 2.4. Accordingly, the dielectric film 91$b$ can be composed of $SiO_2$, and a suitable thickness for it would be between 0.2 and 1.0 μm. Further, the clad film 91$c$ may also be composed of $SiO_2$ having a refractive index of 1.46 which is lower than the effective refractive index of the DBR 91$a$.

Although not desirable from the perspective of the optical waveguide, if the overall technical ideas of this disclosure would be taken into consideration, it is an option to omit the dielectric film 91$b$ from the perspective of the technical ideas of the present disclosure, yet there is no reason to exclude the configuration composed of the DBR 91$a$ and the clad film 91$c$. Alternatively, a $TiO_2$ dielectric film may be used in place of the DBR 91$a$. Further, as an alternative, the clad film 91$c$ may be omitted if the DBR 91$a$ includes a $SiO_2$ layer on the top thereof. Moreover, if the dielectric film 91$b$ and the DBR 91$a$ are designed in consideration of the reflectivity of light that travels substantially in the horizontal direction, again, the clad film 91$c$ may be omitted even when the DBR 91$a$ has a $TiO_2$ layer as its top layer.

In short, the dielectric film 91$b$, the DBR 91$a$ and the clad film 91$c$ which constitute the non-conductive reflective film R serve as an optical waveguide, and their combined thickness is preferably 1 to 8 μm.

As illustrate in FIG. 33$a$, the pad electrode 70, 80 or the non-conductive reflective film R reflects even some lights L1, L2 entering at an angle, yet the DBR 91$a$ having a higher reflectivity for light entering nearly in the normal direction reflects approximately 99% or more of such lights. If an ODR is used for the non-conductive reflective film R, light entering in any direction can be reflected well.

Referring to FIG. 33$b$, for a multilayer structure including a DBR and an ODR for example to be able to function as a reflective film, each material layer must have a specific thickness as intended. However, because of the structures (e.g., electrodes 700, 800, a height difference caused by etching the semiconductor layers) below the non-conductive reflective film R, certain regions of the non-conductive reflective film R have a height difference (indicated by dashed lines). In these regions having a height difference, each material layer may not be formed in an intended thickness, or each layer may break without overcoming the height difference, or a region with a distorted shape (abnormal region; A1; see FIG. 32) may be created. As a result, the reflectivity may be decreased in the abnormal region A1, and light L11, L12 may leak or an absorption loss of the light may be increased therein.

As illustrated in FIG. 32, when seen in the cross-sectional view of the electrode 75, the light absorption barrier 41 is partially exposed from the electrode 75, and can reach around the electrode 75. The length D2 (distance or width) from the lateral face of the electrode 75 to the portion of the light absorption barrier 41 exposed from the electrode 75 is made longer than the length D1 (distance or width) from the lateral face of the electrode 75 in the abnormal region A1 to the portion of the light absorption barrier 41 exposed from the electrode 75 such that less amount of the light entering the abnormal region A1 would leak or be absorbed and lost.

In the semiconductor light emitting device according to the present disclosure, the light absorption barrier 41 may only serve to reflect a portion or all of the light generated from the active layer 40, or to block the current flowing directly below the electrode 75 from the electrode 75, or both, as described above. Therefore, as the light absorption barrier 41 reflects light that travels towards the abnormal region A1, light loss can be reduced. Meanwhile, as the light absorption barrier 41 inhibits current flowing directly down into the active layer 40 beneath the abnormal region A1, the active layer 40 beneath the abnormal region A1 is likely to generate less amount of light. In this case, an amount of light travelling towards the abnormal region A1 will also be reduced, and the loss of light can consequently be reduced.

For these functions, the light absorption barrier 41 may be composed of a single layer (e.g., $SiO_2$) or multiple layers (e.g., $SiO_2/TiO_2/SiO_2$) made of a light transmitting material with a lower refractive index than the second semiconductor layer 50 (e.g., a p-type semiconductor layer); a DBR; or a combination of the single layer and the DBR. The light absorption barrier 41 suitably has a thickness of 0.01 to 1.0 µm, depending on a given structure. If the light absorption barrier 41 is too thin, it will not function properly; while if the light absorption barrier 41 is too thick, it will be difficult to deposit the light transmitting conductive film 60 on the light absorption barrier 41. The light absorption barrier 41 should not necessarily be made of a non-conductive material, yet a dielectric material can be useful in that it can more effectively inhibit current flowing directly under the electrode 75.

Figure 34:
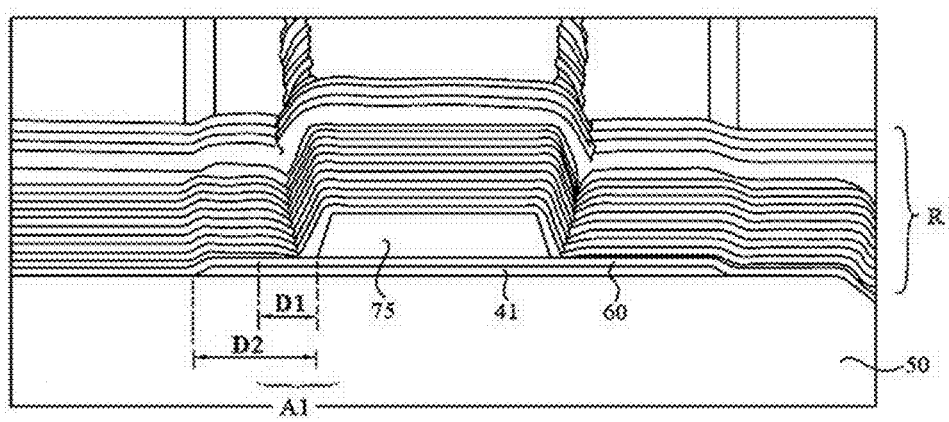
FIG. 34 shows an example of a light absorption barrier.

FIG. 34 shows an example of the light absorption barrier 41, in which the cross-section of the electrode 75 and the non-conductive reflective film R are depicted. In this example, the light absorption barrier 41 has a wedge shape, and the lateral faces of the electrode 75 are slanted with respect to the light absorption barrier 41. As described above, the light absorption barrier 41 has a non-negligible thickness as compared with the thickness of each layer of the non-conductive reflective film R. Therefore, the light absorption barrier 41 preferably has a wedge-shape end as illustrated in FIG. 34, rather than a vertically stepped face at the end or edge, and this is advantageous for inhibiting the creation of the abnormal region A1. Likewise, as the electrode 75 has slanted lateral faces rather than vertical faces, the formation of multiple layers may be done more smoothly along the outline of the electrode 75 when the non-conductive reflective film R is formed, which in turn may be advantageous for inhibiting the creation of the abnormal region A1 or reducing its length.

Although it would be better to increase the length of the light absorption barrier 41 from the stepped face (e.g. the lateral face of the electrode 75) in order to block light entering the abnormal region A1, it is not desirable that the length of the light absorption barrier 41 is excessively long because this would reduce current supply to the active layer 40.

Figure 35:
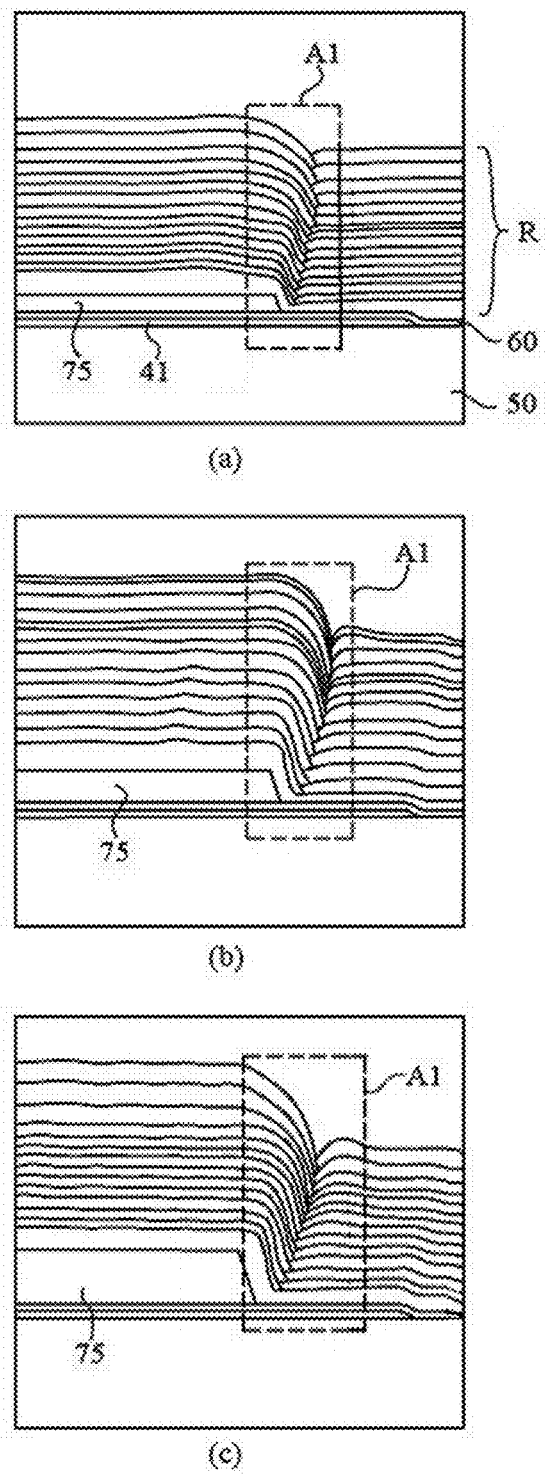
FIG. 35 shows experimental results of a relationship among the height of an electrode, an abnormal region and a light absorption barrier.

FIG. 35 shows experimental results of a relationship among the height of the electrode 75, the abnormal region A1 and the light absorption barrier 41. As illustrated, the abnormal region A1 is affected more by a height difference due to the electrode 75 or a thickness of the electrode 75, not by a thickness of the non-conductive reflective film R itself. The length D1 of the abnormal region A1 is related to the height difference (e.g., the height of the electrode 75 illustrated in FIG. 35). For example, FIG. 35a, FIG. 35b and FIG. 35c sequentially show the results of increasing the height (thickness) of the electrode 75 and forming the non-conductive reflective film R. As the height of the electrode 75 increases, the layered structure in the abnormal region A1 is distorted more. For example, if the thickness of the electrode 75 is changed to 1.0 µm, 1.5 µm, 2.0 µm, 2.5 µm and 3.0 µm for example, the length D1 of the abnormal region A1 will range from 0.2 to 2.0 µm, according to the experiment result. Therefore, if the height difference due to the electrode 75 turns out to be 0.5 to 3.0 µm, the length D2 of the light absorption barrier 41 from the lateral face of the electrode 75 is suitably from 2.0 to 10 µm, which is longer than the length D1 of the abnormal region A1. If D1 is 10 µm or more, it may be necessary to consider a possible increase in the operating voltage Vf and a possible decrease in the brightness due to a reduced active layer that normally generates light. It is essential to have D1 equal to or longer than D1, and preferably the length D1 is suitably determined based on D1.

Figure 36:
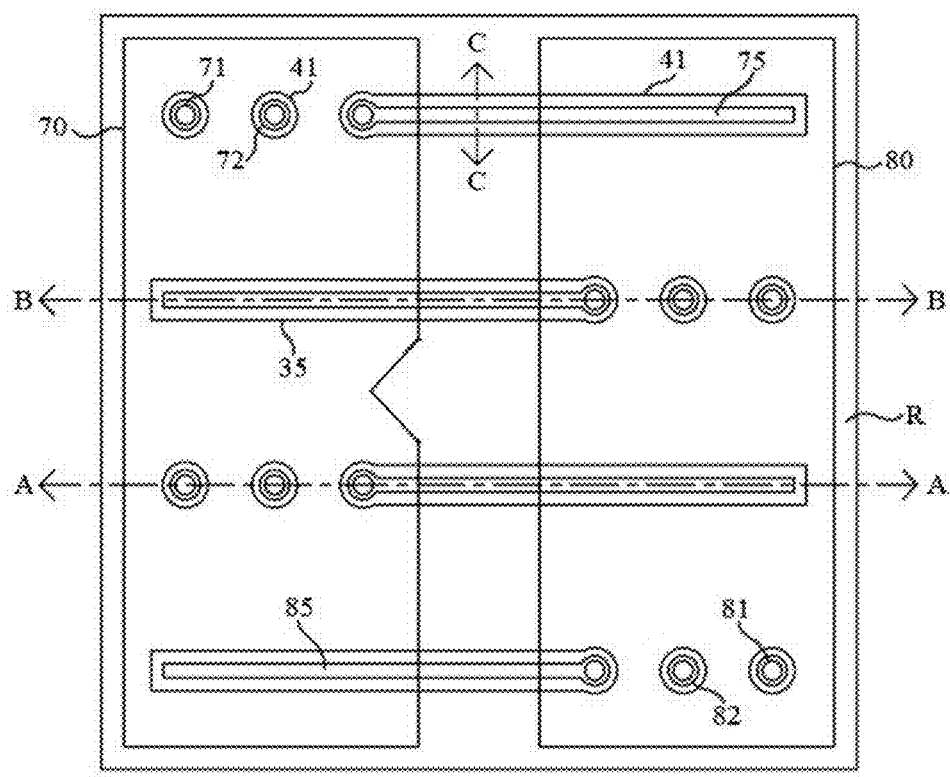
FIG. 36 shows yet another exemplary embodiment of a semiconductor light emitting device according to the present disclosure.
Figure 37:
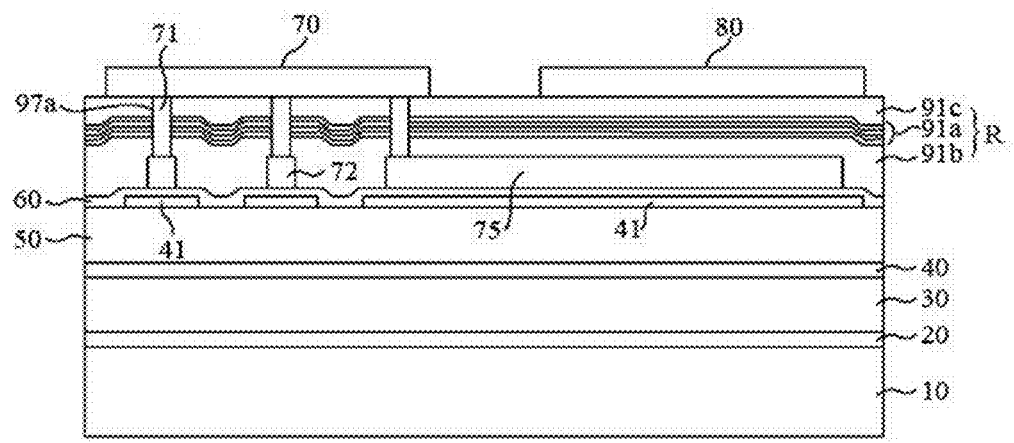
FIG. 37 shows an exemplary cutaway view taken along line A-A in FIG. 36.
Figure 38:
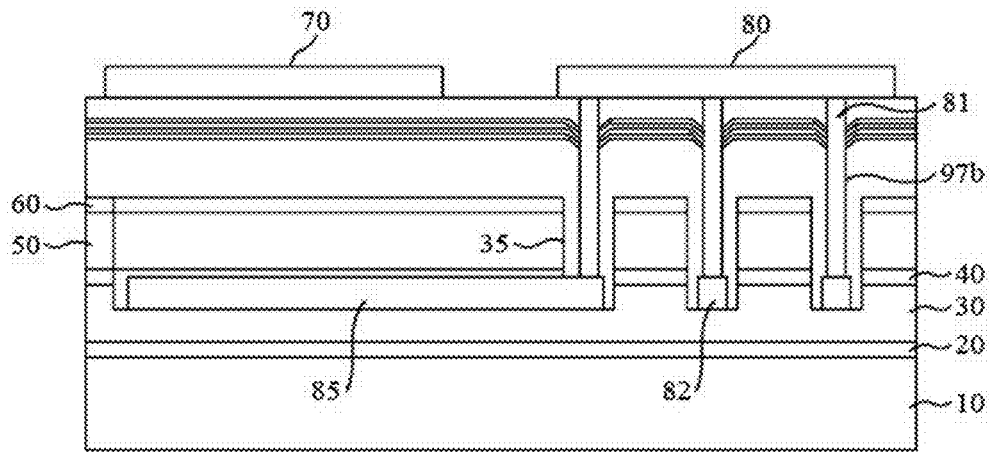
FIG. 38 shows an exemplary cutaway view taken along line B-B in FIG. 36.

FIG. 36 shows yet another exemplary embodiment of a semiconductor light emitting device according to the present disclosure, FIG. 37 shows an exemplary cutaway view taken along line A-A in FIG. 36, and FIG. 38 shows an exemplary cutaway view taken along line B-B in FIG. 36.

The semiconductor light emitting device includes a substrate 10, multiple semiconductor layers 30, 40, 50, a light absorption barrier 41, a light transmitting conductive film 60, a first electrode 82, 85, a second electrode 72, 75, a non-conductive reflective film R, a first pad electrode 80, a second pad electrode 70, a first electrical connection 81, and a second electrical connection 71. The following describes a Group III-nitride semiconductor light emitting device as an example.

The substrate 10, which may eventually be removed, is typically made of sapphire, SiC, Si, GaN or the like. When the substrate 10 is removed or has conductivity, an electrode may be formed on the first semiconductor layer 30 side after the substrate 10 is removed therefrom, or on the conductive substrate 10 side. The first semiconductor layer 30 and the second semiconductor layer 50 can exchange their positions, and these semiconductor layers are typically made of GaN in the case of Group III-nitride semiconductor light emitting devices.

The multiple semiconductor layers 30, 40, 50 include a buffer layer 20, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interposed between the first semiconductor layer 30 and the second semiconductor layer 50 and generates light by electron-hole recombination. Each of the multiple semiconductor layers 30, 40, 50 may have a multilayer structure, and the buffer layer 20 may be omitted. A part of the multiple semiconductor layers 30, 40, 50 is mesa etched to expose a portion of the first semiconductor layer 30.

The light absorption barrier 41 is formed on the second semiconductor layer 50, in correspondence with the second electrode 72, 75. FIG. 32 can be an example of the cutaway view taken along line C-C. It is preferable that the light transmitting conductive film 60 is present. The light transmitting conductive film 60 can be formed between the light absorption barrier 41 and the second finger electrode 72, 75 in such a manner that it transmits light and covers almost the entire second semiconductor layer 50. Optionally, it can be formed on only a portion of the second semiconductor layer 50. In particular, considering that a p-type GaN has a poor current spreading capability, a p-type semiconductor layer 50 made of GaN usually needs a help from the light transmitting conductive film 60. For instance, a material such as ITO, Ni/Au or the like can be used for the light transmitting conductive film 60.

The first electrode 82, 85 is arranged on an exposed portion of the first semiconductor layer 30 by mesa-etching the second semiconductor layer 50 and the active layer 40. The second electrode 72, 75 is formed on the light transmitting conductive film 60, in correspondence with the light absorption barrier 41, and it is electrically connected to the second semiconductor layer 50. In this embodiment, the electrode includes an island-type electrode 72, 82, and an extending-type electrode 75, 85 (finger electrode). Alternatively, the electrode may have a different configuration, and it may be an island-type electrode only or an extending-type electrode only. In this embodiment, the first extending-type electrode 85 is stretched below the second pad electrode 70 from below the first pad electrode 80, and the second extending-type electrode 75 is stretched below the first pad electrode 80 from below the second pad electrode 70.

The non-conductive reflective film R is formed such that it covers the light transmitting conductive film 60, the electrodes 72, 75, 82, 85, and an etched exposed portion of the first semiconductor layer 30, and serves to reflect light from the active layer 40 towards the multiple semiconductor layers 30, 40, 50. The non-conductive reflective film R preferably has a multilayer structure, and the non-conductive reflective films R illustrated in FIG. 32 through FIG. 34 may be applicable. The light absorption barrier 41 is formed in correspondence with the extending-type electrode 75 (finger electrode) and the island-type electrode 75, respectively. Moreover, an abnormal region A1 of the non-conductive reflective film R can be formed around the extending-type electrode 75 and the island-type electrode 72. FIG. 36 shows as an example of the cutaway cross section of the extending-type electrode 75 which is taken along line C-C. Referring to FIG. 32, length D2 (length in the direction of line C-C) of the light absorption barrier 41 from the lateral face of the extending-type electrode 75 is made longer than length D1 (length in the direction of line C-C) of the abnormal region A1 of the non-conductive reflective film R.

The first pad electrode 80 and the second pad electrode 70 are formed on the non-conductive reflective film R, facing each other at a distance from each other. In this embodiment, the first pad electrode 80 provides electrons, and the second pad electrode 71 provides holes, or they could also be the other way around. The first electrical connection 81 serves to electrically connect the first pad electrode 80 and the first electrode 81, 85 through an opening 97b formed in the non-conductive reflective film R, and the second electrical connection 71 serves to electrically connect the second pad electrode 70 and the second electrode 72, 75 through an opening 97a. The pad electrodes 70, 80 and the electrical connections 71, 81 may be formed simultaneously, or the pad electrodes 70, 80 may be formed in a separate procedure after the electrical connections 71, 81 are formed.

The first pad electrode 80 and the second pad electrode 70 are those for electrical connection to an electrode available outside, which may be connected to an external electrode by eutectic bonding, soldering or wire bonding. The external electrode may be a conducting part provided at the submount, a lead frame in the package, an electrical pattern formed on the PCB, or the like, and there is no particular limit to its configuration as long as it is a wire independent of the semiconductor light emitting device. The first pad electrode 80 and the second pad electrode 70 are formed in a way that they each have a certain area and reflect light that could not be reflected by the non-conductive reflective film R. The first pad electrode 80 and the second pad electrode 70 may have a height enough to be bonded with the package using a separate pump, or may be deposited to a certain height enough to be bonded with the package.

According to this semiconductor light emitting device, the non-conductive reflective R rather than a metal reflective film can be used to reduce the loss by light absorption. In addition, the light absorption barrier 41 may be arranged to block light entering the abnormal region A1 formed on the non-conductive reflective film R because of the presence of an uneven structure like a height difference due to the electrode or etching, such that light loss is reduced and brightness is improved. In particular, as described above, the light absorption barrier 41 not only serves as a current blocking layer only, but it is also designed to have a certain length (distance or width) based on the length of the abnormal region A1 in order to blocking light entering the aforementioned abnormal region A1, thereby contributing to improving brightness.

Figure 39:
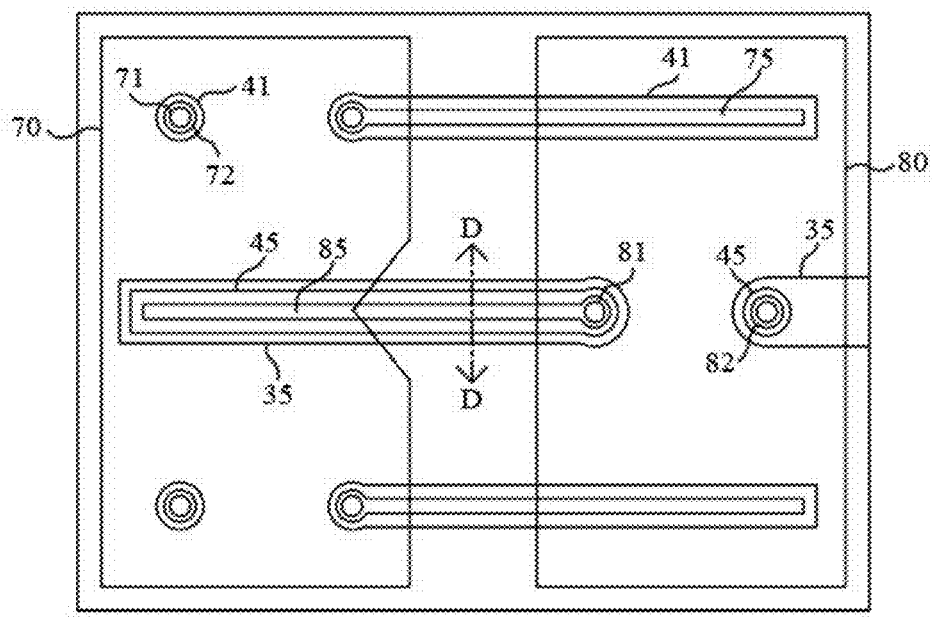
FIG. 39 shows yet another exemplary embodiment of a semiconductor light emitting device according to the present disclosure.

FIG. 39 shows yet another exemplary embodiment of a semiconductor light emitting device according to the present disclosure, in which the light absorption barrier 41 is formed between the second semiconductor layer 50 and the light transmitting conductive film 60, in correspondence with the second electrode 72, 75. Further, an additional light absorption barrier 45 is formed between the first electrode 82, 85 and the first semiconductor layer 30.

Figure 40:
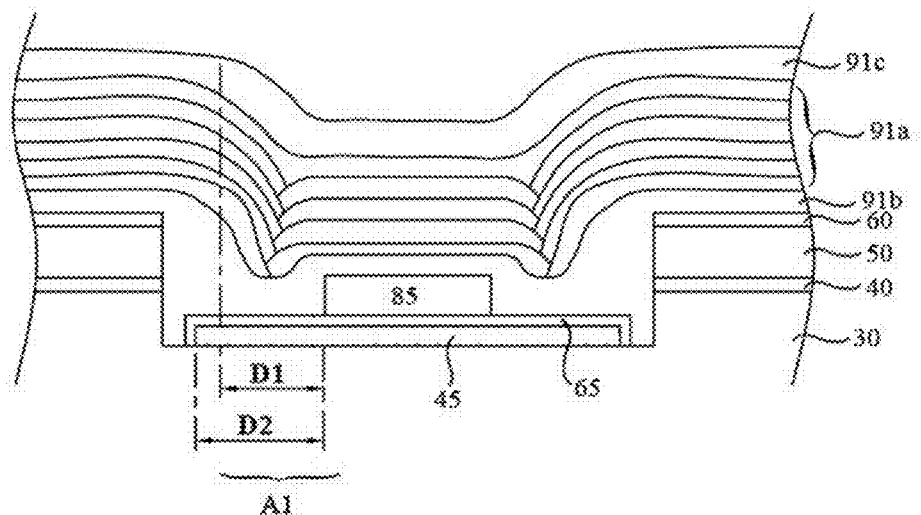
FIG. 40 shows yet another exemplary embodiment of a semiconductor light emitting device according to the present disclosure.

FIG. 40 shows yet another exemplary embodiment of a semiconductor light emitting device according to the present disclosure, which may be an example of the cutaway cross section taken along line D-D. The electrode 85 is formed on an exposed portion of the first semiconductor layer 30 by mesa-etching. Because of a height difference as a result of mesa-etching, an abnormal region A1 may be created in the non-conductive reflective film R (91a, 91b, 91c). The additional light absorption 45 is formed between the electrode 85 and the first semiconductor layer 30, in correspondence with the abnormal region A1, being exposed around the electrode 85, and the electrode 85 may be formed on a conductor 65 that covers the additional light absorption barrier 45 and is in electrical conduct with the first semiconductor layer 30.

Figure 41:
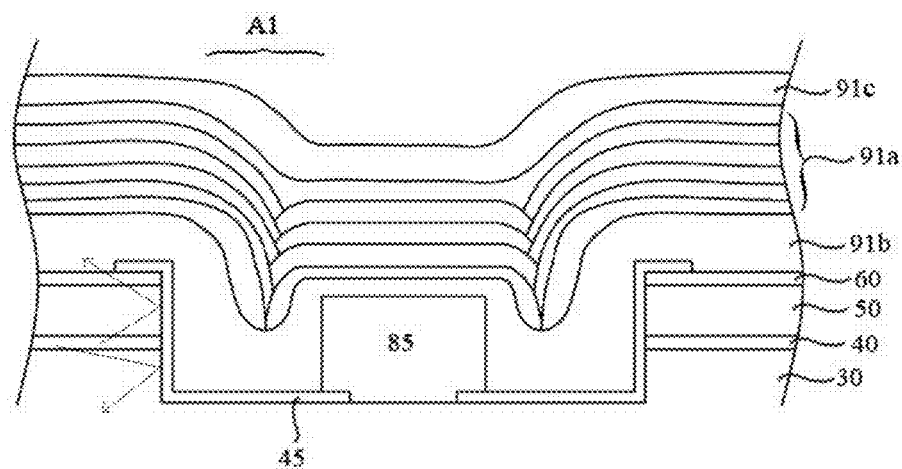
FIG. 41 shows yet another exemplary embodiment of a semiconductor light emitting device according to the present disclosure.

FIG. 41 shows yet another exemplary embodiment of a semiconductor light emitting device according to the present disclosure, which is another example of a cutaway view taken along line D-D in FIG. 39. To block light entering the abnormal region A1 because of the height difference as a result of mesa-etching, the additional light absorption barrier 45 is formed on mesa-etched inner lateral faces of the multiple semiconductor layers 30, 40, 50 and on the first semiconductor layer 30. Further, the additional light absorption barrier 45 is partially removed to allow the electrode 85 to be in electrical conduct with the first semiconductor layer 30.

Figure 42:
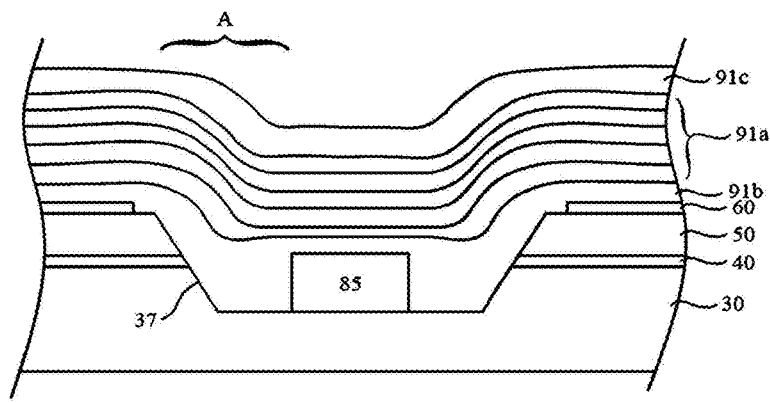
FIG. 42 shows yet another exemplary embodiment of a semiconductor light emitting device according to the present disclosure.

FIG. 42 shows yet another exemplary embodiment of a semiconductor light emitting device according to the present disclosure, in which a slated etched face 37 is formed by controlling etching conditions during mesa-etching. Although a height difference is created as a result of mesa-etching, the slanted etched face 37 facilitates the formation of the non-conductive reflective film R (91a, 91b, 91c), as compared with a case having a sharp height difference. Accordingly, the abnormal region A1 in the non-conductive reflective film R (91a, 91b, 91c) may be distorted less, or the distortion may substantially be avoided. In other words, the abnormal region A1 is no more abnormal, and can have a necessary reflectivity or reduce light leak.

Figure 43:
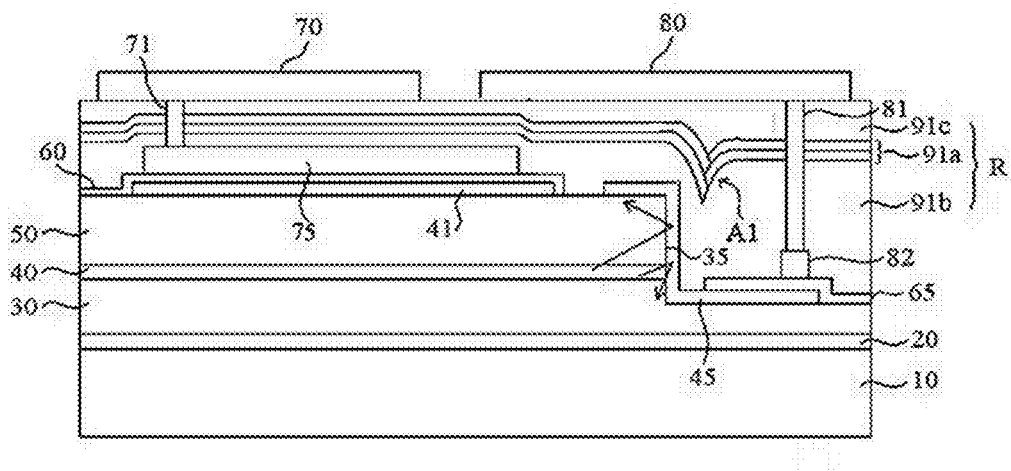
FIG. 43 shows yet another exemplary embodiment of a semiconductor light emitting device according to the present disclosure.

FIG. 43 shows yet another exemplary embodiment of a semiconductor light emitting device according to the present disclosure, in which the first electrode 82 and the second electrode 75 are covered by the non-conductive reflective film R, and the pad electrodes 70, 80 and the electrodes 75, 82 are connected respectively by electrical connections 71, 81 that run through the non-conductive reflective film R, the abnormal region A1 can be arranged in correspondence with a stepped face (e.g., 35) as a result of mesa-etching, and the additional light absorption barrier 45 is then formed correspondingly on the stepped face (e.g., 35) as a result of mesa-etching and on an exposed portion of the first semiconductor layer 30. A conductor 65 is interposed between the first electrode 82 and the additional light absorption barrier 45, and electrically connected with the first semiconductor layer 30. Optionally, the light absorption barrier 41 and the additional light absorption barrier 45 may be connected.

Figure 44:
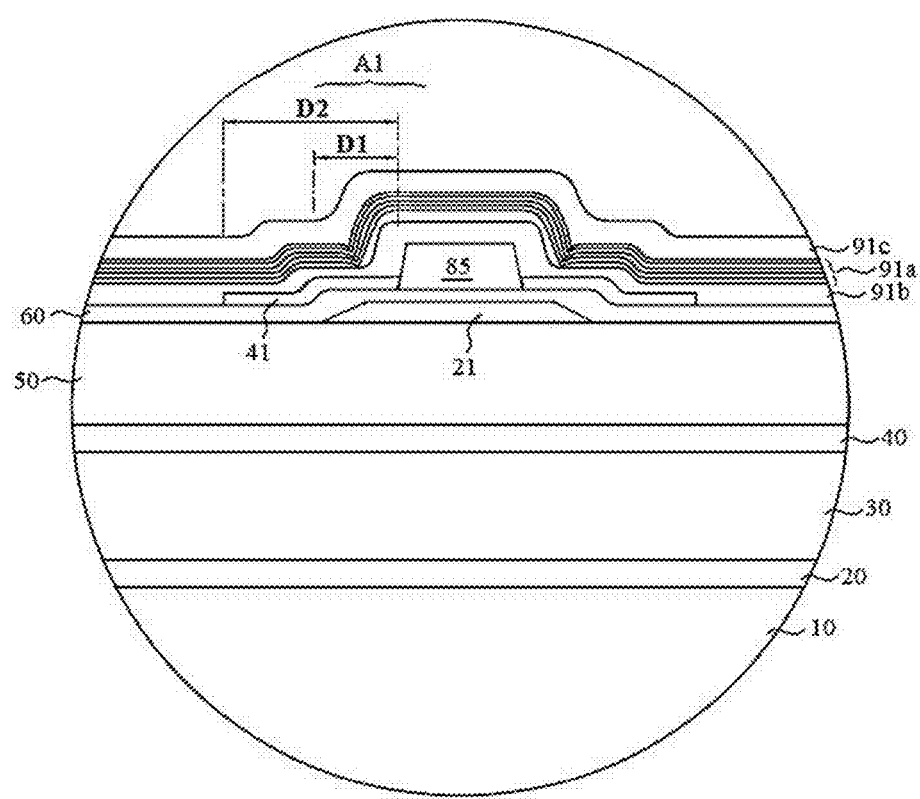
FIG. 44 and FIG. 45 each show yet another exemplary embodiment of a semiconductor light emitting device according to the present disclosure.
Figure 45:
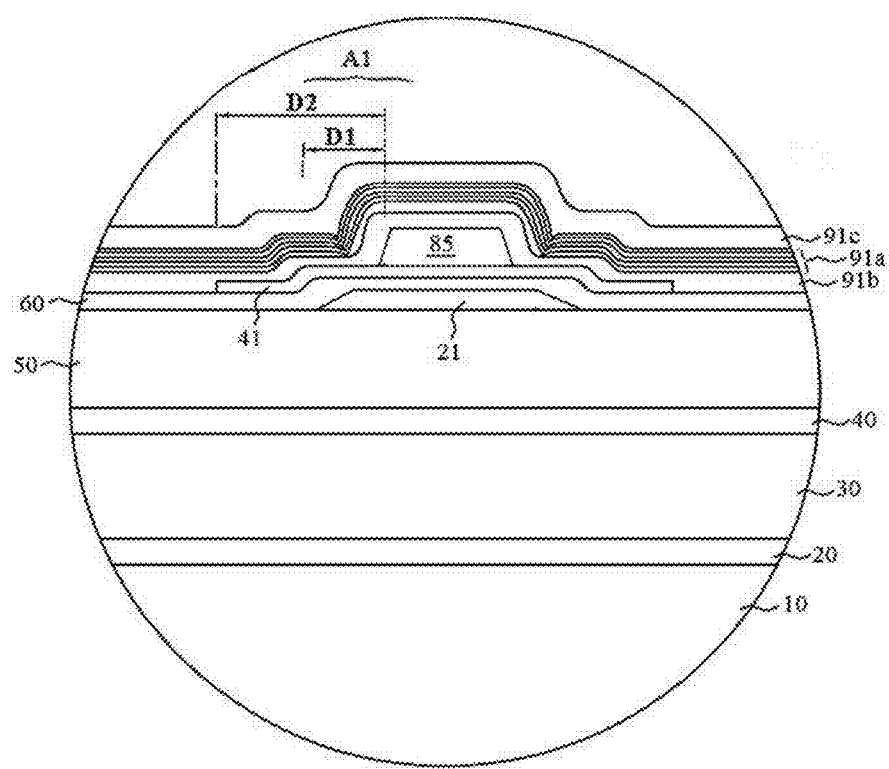

FIG. 44 and FIG. 45 each show yet another exemplary embodiment of a semiconductor light emitting device according to the present disclosure. In these embodiments, the light absorption barrier 41 is formed around the electrode 75 and serves to block light entering the abnormal region A1 created in the non-conductive reflective film R. Unlike the above-described embodiments, the light absorption barrier 41 in these embodiment is formed between the light transmitting conductive film 60 and the non-conductive reflective film R. The light absorption barrier 41 thus formed may be made of a non-conductive material or a conductive material. When the light absorption barrier 41 is made of a conductive material, both configurations in FIG. 44 and FIG. 45 are possible. When the light absorption barrier 41 is made of a non-conductive material, it can be partially removed to allow the exposed light emitting conductive film 60 to be in electrical conduct with the electrode 75, as in FIG. 44. To block current flowing directly downwardly of the electrode 75, a current blocking layer 21 may be arranged below the electrode 75, i.e. between the second semiconductor layer 50 and the light transmitting film 60. In this case, as the current blocking layer 21 is formed separately from the light absorption barrier 41, length or width of the current blocking layer 21 can be determined independently of the abnormal region A1. Moreover, in the embodiment illustrated in FIG. 44, the light absorption barrier 41 will also reduce the height difference due to the electrode 75, which in turn reduces the creation of the abnormal region A1.

Figure 46:
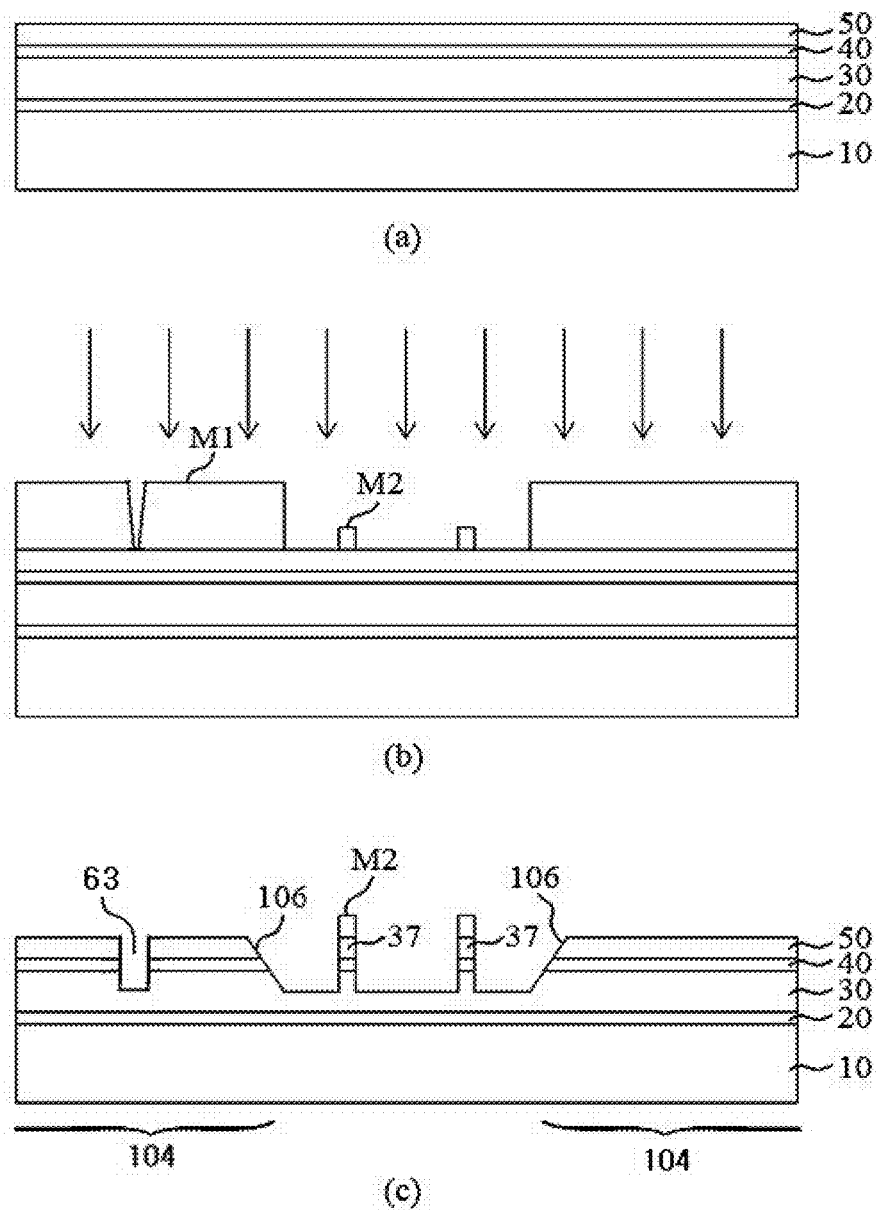
FIG. 46 through FIG. 48 each show another exemplary embodiment of a semiconductor light emitting device according to the present disclosure.
Figure 47:
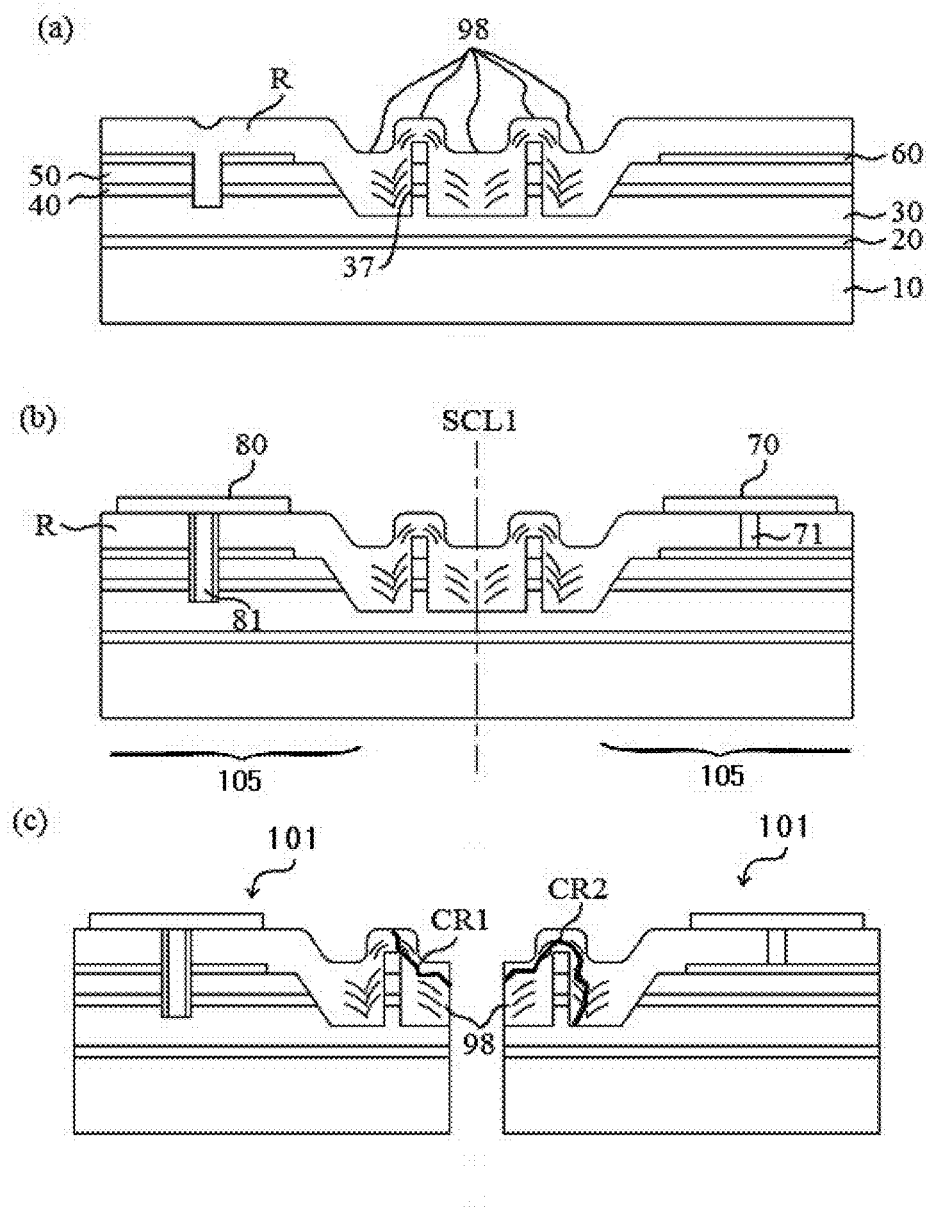
Figure 48:
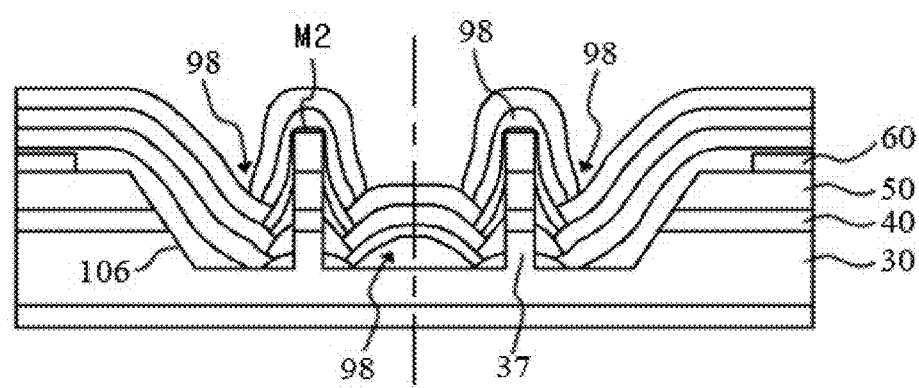
Figure 48:
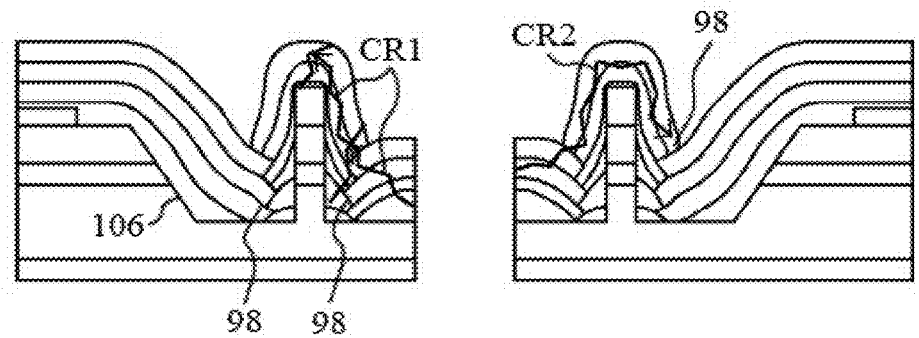

FIG. 46 through FIG. 48 each show another exemplary embodiment of a semiconductor light emitting device according to the present disclosure. In the following description, a Group III-nitride semiconductor light emitting device is taken by way of example. According to a manufacturing method of the semiconductor light emitting device, as illustrated in FIG. 46a, first of all, multiple semiconductor layers 30, 40, 50 are formed on a growth substrate 10. The multiple semiconductor layers 30, 40, 50 include a buffer layer 20 formed on the growth substrate 10, a first semiconductor layer 30 (e.g., Si-doped GaN) having a first conductivity type, a second semiconductor layer 50 (e.g., Mg-doped GaN) having a second conductivity type different from the first conductivity type, and an active layer 40 (e.g., InGaN/(In)/GaN multiple quantum well structure) which is interposed between the first semiconductor layer 30 and the second semiconductor layer 50 and generates light by electron-hole recombination. Each of the multiple semiconductor layers 30, 40, 50 may have a multilayer structure, and the buffer layer 20 may be omitted.

Next, as illustrated in FIG. 46b and FIG. 46c, the multiple semiconductor layers 30, 40, 50 are partially removed and divided into multiple semiconductor light emitting chip sections 104 and walls 37 around each semiconductor light emitting chip section 104. In this embodiment, the lateral faces of the multiple semiconductor layers 30, 40, 50 of each semiconductor light emitting chip section 104 are slanted at an angle different from that of the lateral face of the wall 37 in the division process. For example, as illustrated in FIG. 46b, a first mask M1 corresponding to each semiconductor light emitting chip section 104, and a second mask M2 corresponding to the wall 37, with the second mask M2 having a higher etch selectivity than the first mask M1, are formed on the multiple semiconductor layers 30, 40, 50, and these semiconductor layers 30, 40, 50 are etched. For example, the first mask M1 includes a photoresist, and the second mask M2 includes at least one of a dielectric material and a metal. Examples of the dielectric material include $SiO_2$, SiN, $Al_2O_3$ and so on, and examples of the metals include Ni, Cr and so on.

As a result of the etching process, as illustrated in FIG. 46c, the lateral face 106 of each semiconductor light emitting chip section 104 is slanted with respect to the growth substrate 10, in correspondence with the first mask M1. In correspondence with the second mask M2, the growth substrate 10 and the lateral face of the wall 37 are formed at more substantially right angles than an angle between the growth substrate 10 and the lateral face 106 of each semiconductor light emitting chip 105. Preferably, the growth substrate 10 and the lateral face of the wall 37 are formed at right angles. In this embodiment, two walls 37 are formed between adjacent semiconductor light emitting chip sections 104. As illustrated in FIG. 46c, when the multiple semiconductor layers 30, 40, 50 are etched, an opening 63 that exposes the first semiconductor layer 30 out of the multiple semiconductor layers 30, 40, 50 of each semiconductor light emitting chip section is formed. After this etching process, the first mask M1 made of a photoresist is removed, and the second mask M2 made of a dielectric material or a meal may remain. Here, the wall 37 may include the remaining second mask M2 and the rest of the multiple semiconductor layers 30, 40, 50 under the second mask M2. Although the second mask M2 may also be removed, with the presence of the second mask M2, a height difference due to the wall 37 can be greater, and this height difference will facilitate the formation of an irregular portion 98 (to be described later).

Next, as illustrated in FIG. 47a, the non-conductive reflective film R is arranged to cover each semiconductor light emitting section 104 and gaps between the multiple semiconductor light emitting chip regions 104. The non-conductive reflective film R reflects light from the active layer 40. The non-conductive reflective film R preferably has a multiple layer structure, and has at least a light-reflecting side made of a non-conductive material to reduce light absorption by a metal reflective film thereof. In the context herein, the term 'insulating' means that the non-conductive reflective film R is not used as means for electrical conduction, yet it does not mean that the non-conductive reflective film R should be necessarily composed of a non-conductive material only. In its multiple layer structure, the non-conductive reflective film R can include a DBR (Distributed Bragg Reflector), an ODR (Omni-Directional Reflector) and so on. When the non-conductive reflective film R is formed, a height difference is created because of the wall 37, or the lateral faces 106 of the multiple semiconductor layers 30, 40, 50 of each semiconductor light emitting chip section 104, and the layered structure of the non-conductive reflective film R may be distorted, thereby creating an irregular portion 98 having a reduced reflectivity. However, according to this embodiment, the lateral face 106 of each semiconductor light emitting chip 105 is slanted so as to reduce distortion, and the wall 37 is formed at right angles or at a sharp angle so as to intentionally increase distortion. In this way, as illustrated in FIG. 47, those irregular portions 98 are formed in the non-conductive reflective film R in correspondence with the wall 37.

Once the non-conductive reflective film R is formed, electrodes 80, 70 and electrical connections 81, 71 are formed as illustrated in FIG. 47b, which results in semiconductor light emitting chips 105 in the respective semiconductor light emitting chip section 104. Each semiconductor light emitting chip 105 can include multiple semiconductor layers, a light transmitting conductive film 60, a non-conductive reflective film R, an electrode 80, 70 and an electrical connection 81, 71. After that, as shown in FIG. 47c, a cutting process is carried out along a center line of the two walls 37, and separate individual semiconductor light emitting devices 101 are thus obtained. The wall 37 has an inner side face facing the lateral face 106 of the semiconductor light emitting chip 105, and an outer side face opposite to the inner side face. The outer side face is arranged at a distance from the cutting face formed from the cutting process, and the non-conductive reflective film R covers a gap between the outer side face and the cutting face. For cutting, a scribing process and/or a breaking process may be carried out. Optionally, a chemical etching process may be added. For example, in the scribing-and-breaking process, the scribing process uses a cutter or a laser; and in the breaking process following the scribing process, those preliminarily cut semiconductor light emitting devices can then become completely separated individual semiconductor light emitting devices 101. One example of sawing using a laser will be stealth dicing. According to this method, cutting starts from the inside of the growth substrate 10 such that debris, device damage, loss of a semiconductor material and the like can be overcome. For example, a laser 2 is focused below the surface of the growth substrate 10 to obtain a perforated borehole in the growth substrate 10, and a tape attached to the side of the multiple semiconductor layers 30, 40, 50 is expanded, thereby producing separate individual chips. According to the stealth dicing method, because the perforated borehole is formed only inside the growth substrate 10, the surface of the substrate is not damaged at all. In addition, as compared with a cutting method using a blade, the stealth dicing method substantially reduces the spacing or width of cutting.

FIG. 48 shows one example of the irregular portion 98 where the layered structure of the non-conductive reflective film R is distorted around the wall 37. Referring to FIG. 48a, each layer of the non-conductive reflective film R cannot smoothly run over the wall 37 because of a height difference due to the wall 37. In particular, the irregular portion 98 is formed because unevenness increases as each layer of the non-conductive reflective film R is not successively and uniformly connected roughly at the top edge of the wall 37, and at the lower corner where the side of the wall 37 and the growth substrate 10 meet each other, or because a boundary is formed as each layer is not connected. As illustrated in FIG. 48b, cracks CR1, CR2 may be created in the non-conductive reflective film R when the cutting process is carried out in the middle of the walls 37, but these cracks CR1, CR2 will not be propagated sideways due to the irregular portion 98 between the walls 37. Moreover, the propagation of the cracks CR1, CR2 can be blocked by the irregular portion 98 formed near the top edge of the wall 37. In addition, the cracks CR1, CR2 having already run over the wall 37 cannot be propagated any further because of the irregular portion 98 formed at the bottom of the wall 37. In this manner, it is possible to prevent intrusion of the cracks CR1, CR2 into the semiconductor light emitting chip 105.

Figure 49:
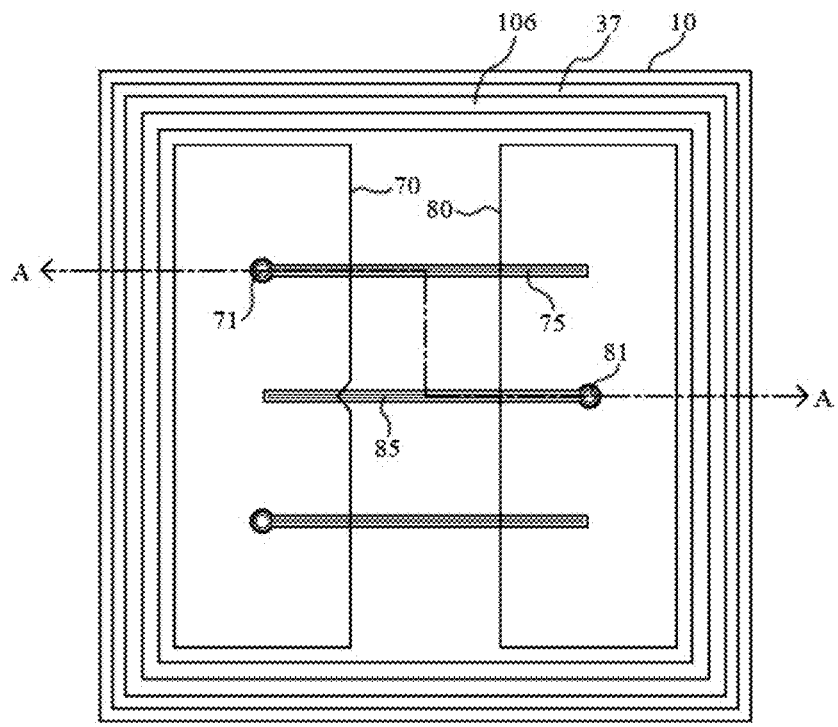
FIG. 49 and FIG. 50 each show yet another exemplary embodiment of a semiconductor light emitting device according to the present disclosure.
Figure 50:
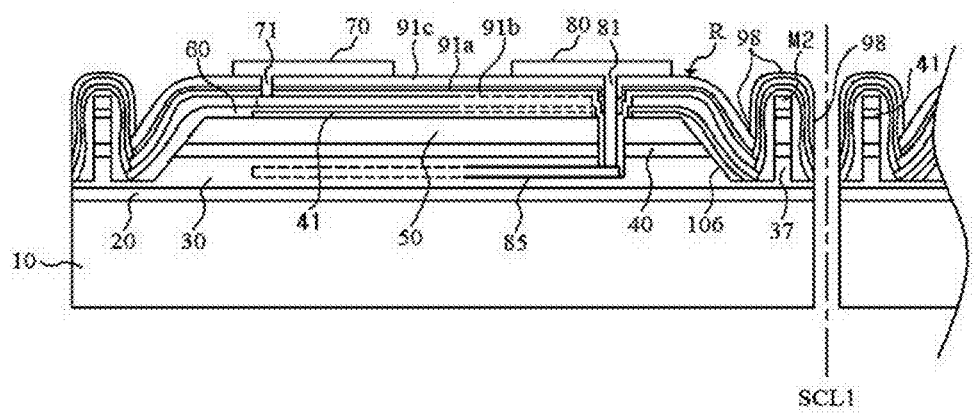

FIG. 49 and FIG. 50 each show yet another exemplary embodiment of a semiconductor light emitting device according to the present disclosure. In particular, FIG. 50 shows an example of a cutaway cross section taken along line A-A in FIG. 49. The light emitting device includes multiple semiconductor layers 30, 40, 50, a wall 37, a non-conductive reflective film R, and at least one electrode 80, 70. A first mask M1 made of a photoresist, and a second mask M2 including a dielectric material or a metal are formed on the multiple semiconductor layers 30, 40, 50, and then the multiple semiconductor layers 30, 40, 50 are etched and divided into multiple semiconductor light emitting chip sections 104 and walls 37. Meanwhile, a light absorption barrier 41 made of a dielectric material such as $SiO_2$ may be formed before etching the multiple semiconductor layers 30, 40, 50. In this embodiment, the light absorption barrier 41 is formed in correspondence with an electrical connection 71 or finger electrode 75 (to be described), as well as in a place where the wall 37 is to be formed. The light absorption barrier 41 may only serve to reflect a portion or all of the light generated from the active layer 40, or to block the current flowing directly below the electric connection 71 or finger electrode 75, or both.

In the etching process for dividing into the multiple semiconductor light emitting chip sections 104 and the wall 37, the first mask M1 is removed, and the second mask M2 can remain. In this embodiment, therefore, the wall 37 can be composed of the multiple semiconductor layers 30, 40, 50, a dielectric layer as the remainder of the light absorption barrier 41, and the second mask M2. The wall 37 is formed at a distance from the lateral faces 106 of the multiple semiconductor layers 30, 40, 50, and in this embodiment, the wall 37 is arranged to surround the semiconductor light emitting chip 105.

Following the etching process, a light transmitting conductive film 60 (e.g., ITO) covering each semiconductor light emitting chip 105 is formed. Next, a finger electrode 75 is formed on the light transmitting conductive film 60 in correspondence with the light absorption barrier 41, and a finger electrode 85 is formed on an etched exposed portion of the first semiconductor layer 30. Depending on the specification of a semiconductor light emitting device, the finger electrodes 85, 75 may optionally be omitted. In one example, the multiple semiconductor layers 30, 40, 50 may be subjected to an etching process after the light transmitting conductive film 60 is formed. In this case, the light transmitting conductive film 60 also remains in a place corresponding to the wall 37, such that the remainder of the light transmitting conductive film 60 may be included in a portion of the wall 37. In another example, the second mask M2 may include at least one of the light absorption barrier 41 and the light transmitting conductive film 60, and a photoresist thereon, if at least one of the light absorption barrier 41 and the light transmitting conductive film 60 is present in the place corresponding to the wall 37.

The non-conductive reflective film R is arranged such that it covers the multiple semiconductor layers 30, 40, 50 of the semiconductor light emitting chip section 104, the wall 37, and a gap between the multiple semiconductor layers 30, 40, 50 and the wall 37. Because of the presence of the wall 37, an irregular portion is created in the non-conductive reflective film R. The irregular portion 98 has a more irregular shape as compared with the shape of the non-conductive reflective film R at the lateral faces 106 of the multiple semiconductor layers 30, 40, 50 (e.g., regularity or uniformity of each layer of the non-conductive reflective film R). The first electrode 80 and the second electrode 70 are arranged on the non-conductive reflective film R, and electrically connected with the multiple semiconductor layers 30, 40, 50 by the electrical connections 81, 71. The irregular portion 98 blocks the propagation of the cracks CR1, CR2, which were created in the non-conductive reflective film R during the cutting process for obtaining individual semiconductor light emitting devices 101, towards the multiple semiconductor layers 30, 40, 50 of the semiconductor light emitting chip 105.

The non-conductive reflective film R has multiple layers, and may include a DBR 91a for example. A dielectric film 91b can be formed between the DBR 91a and the multiple semiconductor layers 30, 40, 50, and a clad film 91c may be formed on the DBR 91a. For example, the DBR 91a may be composed of a stack of alternating $SiO_2$ and $TiO_2$ pairs. In addition, the DBR 91a can be composed of a combination of a higher refractive index material such as $Ta_2O_5$, HfO, ZrO, SiN or the like and a lower refractive index dielectric thin film (typically, $SiO_2$). For example, the DBR 95a may be composed of a stack of alternating $SiO_2/TiO_2$, $SiO_2/Ta_2O_2$, or $SiO_2/HfO$ pairs, as $SiO_2/TiO_2$ demonstrates a high bluelight reflection efficiency, and $SiO_2/Ta_2O_2$ or $SiO_2/HfO$ demonstrates a high UV-ray reflection efficiency. If the DBR 91a is composed of a stack of alternating $TiO_2/SiO_2$ pairs, it should preferably undergo an optimization process in consideration of an angle of incidence as well as wavelength-dependent reflectivity, using a ¼ optical thickness of the wavelength of the light emitted from the active layer 40 as a reference, yet it is not absolutely required that each layer should have a ¼ optical thickness of the wavelength. The number of pairs in the stack is suitably between 4 and 40 pairs. If the DBR 91a is composed of a stack of alternating $SiO_2/TiO_2$ pairs, the DBR 91a is preferably formed by PVD (Physical Vapor Deposition), and more particularly, E-Beam evaporation, sputtering or thermal evaporation.

The clad film 91c may be made of a metal oxide such as $Al_2O_3$, a dielectric film such as $SiO_2$ or SiON, or other material such as MaF or CaF. Preferably, the clad film 91c has a thickness ranging from λ/4n to 3.0 µm, in which λ denotes a wavelength of the light generated from the active layer 40, and n denotes a refractive index of a material composing the clad film 91c. If λ is 450 nm (4500 Å), the clad film 91c can be formed in a thickness of 771 Å (4500/4×1.46=771 Å) or more. In short, the dielectric film 91b, the DBR 91a and the clad film 91c which constitute the non-conductive reflective film R serve as an optical waveguide, and their combined thickness may range from 1 to 8 µm, or 4 to 5 µm.

Figure 51:
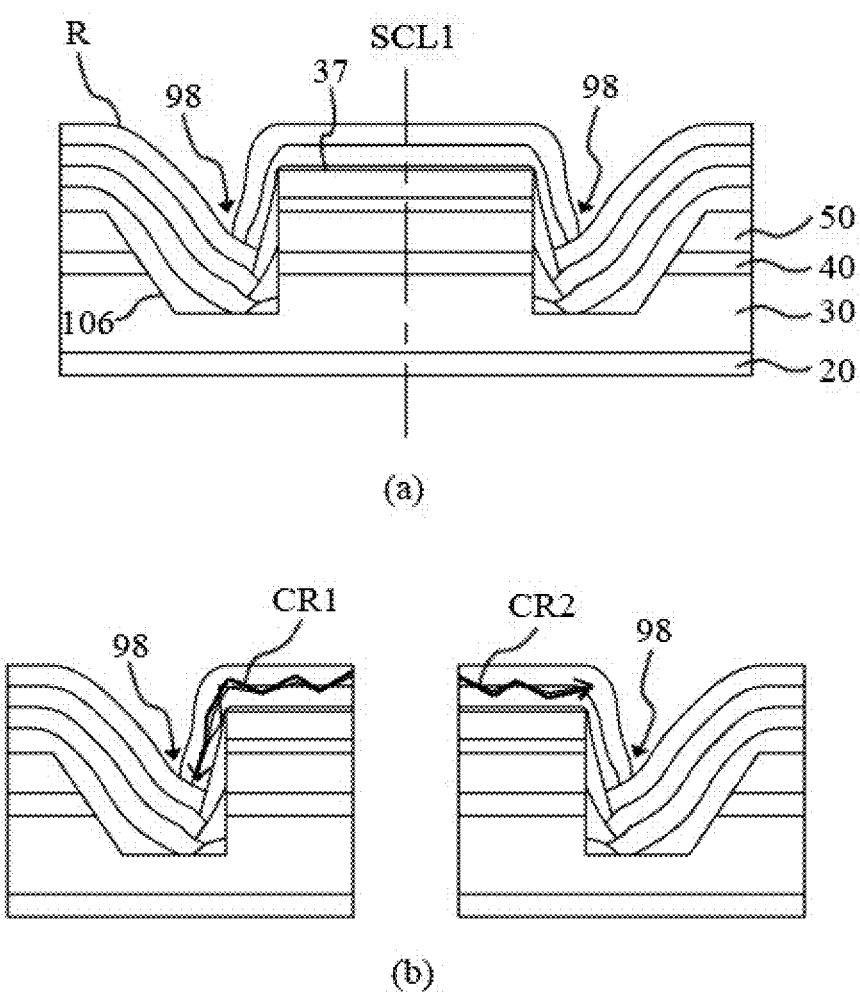
FIG. 51 shows still another exemplary embodiment of a semiconductor light emitting device and of a method for manufacturing the same according to the present disclosure.

FIG. 51 shows still another exemplary embodiment of a semiconductor light emitting device and of a method for manufacturing the same according to the present disclosure. As illustrated in FIG. 51a, a wall 37 is formed between adjacent semiconductor light emitting chips 105, and an irregular portion 98 is formed in the non-conductive reflective film R between the wall 37 and the lateral face 106 of the semiconductor light emitting chip 105. As illustrated in FIG. 51b, the wall 37 is cut along the cutting line SCL1, and as a result, separate individual semiconductor light emitting devices 101 are obtained. The wall 37 has an inner side face facing the lateral face 106 of the multiple semiconductor layers 30, 40, 50, and an outer side face opposite to the inner side face, and the outer side face is a cutting face that is formed upon the cutting process. The irregular portion 98 blocks further propagation of the cracks CR1, CR2 that were created in the non-conductive reflective film R.

Figure 52:
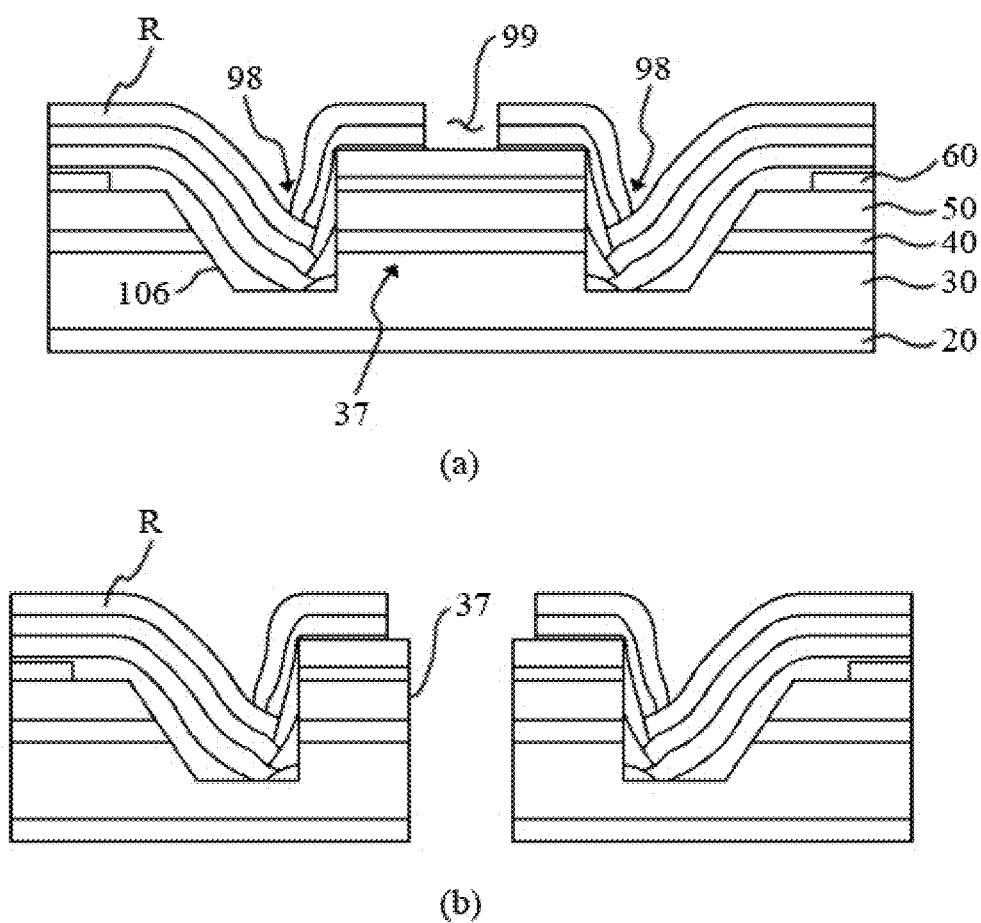
FIG. 52 shows still another exemplary embodiment of a semiconductor light emitting device and of a method for manufacturing the same according to the present disclosure.

FIG. 52 shows still another exemplary embodiment of a semiconductor light emitting device and of a method for manufacturing the same according to the present disclosure. As illustrated in FIG. 52a, a wall 37 is formed between adjacent semiconductor light emitting chips 105, and an irregular portion 98 is formed in the non-conductive reflective film R between the wall 37 and the lateral face 106 of the semiconductor light emitting chip 105. A groove 99 is then formed by removing a portion of the non-conductive reflective film R, which corresponds to the cutting line SCL1, on the wall 37. Later, the wall 37 is cut along the SCL1, and separate individual semiconductor light emitting devices 101 are obtained as illustrated in FIG. 52b. Upon the cutting process, the creation of cracks CR1, CR2 in the non-conductive reflective film R can be reduced because of the presence of the groove 99. Moreover, as those created cracks CR1, CR2 cannot run through the irregular portion 98, further cracking can be blocked.

Figure 53:
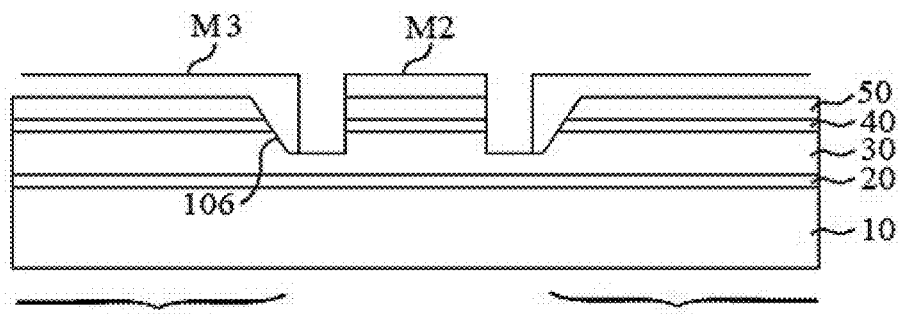
FIG. 53 shows still another exemplary embodiment of a semiconductor light emitting device and of a method for manufacturing the same according to the present disclosure.
Figure 53:
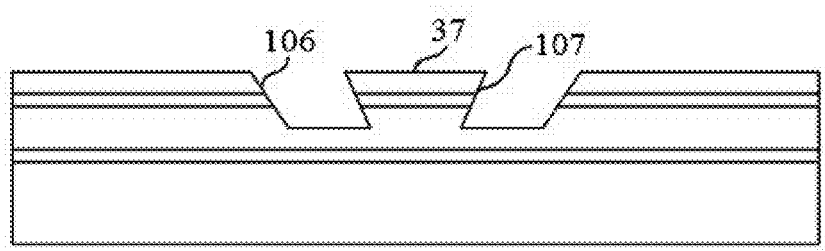
Figure 53:
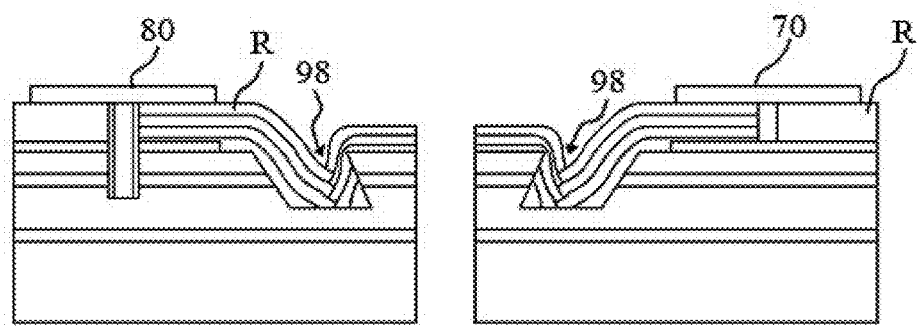

FIG. 53 shows still another exemplary embodiment of a semiconductor light emitting device and of a method for manufacturing the same according to the present disclosure. As illustrated in FIG. 53a, multiple semiconductor layers 30, 40, 50 are etched and split into multiple semiconductor light emitting chips 104 and walls 37, and then a protection mask M3 covering each semiconductor light emitting chip section 104 is formed. Next, as illustrated in FIG. 53b, the lower corner of the wall 37 is additionally etched by wet etching for example, so as to form the side face of the wall 107 in an inverted mesa structure. During the process of forming the side face of the wall 37 in an inverted mesa structure, the lateral face 106 of the semiconductor light emitting chip section 104 can maintain its slated state by help of the protection mask M3. Alternatively, the lateral faces 106 of the multiple semiconductor layers 30, 40, 50 of the semiconductor light emitting chip section 104 may also be formed in an inverted mesa structure. A non-conductive reflective film R is then formed as illustrated in FIG. 53c. Since the side face 107 of the wall 37 is in an inverted mesa form or inversely slanted, it is hard to make each side of the non-conductive reflective film R uniformly along the wall 37, which in turn may create a severely distorted irregular portion 98. The irregular portion 98 blocks the propagation of cracks CR1, CR2 created when the multiple semiconductor light emitting chips 105 are cut.

Figure 54:
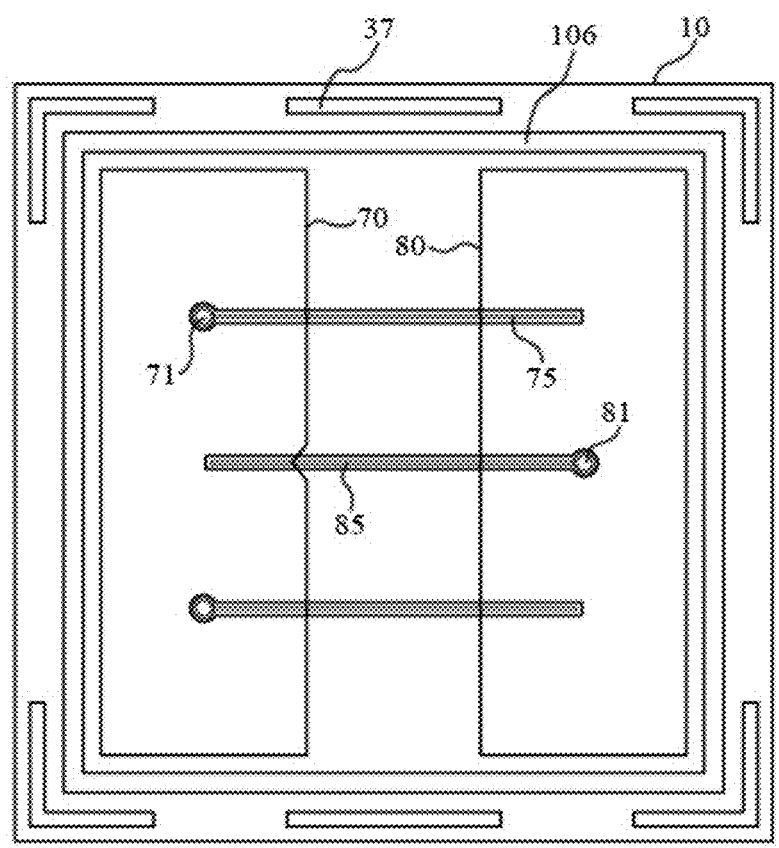
FIG. 54 shows still another exemplary embodiment of a semiconductor light emitting device according to the present disclosure.

FIG. 54 shows still another exemplary embodiment of a semiconductor light emitting device according to the present disclosure, in which the wall 37 is formed partially around the semiconductor light emitting chip 105. For example, in case of depositing a metal layer and electrically connecting multiple semiconductor light emitting devices, the metal layer can optionally be formed on the side where no wall 37 is formed. In an alternate example, the metal layer can be formed over the wall 37, for example, over the non-conductive reflective film R, thereby reducing a height difference resulted from the metal layer.

The following will now describe various embodiments of the present disclosure.

(1) A semiconductor light emitting device, including: at least one light emitting part formed on a substrate, with the light emitting part having multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination; a protection part having multiple semiconductor layers, with the protection part being insulated with the at least one light emitting part on the substrate; an insulating reflective layer formed on the at least one light emitting part and on the protection part; a first electrode part electrically communicating the first semiconductor layer with the second semiconductor layer among the at least one light emitting part; and a second electrode part electrically communicating the second semiconductor layer among the at least one light emitting part with the first semiconductor layer of the protection part, wherein at least one of the first and second electrode parts includes: an upper electrode formed on the insulating reflective layer; and multiple electrical connections electrically communicating the at least one light emitting part, the upper electrode and the protection part.

(2) In the semiconductor light emitting device, the at least one light emitting part includes: a first light emitting part which has multiple semiconductor layers and electrically communicates with the first electrode part; a second light emitting part which is arranged at a distance from the first light emitting part and electrically communicates with the second electrode part; and a connecting electrode electrically communicating the first light emitting part and the second light emitting part.

(3) In the semiconductor light emitting device, the semiconductor light emitting device is a flip chip; the first electrode part includes a first upper electrode and multiple electrical connections; and the second electrode part includes a second upper electrode and multiple electrical connections, wherein the multiple electrical connections of the first electrode part includes: a first electrical connection which runs through the insulating reflective layer and electrically communicates the first semiconductor layer of the first light emitting part with the first upper electrode; and a second electrical connection which electrically communicates the second semiconductor layer of the protection part with the first upper electrode, wherein the multiple electrical connections of the second electrode part includes: a third electrical connection which runs through the insulating reflective layer and electrically communicates the second semiconductor layer of the second light emitting part with the second upper electrode; and a fourth electrical connection which electrically communicates the first semiconductor layer of the protection part with the second upper electrode.

(4) In the semiconductor light emitting device, when seen from the top, the first upper electrode and the second upper electrode are partially overlapped, and the second and fourth electrical connections run through the insulating reflective layer to be in electrical communication with the protection part.

(5) In the semiconductor light emitting device, the protection part is formed such that it reaches below the first upper electrode and below the second upper electrode, starting between the first light emitting part and the second light emitting part.

(6) In the semiconductor light emitting device, the first light emitting part, the second light emitting part and the protection part are insulated from each other by an etched portion formed by etching the multiple semiconductor layers; and when seen on the top, the etched portion around the protection part is arranged further inwardly than the boundary where the multiple semiconductor layers at the outer edge of the first and second light emitting parts are removed.

(7) In the semiconductor light emitting device, the first light emitting part, the second light emitting part and the protection part are insulated from each other by an etched portion formed by etching the multiple semiconductor layers; and when seen on the top, a part of the etched portion around the protection part is connected to the boundary where the multiple semiconductor layers at the outer edge of the first and second light emitting parts are removed.

(8) In the semiconductor light emitting device, the connecting electrode includes: a first extension stretching out between the second semiconductor layer of the first light emitting part and the insulating reflective layer; a second extension stretching over an etched exposed portion of the first semiconductor layer of the second light emitting part; and a connection part connecting the first extension and the second extension between the first light emitting part and the second light emitting part.

(9) In the semiconductor light emitting device, at least one connecting electrode is formed such that it reaches above the insulating reflective layer on the second light emitting part, starting from above the insulating reflective layer on the first light emitting part, and includes a first additional electrical connection which runs through the insulating reflective layer and electrically communicates the second semiconductor layer of the first light emitting part with the at least one connecting electrode; and a second additional electrical connection which runs through the insulating reflective layer and electrically communicates the first semiconductor layer of the second light emitting part with the at least one connecting electrode.

(10) The semiconductor light emitting device includes a third cell disposed between the first light emitting part and the second light emitting part; and in the semiconductor light emitting device, the at least one connecting electrode serially connects the first light emitting part, the second light emitting part and the third cell, and the protection part is formed such that it reaches from the edge of the third cell downwardly below the first upper electrode and below the second upper electrode.

(11) A semiconductor light emitting device, including: first and second light emitting parts formed on a substrate, with each of the first and second light emitting parts having multiple semiconductor layers which include a first semiconductor layer having a first conductivity type, a second semiconductor layer having a second conductivity type different from the first conductivity type, and an active layer interposed between the first and second semiconductor layers and adapted to generate light by electron-hole recombination, and the first and second light emitting parts are insulated from each other by an etched portion obtained by removing the multiple semiconductor layers around the first and second light emitting parts; an insulating layer covering the entire substrate in correspondence with the etched portion; a connecting electrode which runs over the insulating layer between the first light emitting part and the second light emitting part, and electrically connects the first light emitting part and the second light emitting part; an insulating reflective layer covering the first light emitting part, the second light emitting part and the insulating layer; a first electrode part providing the first semiconductor layer with either electrons or holes; and a second electrode part providing the second semiconductor layer with either electrons if holes are provided to the first semiconductor layer, or holes if electrons are provided to the first semiconductor layer, wherein at least one of the first electrode part and the second electrode part includes: a first upper electrode formed on the insulating reflective layer; and a first electrical connection which runs through the insulating reflective layer and electrically communicates the first upper electrode with the multiple semiconductor layers.

(12) In the semiconductor light emitting device, a width of the etched portion between the first light emitting part and the second light emitting part is narrower than a width of the etched portions at the outer edges of the first light emitting part and the second light emitting part.

(13) In the semiconductor light emitting device, the insulating layer is formed on the entire etched portion between the light emitting part and the second light emitting part, and reaches the lateral faces of the first light emitting part and the second light emitting part, in correspondence with the connecting electrode.

(14) In the semiconductor light emitting device, the insulating layer includes $SiO_2$, and the insulating reflective layer includes one of a DBR (Distributed Bragg Reflector) and an ODR (Omni-Directional Reflector).

(15) In the semiconductor light emitting device, the semiconductor light emitting device is a flip chip, wherein the first electrode part includes: a first upper electrode formed on the insulating reflective layer of the first light emitting part; and a first electrical connection which runs through the insulating reflective layer and electrically communicates the first semiconductor layer of the first light emitting part with the first upper electrode, and the second electrode includes: a second upper electrode formed on the insulating reflective layer of the second light emitting part; and a second electrical connection which runs through the insulating reflective layer and electrically communicates the second semiconductor layer of the second light emitting part with the second upper electrode.

(16) In the semiconductor light emitting device having multiple semiconductor layers on the substrate, the semiconductor light emitting device further includes a protection part insulated from the first light emitting part and the second light emitting part by the etched portion and covered by the insulating reflective layer; a third electrical connection electrically communicating the first upper electrode with the second semiconductor layer of the protection part; and a fourth electrical connection electrically communicating the second upper electrode with the first semiconductor layer of the protection part.

(17) In the semiconductor light emitting device, the connecting electrode includes: a first extension which stretches out along the edge of the second light emitting part, starting between the insulating reflective layer and the second semiconductor layer of the first light emitting part; a second extension which stretches out along the edge of the second light emitting part, starting above an etched exposed portion of the first semiconductor layer of the second light emitting part; and a connection part which stretches out above the insulating layer between the first light emitting part and the second light emitting part and connects the first extension and the second extension.

(18) A semiconductor light emitting device including: first and second light emitting parts formed on a substrate, with each of the first and second light emitting parts having multiple semiconductor layers which include a first semiconductor layer having a first conductivity type, a second semiconductor layer having a second conductivity type different from the first conductivity type, and an active layer interposed between the first and second semiconductor layers and adapted to generate light by electron-hole recombination, and the first and second light emitting parts are insulated from each other by an etched portion obtained by removing the multiple semiconductor layers between the first and second light emitting parts; an insulating layer covering the entire substrate in correspondence with the etched portion; a first electrode part providing the first semiconductor layer of the first light emitting part with either electrons or holes; a second electrode part providing the second semiconductor layer of the second light emitting part with either electrons if holes are provided to the first semiconductor layer, or holes if electrons are provided to the first semiconductor layer; and a connecting electrode which runs over the insulating layer between the first light emitting part and the second light emitting part, and electrically connects the first light emitting part and the second light emitting part, with the connecting electrode including: a first extension which stretches out between the insulating reflective layer and the second semiconductor layer of the first light emitting part; a second extension which stretches out along the etched portion over an etched exposed portion of the first semiconductor layer of the second light emitting part; and a connection part which stretches out above the insulating layer between the first light emitting part and the second light emitting part and connects the first extension and the second extension.

(19) In the semiconductor light emitting device, the etched portion and the insulating layer are formed between the first light emitting part and the second light emitting part, and at the outer edges of the first and second light emitting parts, and a width of the etched portion between the first light emitting part and the second light emitting part is narrower than a width of the etched portions at the outer edges of the first and second light emitting parts.

(20) In the semiconductor light emitting device, the semiconductor light emitting device is a flip chip, wherein the first electrode part includes: a first upper electrode formed on the insulating reflective layer of the first light emitting part; and a first electrical connection which runs through the insulating reflective layer and electrically communicates the first semiconductor layer of the first light emitting part with the first upper electrode, the second electrode includes: a second upper electrode formed on the insulating reflective layer of the second light emitting part; and a second electrical connection which runs through the insulating reflective layer and electrically communicates the second semiconductor layer of the second light emitting part with the second upper electrode, and the semiconductor light emitting device further includes: a first finger electrode which stretches out along the edge opposite to the first extension, starting over an etched, exposed portion of the first semiconductor layer of the first light emitting part and electrically communicates with the first electrical connection; and a second finger electrode which stretches out along the edge opposite to the second extension, starting between the insulating reflective layer and the second semiconductor layer of the second light emitting part and electrically communicates with the second electrical connection.

(21) A semiconductor light emitting device obtained by dividing a semiconductor light emitting device wafer having multiple semiconductor light emitting devices formed thereon into individual semiconductor light emitting devices, wherein the semiconductor light emitting device includes: multiple semiconductor layers grown on a growth substrate, with the multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination; a non-conductive reflective film which has a DBR and is arranged over the multiple semiconductor layers for reflecting the light generated by the active layer; first and second electrodes which are arranged on the non-conductive reflective film, facing each other at a distance therebetween, and provides the multiple semiconductors with electrons and holes; and a blocking face which is formed at the edges of the multiple semiconductor layers in correspondence with a gap therebetween, and blocks the propagation of a crack created in the non-conductive reflective film, wherein the blocking face is formed by partially removing the multiple semiconductor layers.

(22) In the semiconductor light emitting device, the non-conductive reflective layer includes a DBR formed on the multiple semiconductor layers as well as at least a part of the blocking face.

(23) In the semiconductor light emitting device, separate individual semiconductor light emitting devices are obtained by removing the second semiconductor layer and the active layer among the multiple semiconductor light emitting devices in a wafer state, and the blocking face is formed by removing the second semiconductor layer and the active layer to the same depth as a gap between the multiple semiconductor light emitting devices.

(24) In the semiconductor light emitting device, a groove is formed at the edges of the multiple semiconductor layers by mesa-etching the second semiconductor layer and the active layer, and a lateral face of the groove becomes the blocking face.

(25) In the semiconductor light emitting device, a groove is formed at the edges of the multiple semiconductor layers by mesa-etching the second semiconductor layer and the active layer, a wall is formed at the outer edges of the multiple semiconductor layers due to the groove, and a lateral face of the wall becomes the blocking face.

(26) In the semiconductor light emitting device, the non-conductive reflective film covers the second semiconductor layer and the groove, and the non-conductive reflective film on the lateral face of the groove is thinner than the non-conductive reflective film on the second semiconductor layer.

(27) In the semiconductor light emitting device, the groove opens towards the lateral face direction of the semiconductor light emitting device.

(28) In the semiconductor light emitting device, the groove is formed all around the multiple semiconductor layers.

(29) In the semiconductor light emitting device, the lateral face of the growth substrate and the lateral face of the wall become cutting faces for obtaining separate individual semiconductor light emitting devices.

(30) In the semiconductor light emitting device, the lateral faces of the first and second electrodes corresponding to the edges of the multiple semiconductor layers become cutting faces.

(31) In the semiconductor light emitting device, multiple openings are formed in the non-conductive reflective film, and the semiconductor light emitting device includes a first lower electrode which is arranged on an exposed portion of the first semiconductor layer by mesa-etching the second semiconductor layer and the active layer in correspondence with some openings out of the multiple openings, and electrically communicates with the first electrode through the some openings; and a second lower electrode which is arranged on the second semiconductor layer in correspondence with the other openings out of the multiple openings, and electrically communicates with the second electrode through the openings, and the blocking face is formed by mesa-etching the second semiconductor layer and the active layer.

(32) A semiconductor light emitting device including: multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination; an electrode electrically connected to the multiple semiconductor layers; a light absorption barrier arranged at least around the electrode; and a non-conductive reflective film which covers the multiple semiconductor layers, the light absorption barrier and the electrode and reflects the light from the active layer, with the non-conductive reflective film having an abnormal region having a reduced reflectivity around the electrode due to a height difference between the electrode and the surrounding of the electrode, wherein, when seen on the cross section of the electrode, a portion of the light absorption barrier exposed from the electrode has a length longer than the abnormal region.

(33) In the semiconductor light emitting device, the non-conductive reflective film includes at least one of a DBR (Distributed Bragg Reflector) and an ODR (Omni-Directional Reflector).

(34) In the semiconductor light emitting device, the light absorption barrier is a current blocking layer which is interposed between the electrode and the multiple semiconductor layers and has an insulation property.

(35) In the semiconductor light emitting device, the semiconductor light emitting device further includes a light transmitting conductive film which is interposed between the light absorption barrier and the electrode, and covers the second semiconductor layer.

(36) In the semiconductor light emitting device, the non-conductive reflective film includes one of a DBR (Distributed Bragg Reflector and an ODR (Omni-Directional Reflector), the electrode has a thickness of 0.5 to 3.0 µm, and the light absorption barrier has a length of 2.0 to 10 µm from the lateral face of the electrode.

(37) In the semiconductor light emitting device, the semiconductor light emitting device further includes: an additional electrode formed on an exposed portion of the first semiconductor layer by etching the second semiconductor layer and the active layer; first and second pad electrodes formed on the non-conductive reflective film; a first electrical connection which runs through the non-conductive reflective film and electrically connects the first pad electrode and the additional electrode; and a second electrical connection which runs through the non-conductive reflective film and electrically connects the second pad electrode and the electrode.

(38) In the semiconductor light emitting device, the electrode includes a finger electrode stretching out from below the second pad electrode to below the first pad electrode, and the light absorption barrier is interposed between the second semiconductor layer and the finger electrode and stretches out along the finger electrode, in correspondence with the abnormal region formed around the finger electrode.

(39) In the semiconductor light emitting device, the additional electrode includes an additional finger electrode stretching out from below the first pad electrode to below the second pad electrode, on the first semiconductor layer; and the semiconductor light emitting device further includes an additional light absorption barrier stretching out along the additional finger electrode, in correspondence with the additional abnormal region formed in the non-conductive reflective film in the vicinity of the etched second semiconductor layer and the active layer.

(40) In the semiconductor light emitting device, the electrode is arranged on an exposed portion of the first semiconductor layer by etching the second semiconductor layer and the active layer, and the light absorption barrier is interposed between the first semiconductor layer and the electrode.

(41) In the semiconductor light emitting device, the electrode is arranged on an exposed portion of the first semiconductor layer by etching the second semiconductor layer and the active layer, the non-conductive reflective film covers the second semiconductor layer and the first semiconductor layer and has an abnormal region created due to a height different resulted from etching, and the light absorption barrier is formed on the lateral face of the etched exposed second semiconductor layer, on the lateral face of the active layer, and on the first semiconductor layer.

(42) In the semiconductor light emitting device, the semiconductor light emitting device further includes a current blocking layer interposed between the electrode and the multiple semiconductor layers; and a light transmitting conductive film covering the second semiconductor layer, and the light absorption barrier is formed between the light transmitting conductive film and the non-conductive reflective film.

(43) In the semiconductor light emitting device, the light absorption barrier film has a wedge-shaped end.

(44) In the semiconductor light emitting device, the lateral face of the electrode is slanted with respect to the light absorption barrier.

(45) In the semiconductor light emitting device, the electrode is arranged on an exposed portion of the first semiconductor layer by etching the second semiconductor layer and the active layer, with the etched second semiconductor and active layers having faces slanted with respect to the exposed, first semiconductor layer where the electrode is located; and the non-conductive reflective film is arranged to cover the second semiconductor layer and the first semiconductor layer and formed along the slanted faces of the etched second semiconductor and active layers.

(46) A semiconductor light emitting device obtained by dividing a wafer having multiple semiconductor light emitting devices formed thereon into individual semiconductor light emitting devices, wherein the semiconductor light emitting device includes: multiple semiconductor layers grown on a growth substrate, with the multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination; a wall formed at a distance from the lateral faces of the multiple semiconductor layers; a non-conductive reflective film which covers the multiple semiconductor layers, a gap between the multiple semiconductor layer and the wall, and the wall, and reflects the light from the active light, with the non-conductive reflective film having, around the wall, an irregular portion of a more irregular shape than a shape at the lateral faces of the multiple semiconductor layers; and at least one electrode arranged on the non-conductive reflective film and electrically connected to the multiple semiconductor layers, wherein the irregular portion blocks the propagation of a crack, which is created in the non-conductive reflective film during the cutting process to obtain individual semiconductor light emitting chips, towards the multiple semiconductor layers.

(47) In the semiconductor light emitting device, the lateral faces of the multiple semiconductor layers are slanted at a different angle from that of the lateral face of the wall.

(48) In the semiconductor light emitting device, the lateral faces of the multiple semiconductor layers are slanted with respect to the growth substrate,
and the growth substrate and the lateral face of the wall are formed at more substantially right angles than an angle between the growth substrate and the lateral faces of the multiple semiconductor light emitting.

(49) In the semiconductor light emitting device, the lateral face of the wall is etched in form of an inverted mesa structure such that the wall is wider at the top than at the bottom.

(50) In the semiconductor light emitting device, the non-conductive reflective film includes at least one of a DBR (Distributed Bragg Reflector) having multiple layers, and an ODR (Omni-Directional Reflector), and an irregular portion created as uniformity of each layer of the non-conductive reflective film is reduced around the wall.

(51) In the semiconductor light emitting device, the at least one electrode includes: a first electrode which is arranged opposite to the multiple semiconductor layers with respect to the non-conductive reflective film and provides the first semiconductor layer with either electrons or holes; a second electrode which is arranged opposite to the multiple semiconductor layers with respect to the non-conductive reflective film and provides the second semiconductor layer with either electrons if holes are provided to the first semiconductor layer or holes if electrons are provided to the first semiconductor layer; a first electrical connection which runs through the non-conductive reflective film and electrically connects the first electrode and the first semiconductor layer; and a second electrical connection which runs through the non-conductive reflective film and electrically connects the second electrode and the second semiconductor layer, wherein another first semiconductor layer is formed between the lateral faces of the multiple semiconductor layers and the wall at the same height as the first semiconductor layer in contact with the first electrical connection.

(52) A manufacturing method of semiconductor light emitting devices by cutting a wafer having multiple semiconductor light emitting chips formed thereon into individual semiconductor light emitting chips, the method including the steps of: forming, on a growth substrate, multiple semiconductor layers which include a first semiconductor layer having a first conductivity type, a second semiconductor layer having a second conductivity type different from the first conductivity type, and an active layer interposed between the first and second semiconductor layers and adapted to generate light by electron-hole recombination; dividing the wafer into multiple semiconductor light emitting chip sections and a wall around each the semiconductor light emitting chip section by removing a part of the multiple semiconductor layers; forming a non-conductive reflective film which covers each semiconductor light emitting chip section, a gap between each semiconductor light emitting chip section and the wall, and the wall, and reflects the light from the active layer, with the non-conductive reflective film having, around the wall, an irregular portion of a more irregular shape than a shape at the lateral faces of the multiple semiconductor layers in each semiconductor light emitting chip section; forming at least one electrode on the non-conductive reflective film of each semiconductor light emitting chip section, with the electrode being electrically connected to the multiple semiconductor layers, and cutting the wafer into multiple semiconductor light emitting chips, wherein the propagation of a crack towards the non-conductive reflective film of each semiconductor light emitting chip is blocked by the irregular portion.

(53) In the manufacturing method of semiconductor light emitting devices, dividing the wafer into multiple semiconductor light emitting chip sections and a wall around each semiconductor light emitting chip section involves making the lateral faces of the multiple semiconductor layers in each semiconductor light emitting chip section slanted at a different angle from that of the lateral face of the wall.

(54) In the manufacturing method of semiconductor light emitting devices, dividing the wafer into multiple semiconductor light emitting chip sections and a wall around each semiconductor light emitting chip section involves: forming, on the multiple semiconductor layers, a first mask corresponding to each semiconductor light emitting chip section and a second mask corresponding to the wall, with the second mask having a higher etch selectivity than the first mask; and etching the multiple semiconductor layers having the first mask and the second mask formed thereon.

(55) In the manufacturing method of semiconductor light emitting devices, etching the multiple semiconductor layers involves making the growth substrate and the lateral face of the wall formed at more substantially right angles than an angle between the growth substrate and the lateral faces of the multiple semiconductor light emitting.

(56) In the manufacturing method of semiconductor light emitting devices, while etching the multiple semiconductor layers, the lateral faces of the multiple semiconductor layers in each semiconductor light emitting chip section are slanted with respected to the growth substrate; and while forming the non-conductive reflective film, irregularity of the shape of the non-conductive reflective film on the lateral faces of the multiple semiconductor layers in each semiconductor light emitting chip section is reduced.

(57) In the manufacturing method of semiconductor light emitting devices, the first mask includes a photoresist, and the second mask includes at least one of a dielectric material and a metal.

(58) In the manufacturing method of semiconductor light emitting devices, while etching the multiple semiconductor layers, an opening for exposing the first semiconductor layer is formed in the multiple semiconductor layers in each semiconductor light emitting chip section; and forming at least one electrode involves forming a first electrode which is arranged opposite to the multiple semiconductor layers with respect to the non-conductive reflective film, a first electrical connection which is formed in the opening and electrically connects the first electrode and the first semiconductor layer, a second electrode which is arranged opposite to the multiple semiconductor layers with respect to the non-conductive reflective film, and a second electrical connection which runs through the non-conductive reflective film and electrically connects the second electrode and the second semiconductor layer.

(59) In the manufacturing method of semiconductor light emitting devices, before forming the non-conductive reflective film, the method includes: forming a light absorption barrier made of a dielectric material on the multiple semiconductor layers in each semiconductor light emitting chip section and on the wall; and forming a light transmitting conductive film interposed between the light absorption barrier and the non-conductive reflective film, wherein the second mask includes at least one of the light absorption barrier and the light transmitting conductive film.

(60) In the manufacturing method of semiconductor light emitting devices, the wall includes at least a part of the second mask, and multiple semiconductor layers.

(61) In the manufacturing method of semiconductor light emitting devices, two walls are formed between adjacent semiconductor light emitting chips, and cutting the wafer into multiple semiconductor light emitting chips involves separating the two walls by cutting the middle thereof to obtain multiple semiconductor chips.

(62) In the manufacturing method of semiconductor light emitting devices, one wall is formed between adjacent semiconductor light emitting chips, and cutting the wafer into multiple semiconductor light emitting chips involves splitting the wall to obtain multiple semiconductor chips.

(63) In the manufacturing method of semiconductor light emitting devices, the method further includes, after dividing and before forming the non-conductive reflective film, etching the lateral face of the wall in form of an inverted mesa structure such that the wall is wider at the top than at the bottom.

(64) In the manufacturing method of semiconductor light emitting devices, the wall is arranged to surround each semiconductor light emitting chip section.

(65) In the manufacturing method of semiconductor light emitting devices, the wall is partially arranged around at least one semiconductor light emitting chip section.

The semiconductor light emitting device according to the disclosure shows an improved reliability of electrical insulation between multiple light emitting parts in a semiconductor light emitting device having multiple light emitting parts.

In a device having multiple light emitting parts being connected, the improved reliability of electrical insulation is achieved through a structure having a narrower gap between adjacent light emitting parts.

A flip-chip type light emitting part and an ESD protection device can be formed together on the substrate in a compact manner, without an additional process.

The semiconductor light emitting device according to the disclosure has an improved yield as the blocking face arrests the propagation of a crack created in the non-conductive reflective film during the division process for obtaining individual semiconductor light emitting devices.

The semiconductor light emitting device according to the disclosure has an increased light emission area by allowing the multiple semiconductor layers between devices to be etched less when dividing a wafer into individual semiconductor light emitting devices.

With an increased light emission face, an area not covered by the first and second electrodes may be increased, and brightness improvement can be achieved.

The semiconductor light emitting device according to the disclosure offers reduced light loss and improved brightness with help of a light absorption barrier adapted to block light entering an abnormal region created in the non-conductive reflective film due to an uneven structure such as an electrode, a height difference resulted from etching or the like.

The semiconductor light emitting device according to the disclosure uses a non-conductive reflective film rather than a metal reflective film, so as to reduce absorption loss of the light.

In the semiconductor light emitting device according to the disclosure and the manufacturing method of the same, defects of a semiconductor light emitting device are avoided by blocking the propagation of damage such as a crack created during the cutting process into individual semiconductor light emitting devices, towards a semiconductor light emitting chip.

The invention claimed is:

1. A semiconductor light emitting device comprising:
multiple semiconductor layers including a first semiconductor layer having a first conductivity type, a second semiconductor layer having a second conductivity type different from the first conductivity type, and an active layer interposed between the first and second semiconductor layers and adapted to generate light by electron-hole recombination;
an electrode electrically connected with the multiple semiconductor layers;
a light absorption barrier disposed under the electrode; and
a non-conductive reflective film adapted to cover the multiple semiconductor layers, the light absorption barrier and the electrode and to reflect light from the active layer, wherein the non-conductive reflective film has an abnormal region of a lower reflectivity around the electrode due to a height difference between the electrode and the vicinity of the electrode;
wherein a portion of the light absorption barrier exposed from the electrode is made longer than the abnormal region as seen in a cross-sectional view of the electrode in order to block the light from the active layer entering the abnormal region.

2. The semiconductor light emitting device according to claim 1, wherein the non-conductive reflective film comprises at least one of a DBR (Distributed Bragg Reflector) and an ODR (Omni-Directional Reflector).

3. The semiconductor light emitting device according to claim 1, wherein the light absorption barrier is a current blocking layer which is interposed between the electrode and the multiple semiconductor layers and has an insulation property.

4. The semiconductor light emitting device according to claim 3, further comprising: a light transmitting conductive film which is interposed between the light absorption barrier and the electrode, and covers the second semiconductor layer.

5. The semiconductor light emitting device according to claim 4, wherein the non-conductive reflective film comprises one of a DBR (Distributed Bragg Reflector) and an ODR (Omni-Directional Reflector),
the electrode has a thickness of 0.5 to 3.0 µm, and
the light absorption barrier has a length of 2.0 to 10 µm from the lateral face of the electrode.

6. The semiconductor light emitting device according to claim 4, further comprising:
an additional electrode formed on an exposed portion of the first semiconductor layer by etching the second semiconductor layer and the active layer;
first and second pad electrodes formed on the non-conductive reflective film;
a first electrical connection which runs through the non-conductive reflective film and electrically connects the first pad electrode and the additional electrode; and
a second electrical connection which runs through the non-conductive reflective film and electrically connects the second pad electrode and the electrode.

7. The semiconductor light emitting device according to claim 6, wherein the electrode comprises a finger electrode stretching out from below the second pad electrode to below the first pad electrode, and
the light absorption barrier is interposed between the second semiconductor layer and the finger electrode and stretches out along the finger electrode, in correspondence with the abnormal region formed around the finger electrode.

8. The semiconductor light emitting device according to claim 7, wherein the additional electrode comprises an additional finger electrode stretching out from below the first pad electrode to below the second pad electrode, on the first semiconductor layer; and
the semiconductor light emitting device further comprises an additional light absorption barrier stretching out along the additional finger electrode, in correspondence with the additional abnormal region formed in the non-conductive reflective film in the vicinity of the etched second semiconductor layer and the active layer.

9. The semiconductor light emitting device according to claim 1, wherein the electrode is arranged on an exposed portion of the first semiconductor layer by etching the second semiconductor layer and the active layer, and
the light absorption barrier is interposed between the first semiconductor layer and the electrode.

10. The semiconductor light emitting device according to claim 1, wherein the electrode is arranged on an exposed portion of the first semiconductor layer by etching the second semiconductor layer and the active layer,
the non-conductive reflective film covers the second semiconductor layer and the first semiconductor layer and has an abnormal region created due to a height different resulted from etching, and
the light absorption barrier is formed on the lateral face of the etched exposed second semiconductor layer, on the lateral face of the active layer, and on the first semiconductor layer.

11. The semiconductor light emitting device according to claim 1, further comprising:
a current blocking layer interposed between the electrode and the multiple semiconductor layers; and
a light transmitting conductive film covering the second semiconductor layer,
wherein the light absorption barrier is formed between the light transmitting conductive film and the non-conductive reflective film.

12. The semiconductor light emitting device according to claim 1, wherein the light absorption barrier film has a wedge-shaped end.

13. The semiconductor light emitting device according to claim 1, wherein the lateral face of the electrode is slanted with respect to the light absorption barrier.

14. The semiconductor light emitting device according to claim 1, wherein the electrode is arranged on an exposed portion of the first semiconductor layer by etching the second semiconductor layer and the active layer, with the etched second semiconductor and active layers having faces slanted with respect to the exposed, first semiconductor layer where the electrode is located; and
the non-conductive reflective film is arranged to cover the second semiconductor layer and the first semiconductor layer and formed along the slanted faces of the etched second semiconductor and active layers.

* * * * *